(12) United States Patent
Kinoshita

(10) Patent No.: US 7,754,565 B2
(45) Date of Patent: *Jul. 13, 2010

(54) MANUFACTURING METHOD OF SEMICONDUCTOR DEVICE AND SEMICONDUCTOR DEVICE

(75) Inventor: Hideyuki Kinoshita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 396 days.

This patent is subject to a terminal disclaimer.

(21) Appl. No.: 11/829,759

(22) Filed: Jul. 27, 2007

(65) Prior Publication Data

US 2008/0020530 A1 Jan. 24, 2008

Related U.S. Application Data

(60) Continuation-in-part of application No. 11/763,793, filed on Jun. 15, 2007, which is a division of application No. 11/033,868, filed on Jan. 13, 2005, now Pat. No. 7,247,539.

(30) Foreign Application Priority Data

Sep. 28, 2004 (JP) .............................. 2004-282400

(51) Int. Cl.
*H01L 21/336* (2006.01)
(52) U.S. Cl. ............... 438/266; 257/300; 257/E21.646; 257/E21.662
(58) Field of Classification Search ............. 257/300, 257/E21.646, E21.662; 438/266
See application file for complete search history.

(56) References Cited

U.S. PATENT DOCUMENTS

| 7,247,539 B2 * | 7/2007 | Kinoshita .................. 438/266 |
| 2003/0003664 A1 | 1/2003 | Takeuchi et al. |
| 2003/0210582 A1 | 11/2003 | Kinoshita |
| 2005/0199938 A1 | 9/2005 | Sakuma et al. |
| 2006/0081914 A1 | 4/2006 | Miwa |
| 2006/0091466 A1 | 5/2006 | Sugimae et al. |

FOREIGN PATENT DOCUMENTS

| JP | 2002-313970 | 10/2002 |
| JP | 2004-15056 | 1/2004 |

* cited by examiner

*Primary Examiner*—Asok K Sarkar
(74) *Attorney, Agent, or Firm*—Oblon, Spivak, McClelland, Maier & Neustadt, L.L.P.

(57) ABSTRACT

A manufacturing method of a semiconductor device disclosed herein, comprises: forming a first member to be patterned on a semiconductor substrate; forming a second member to be patterned on the first member; forming a third member to be patterned on the second member; patterning the third member to form a first line pattern and a first connecting portion in the third member, the first line pattern having a plurality of parallel linear patterns and the first connecting portion connecting the linear patterns on at least one end side of the linear patterns of the first line pattern; etching the second member with the third member as a mask to form a second line pattern and a second connecting portion in the second member, the second line pattern being the same pattern as the first line pattern and the second connecting portion being the same pattern as the first connecting portion; removing the second connecting portion of the second member; and etching the first member with the second member as a mask.

11 Claims, 70 Drawing Sheets

MANUFACTURING METHOD OF SEMICONDUCTOR DEVICE AND SEMICONDUCTOR DEVICE

CROSS REFERENCE TO RELATED APPLICATION

This application is a continuation-in-part of and claims the benefit of priority under 35 USC §120 from U.S. Ser. No. 11/763,793, filed Jun. 15, 2007 and is based upon and claims the benefit of priority under 35 USC §119 from the Japanese Patent Applications No. 2004-282400, filed Sep. 28, 2004, the entire contents of which are incorporated herein by reference.

BACKGROUND OF THE INVENTION

1. Field of the Invention

The present invention relates to a manufacturing method of a semiconductor device and the semiconductor device, and more particularly relates to a manufacturing method of a high-yield semiconductor device and the semiconductor device.

2. Related Background Art

With the recent advance of microfabrication technology, the minimum feature size of a semiconductor device becomes less than 100 nm, and the difficulty level of fabrication increases. A memory cell array of a NAND-type nonvolatile semiconductor memory device out of semiconductor devices has a structure in which the number of contacts per cell is reduced, and hence the layout of a wiring layer for word lines, bit lines, and so on becomes a layout such as line and space with minimum feature size which needs the most advanced microfabrication technology (For example, see Japanese patent Application Laid-open No. 2002-313970).

In the case of the aforementioned layout of the NAND-type nonvolatile semiconductor memory device, in a word line end portion on the side where potential is not lead to the wiring layer above the word line, there is a possibility that resist pattern collapse occurs with the progress of scale-down. It is known that this is caused by pattern thinning of a photoresist due to proximity effect, a problem in terms of shape, or ununiformity of drops of water remaining during rinse drying after development. It is also known that depending on fabrication conditions and processing contents, resist collapse occurs also during etching of a lower film beneath the photoresist with the photoresist as a mask.

This phenomenon has been hitherto handled by thinning the film thickness of the photoresist and so on, but to improve resolution, the film thickness of the photoresist has already been thinned to the limit of film thickness necessary for the fabrication of the lower film beneath the photoresist. Hence, the thickness of the photoresist cannot be easily thinned any more.

Therefore, in Japanese Patent Application Laid-open No. 2004-15056, the occurrence of resist pattern collapse can be prevented by extending an end portion of a word line in area, but an increase in layout pattern is inevitable.

Moreover, the aforementioned problem is not limited to the nonvolatile semiconductor memory device, and also may be a problem for other semiconductor devices.

SUMMARY OF THE INVENTION

In order to accomplish the aforementioned and other objects, according to one aspect of the present invention, a manufacturing method of a semiconductor device, comprises:

forming a first member to be patterned on a semiconductor substrate;

forming a second member to be patterned on the first member;

forming a third member to be patterned on the second member;

patterning the third member to form a first line pattern and a first connecting portion in the third member, the first line pattern having a plurality of parallel linear patterns and the first connecting portion connecting the linear patterns on at least one end side of the linear patterns of the first line pattern;

etching the second member with the third member as a mask to form a second line pattern and a second connecting portion in the second member, the second line pattern being the same pattern as the first line pattern and the second connecting portion being the same pattern as the first connecting portion;

removing the second connecting portion of the second member; and etching the first member with the second member as a mask.

BRIEF DESCRIPTION OF THE DRAWINGS

FIG. 120 is a process sectional view taken along the line E-E' of FIG. 101 for explaining a manufacturing process of the nonvolatile semiconductor memory device according to the further modified embodiment of the first embodiment;

FIG. 121 is a process sectional view taken along the line A-A' of FIG. 101 for explaining a manufacturing process of the nonvolatile semiconductor memory device according to the further modified embodiment of the first embodiment;

FIG. 122 is a process sectional view taken along the line B-B' of FIG. 101 for explaining a manufacturing process of the nonvolatile semiconductor memory device according to the further modified embodiment of the first embodiment;

FIG. 123 is a process sectional view taken along the line C-C' of FIG. 101 for explaining a manufacturing process of the nonvolatile semiconductor memory device according to the further modified embodiment of the first embodiment;

FIG. 124 is a process sectional view taken along the line D-D' of FIG. 101 for explaining a manufacturing process of the nonvolatile semiconductor memory device according to the further modified embodiment of the first embodiment;

FIG. 125 is a process sectional view taken along the line E-E' of FIG. 101 for explaining a manufacturing process of the nonvolatile semiconductor memory device according to the further modified embodiment of the first embodiment;

FIG. 126 is a process sectional view taken along the line A-A' of FIG. 101 for explaining a manufacturing process of the nonvolatile semiconductor memory device according to the further modified embodiment of the first embodiment;

FIG. 127 is a process sectional view taken along the line B-B' of FIG. 101 for explaining a manufacturing process of the nonvolatile semiconductor memory device according to the further modified embodiment of the first embodiment;

FIG. 128 is a process sectional view taken along the line C-C' of FIG. 101 for explaining a manufacturing process of the nonvolatile semiconductor memory device according to the further modified embodiment of the first embodiment;

FIG. 129 is a process sectional view taken along the line D-D' of FIG. 101 for explaining a manufacturing process of the nonvolatile semiconductor memory device according to the further modified embodiment of the first embodiment;

FIG. 130 is a process sectional view taken along the line E-E' of FIG. 101 for explaining a manufacturing process of the nonvolatile semiconductor memory device according to the further modified embodiment of the first embodiment;

FIG. 131 is a process sectional view taken along the line A-A' of FIG. 101 for explaining a manufacturing process of the nonvolatile semiconductor memory device according to the further modified embodiment of the first embodiment;

Figure 42:
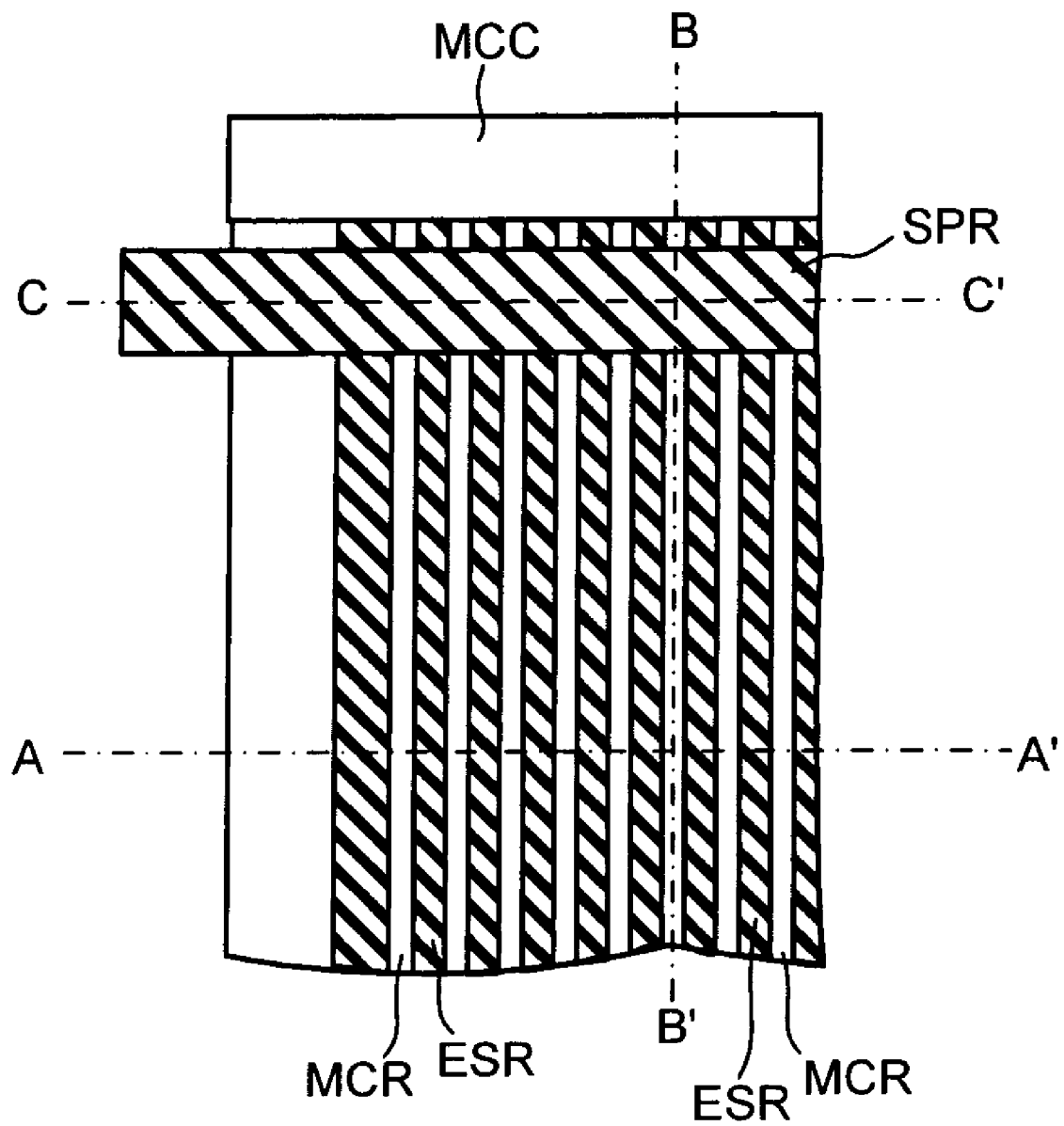
FIG. 42 is a plan view showing the structure of a nonvolatile semiconductor memory device according to a second embodiment.
Figure 59:
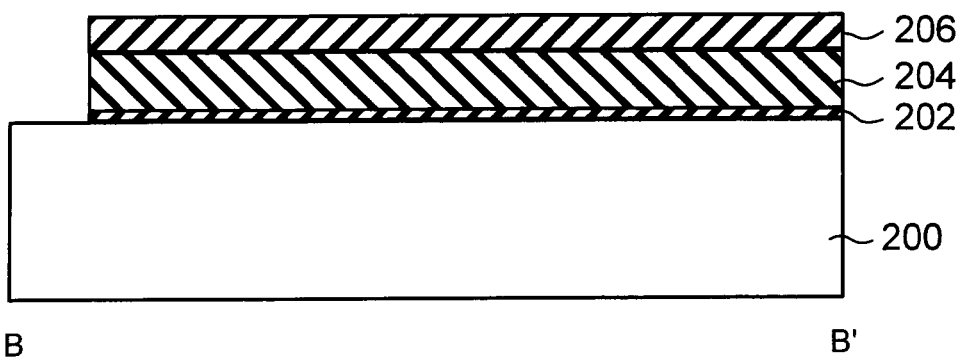
FIG. 59 is a process sectional view for explaining the manufacturing process of the nonvolatile semiconductor memory device according to the second embodiment.
Figure 62:
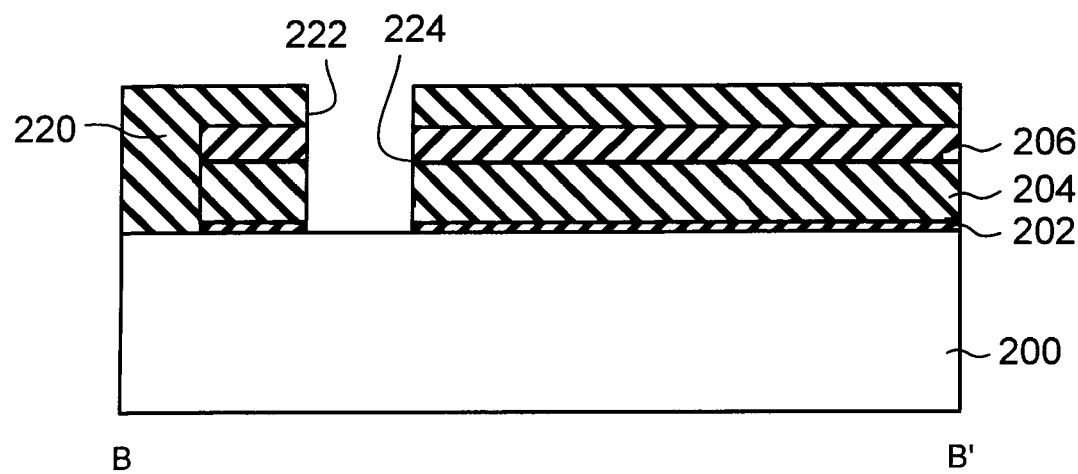
FIG. 62 is a process sectional view for explaining the manufacturing process of the nonvolatile semiconductor memory device according to the second embodiment.
Figure 65:
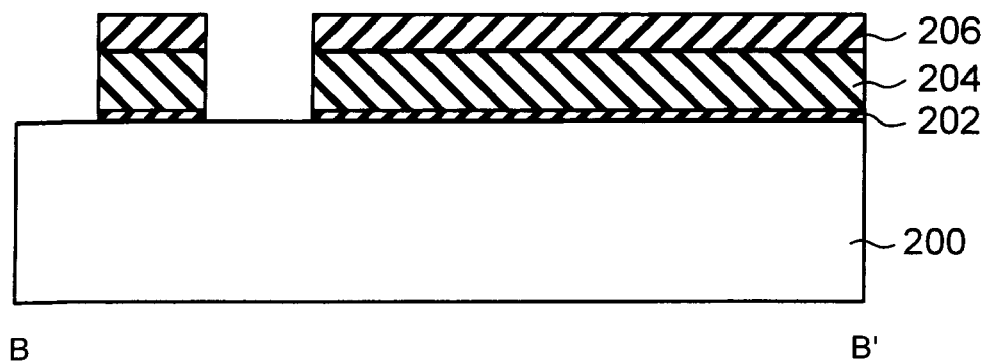
FIG. 65 is a process sectional view for explaining the manufacturing process of the nonvolatile semiconductor memory device according to the second embodiment.
Figure 68:
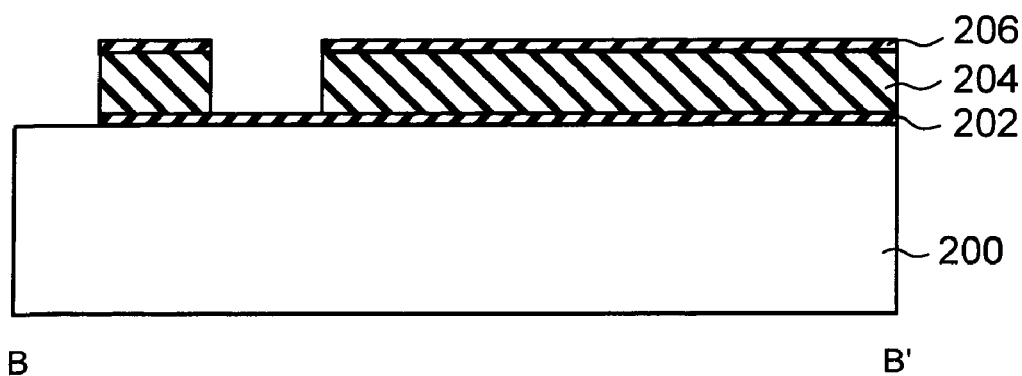
FIG. 68 is a process sectional view for explaining the manufacturing process of the nonvolatile semiconductor memory device according to the second embodiment.
Figure 79:
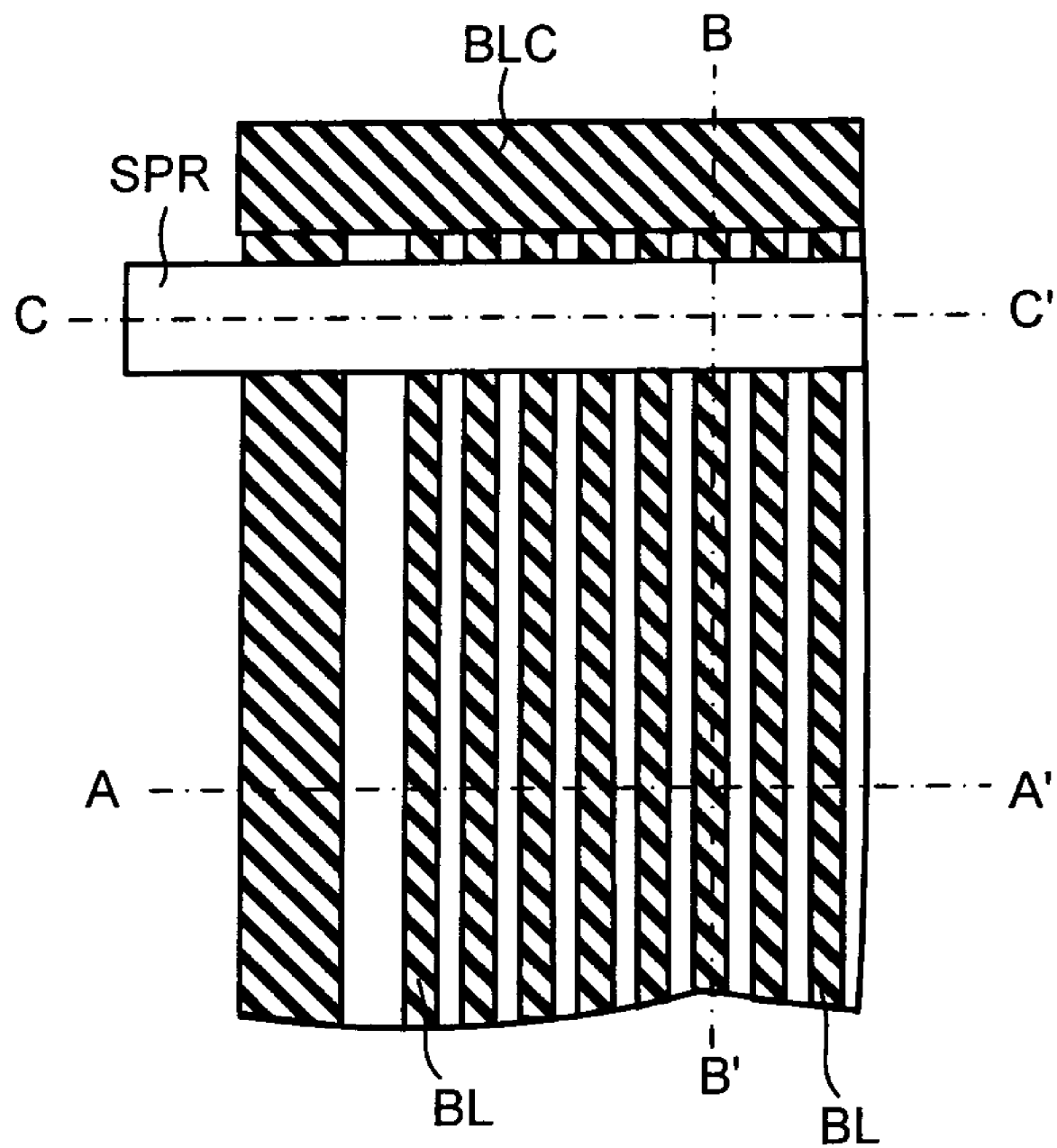
FIG. 79 is a plan view showing the structure of a nonvolatile semiconductor memory device according to a third embodiment.
Figure 96:
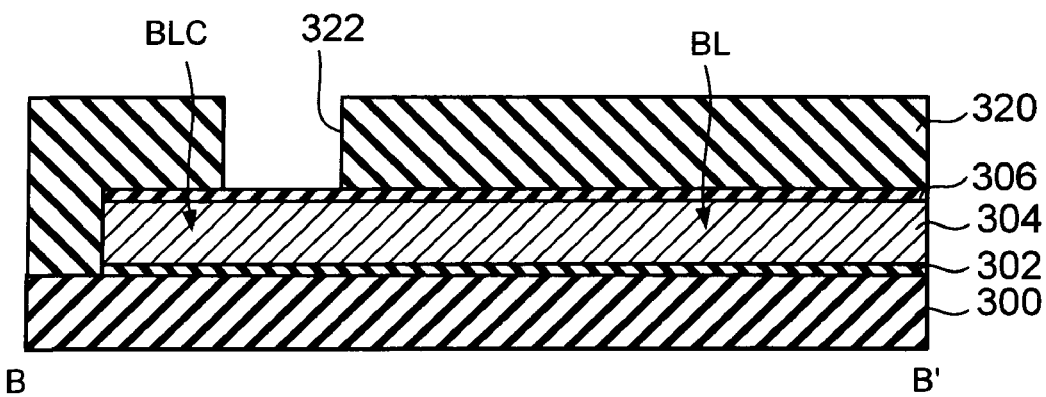
FIG. 96 is a process sectional view for explaining the manufacturing process of the nonvolatile semiconductor memory device according to the third embodiment.
Figure 99:
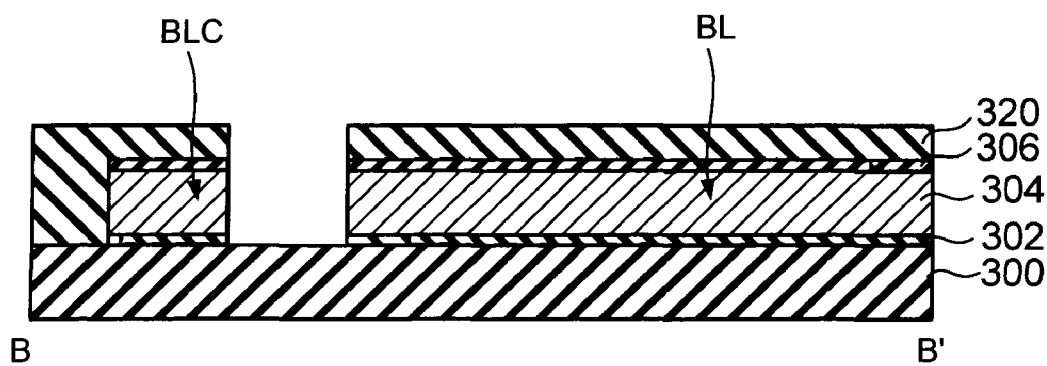
FIG. 99 is a process sectional view for explaining the manufacturing process of the nonvolatile semiconductor memory device according to the third embodiment.
Figure 101:
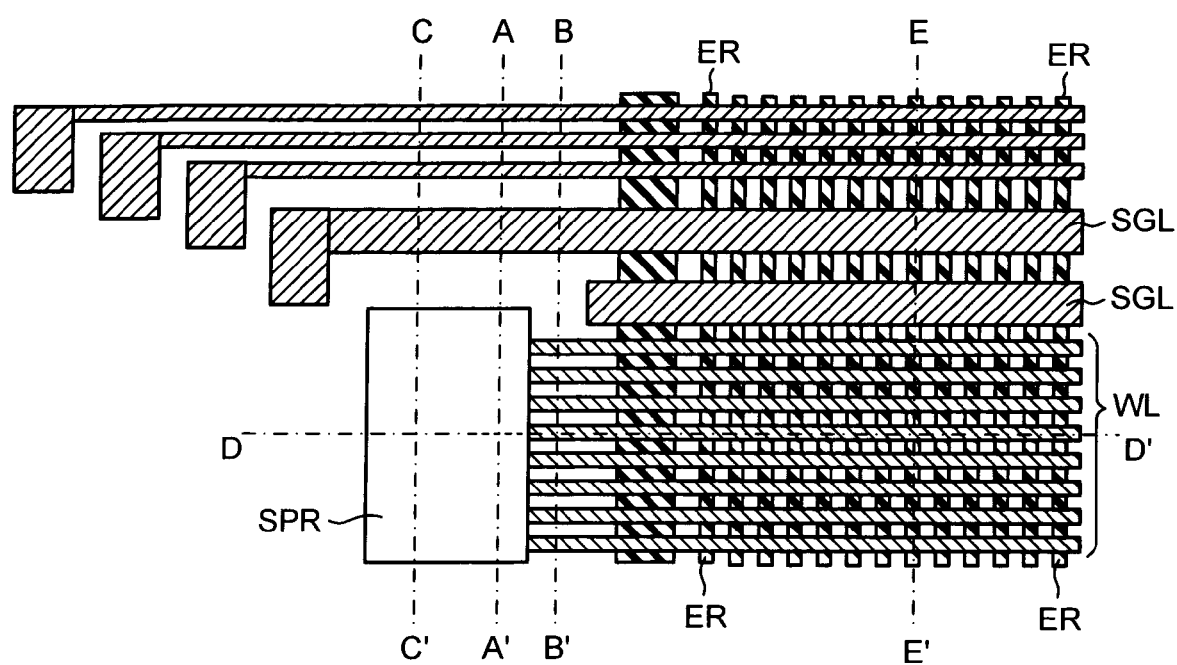
FIG. 101 is a view corresponding to FIG. 1 for explaining a modification of the first embodiment.
Figure 132:
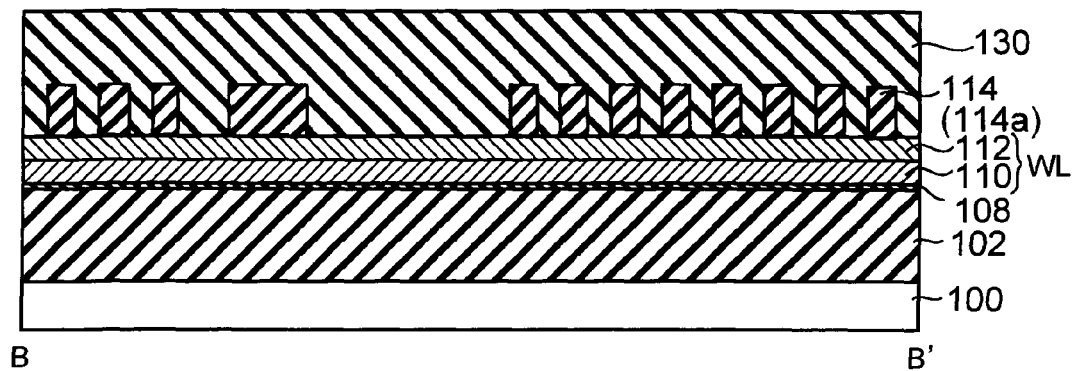
Figure 133:
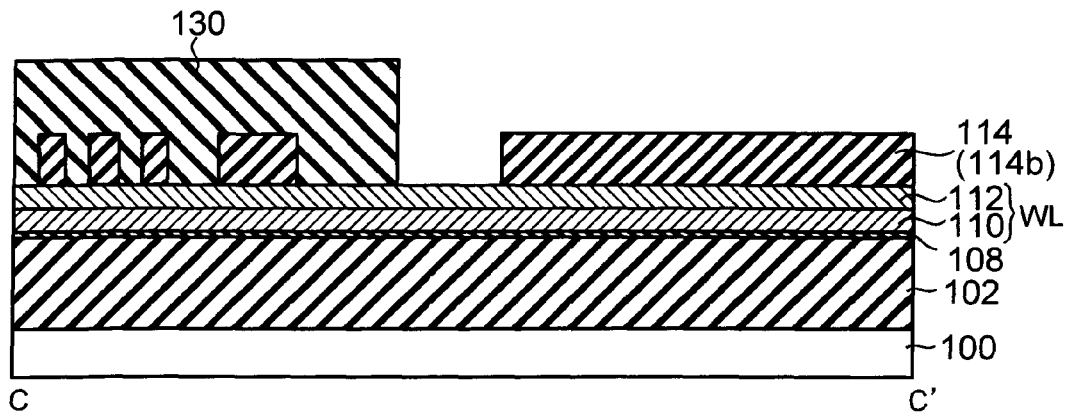
Figure 134:
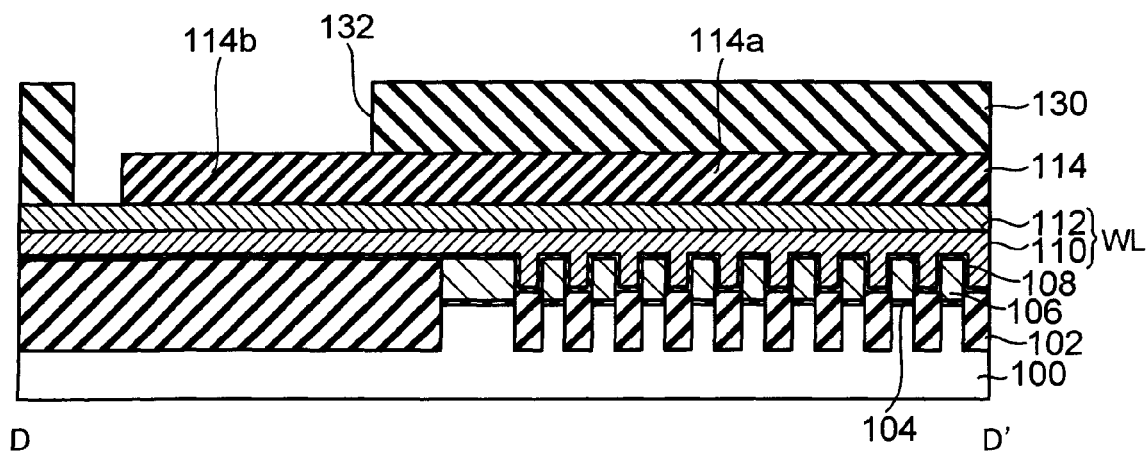
Figure 135:
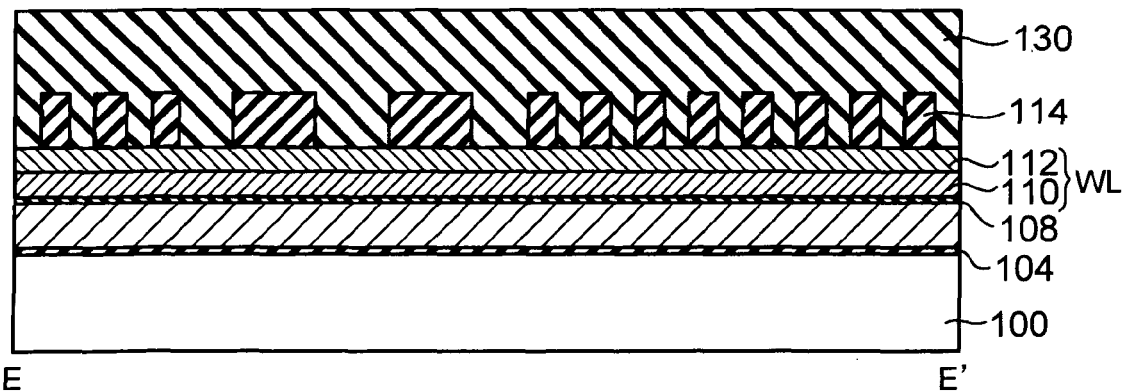
Figure 136:
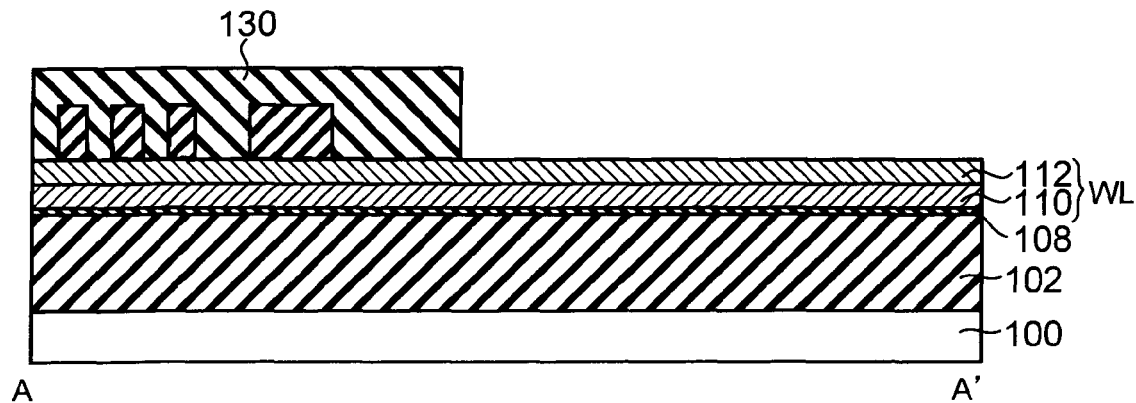
Figure 137:
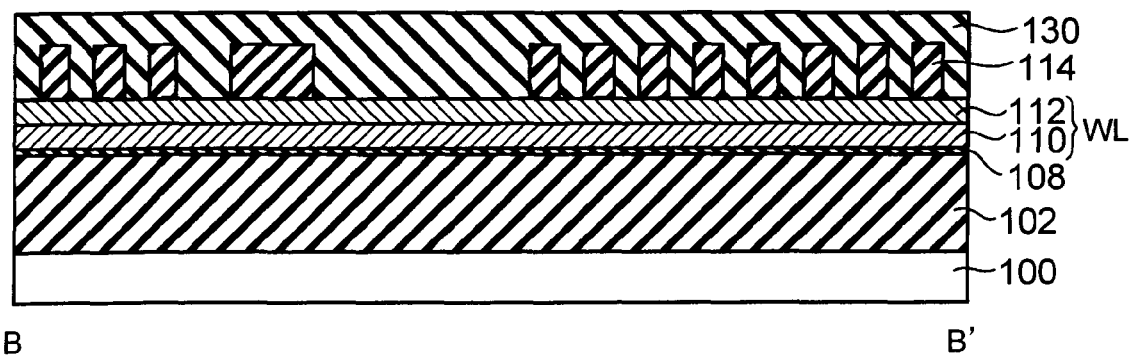
Figure 138:
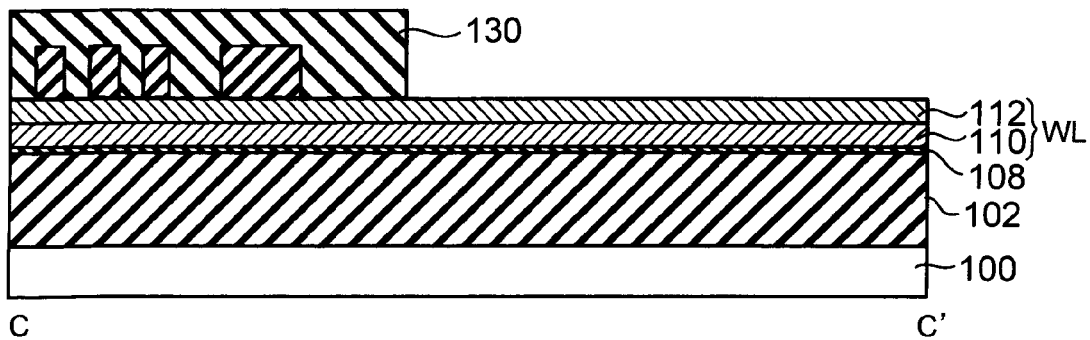
Figure 139:
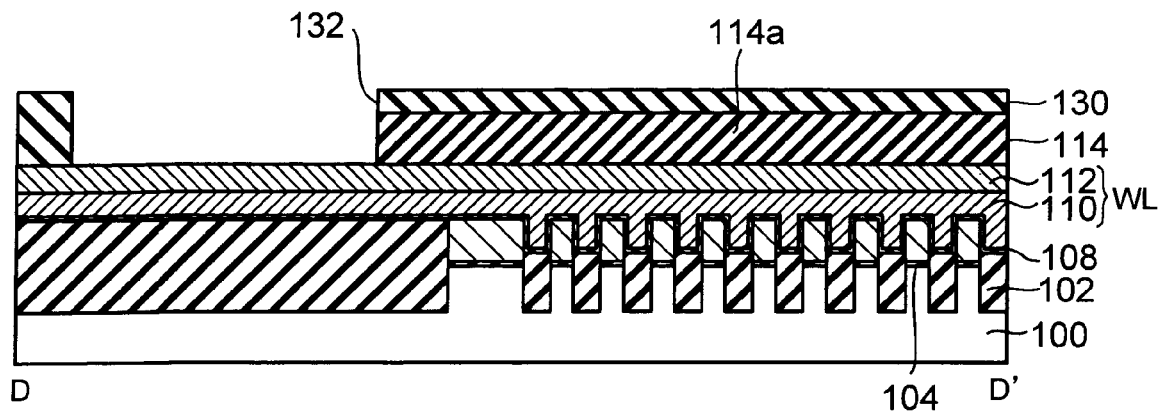
Figure 140:
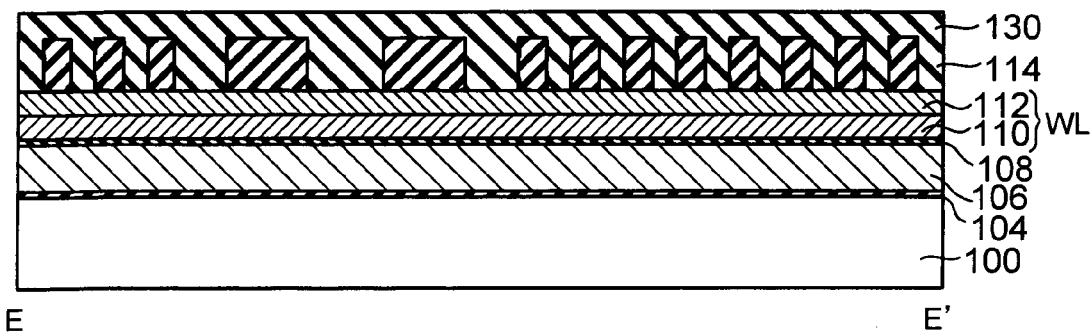
Figure 141:
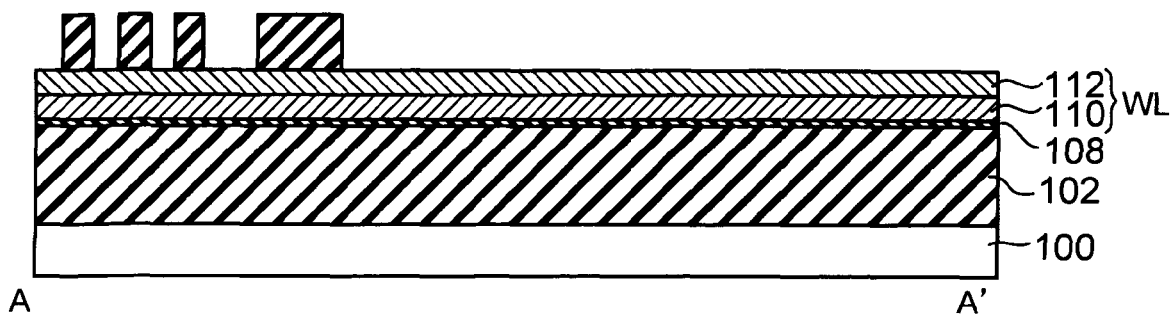
Figure 142:
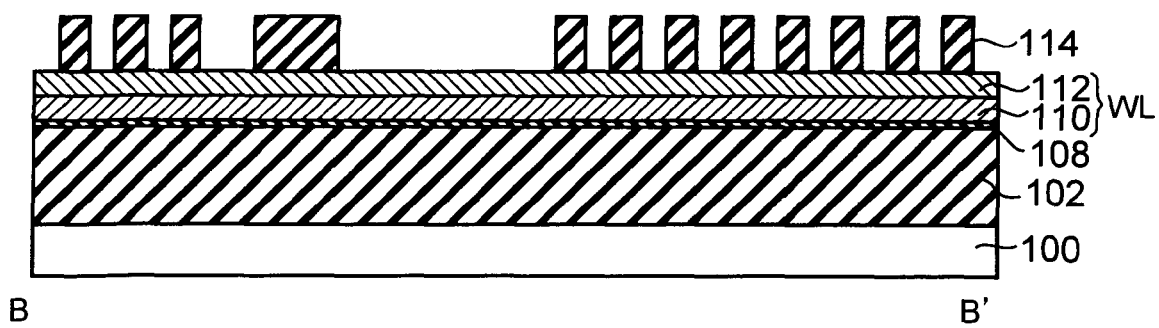
Figure 143:
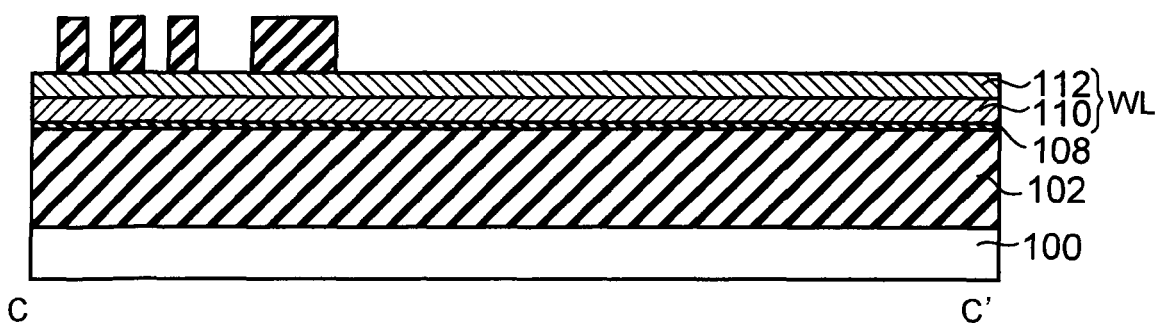
Figure 144:
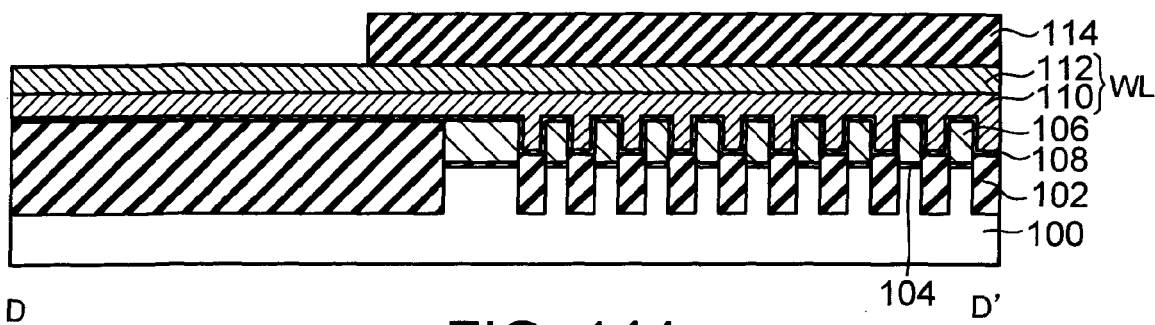
Figure 145:
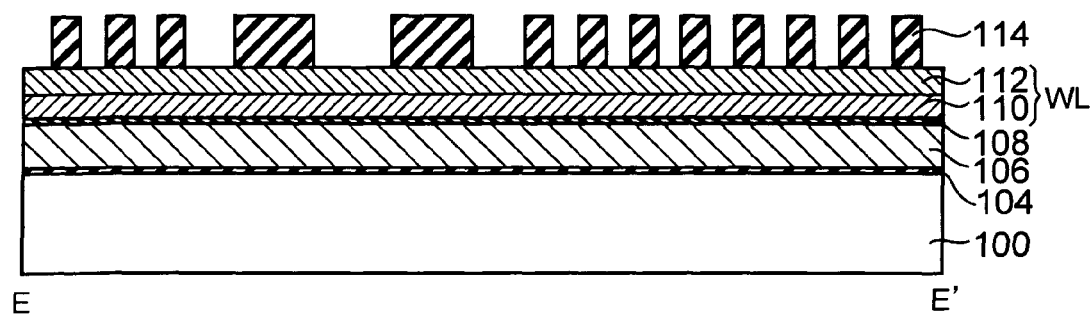
Figure 146:
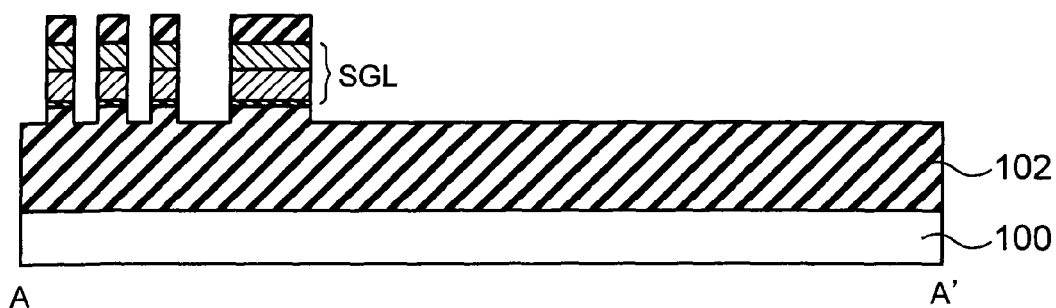
Figure 147:
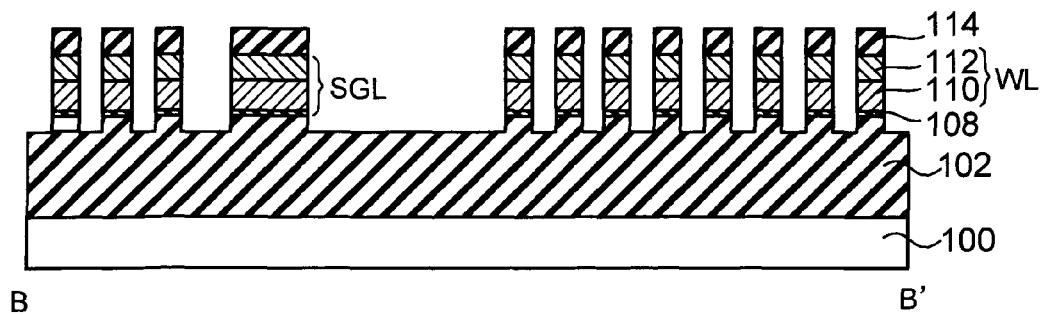
Figure 148:
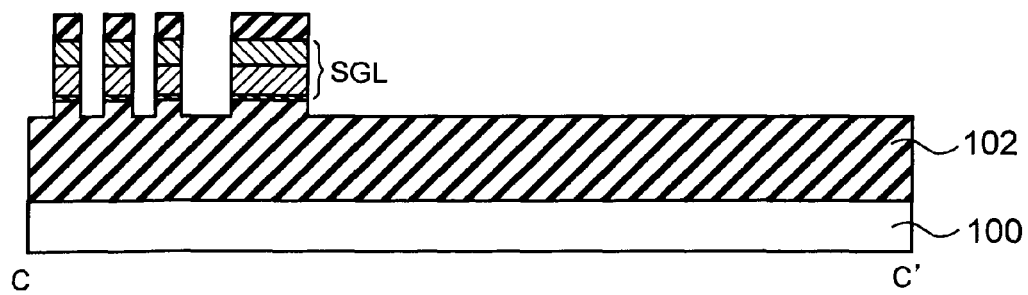
Figure 149:
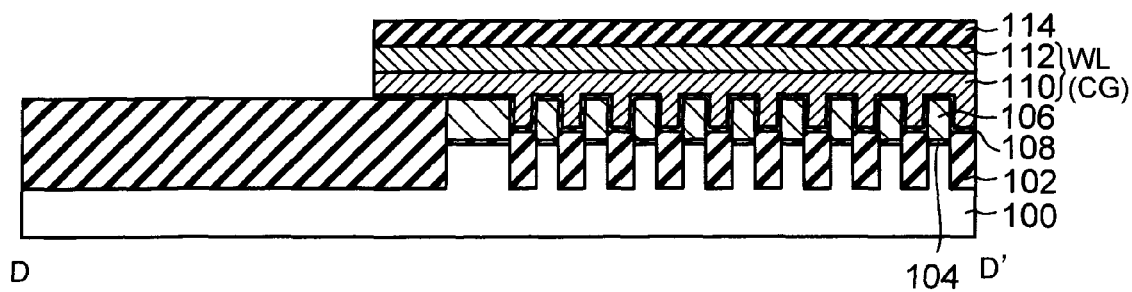
Figure 150:
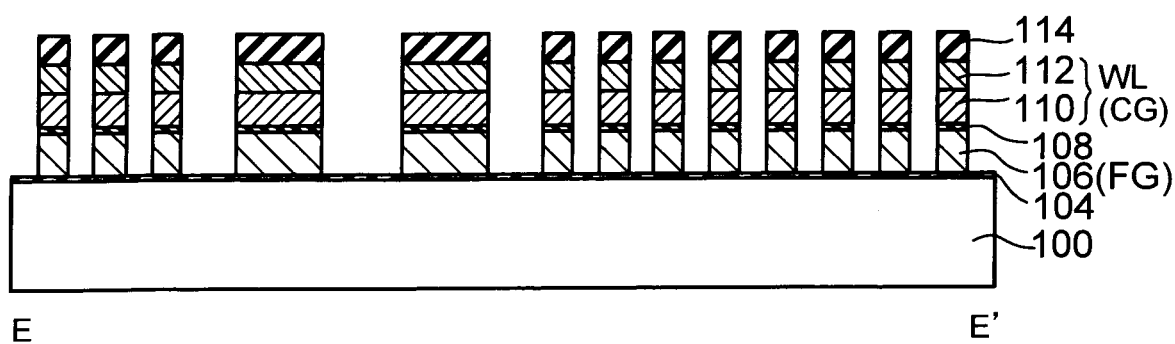
Figure 151:
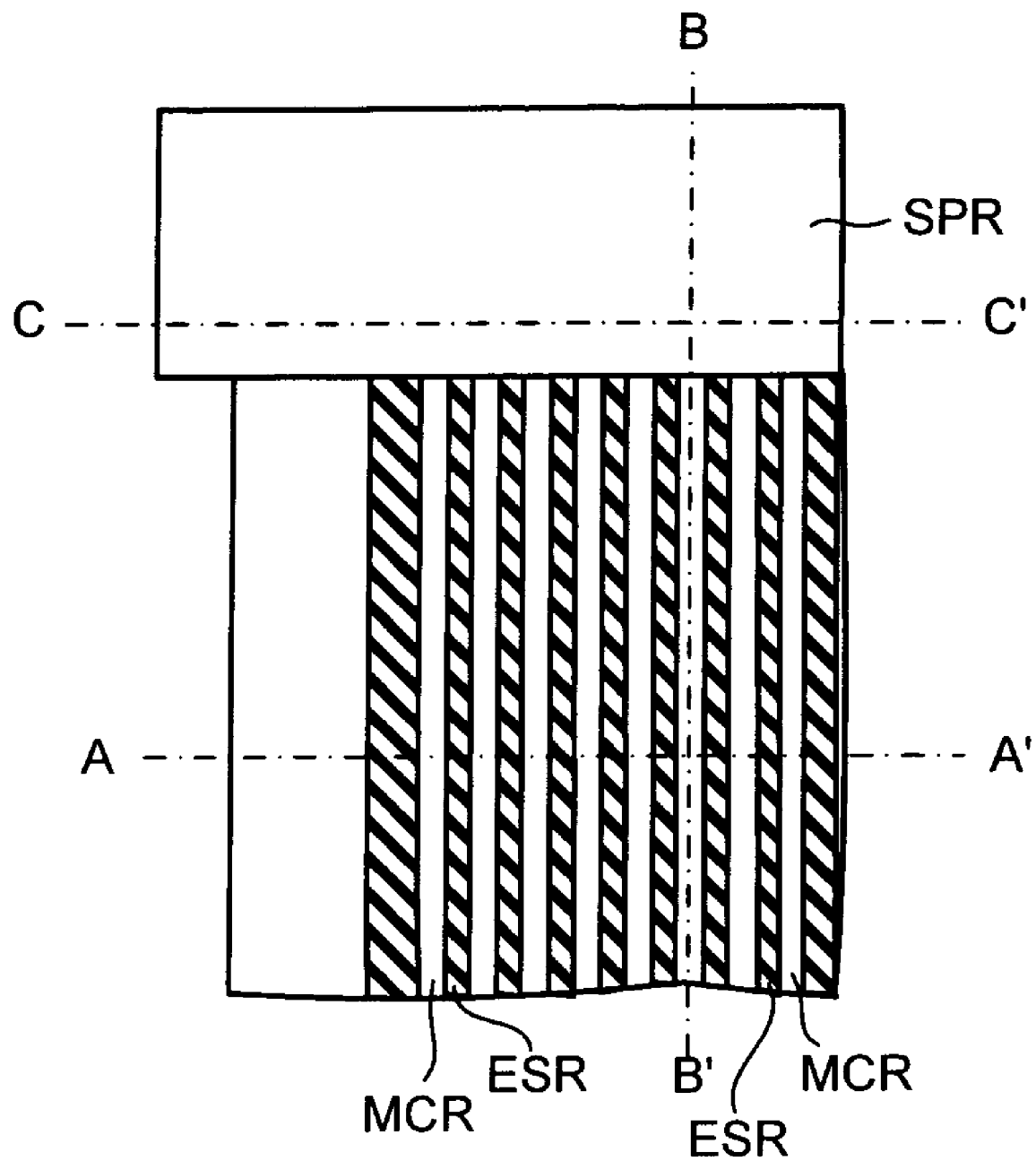
Figure 152:
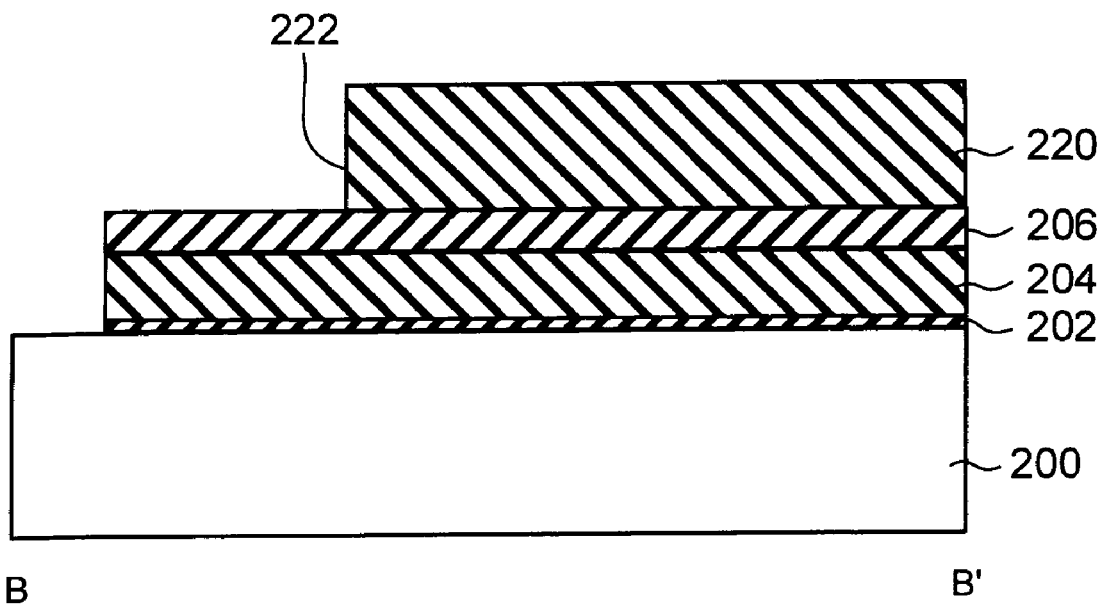
Figure 153:
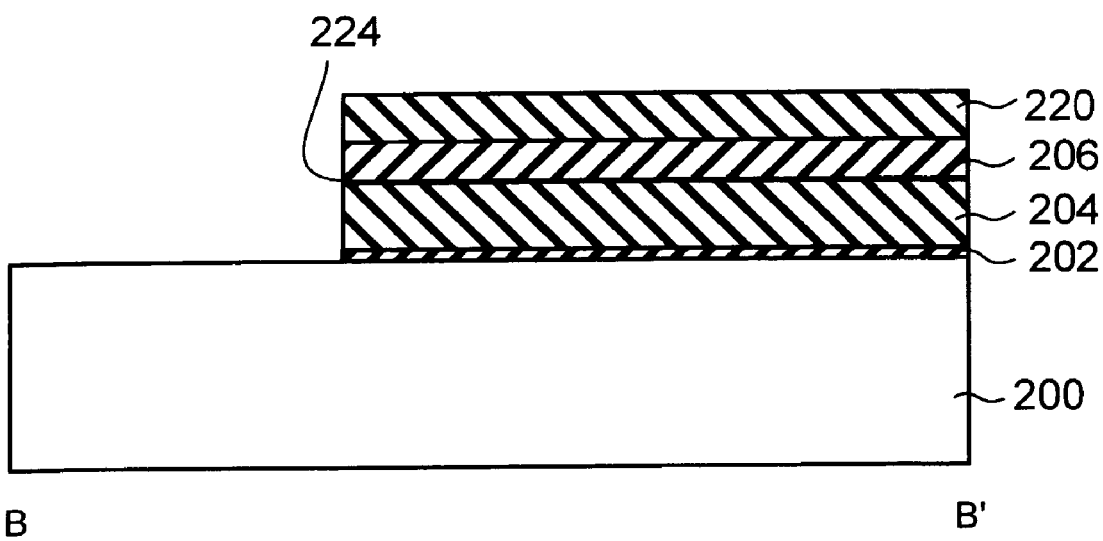
Figure 154:
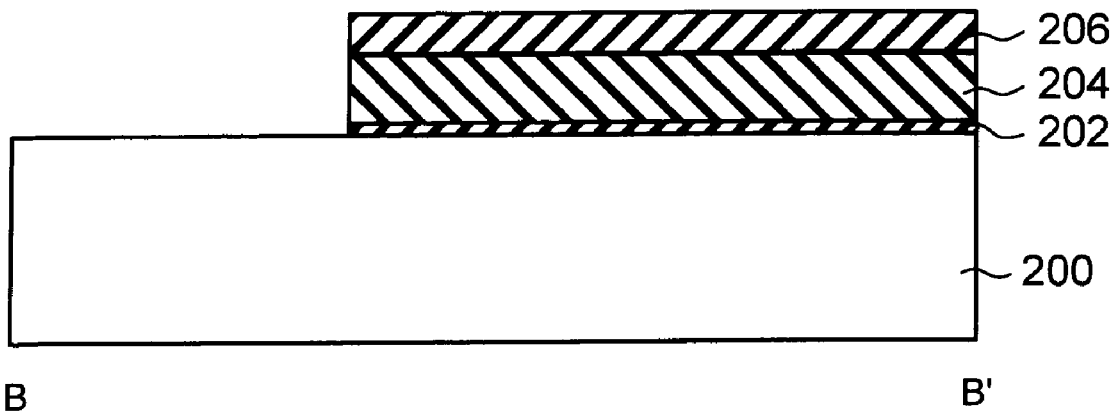
Figure 155:
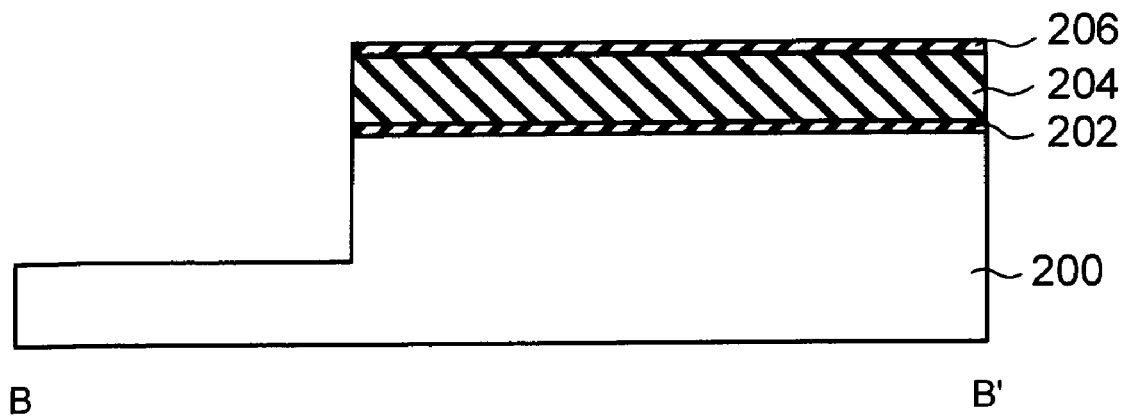
Figure 156:
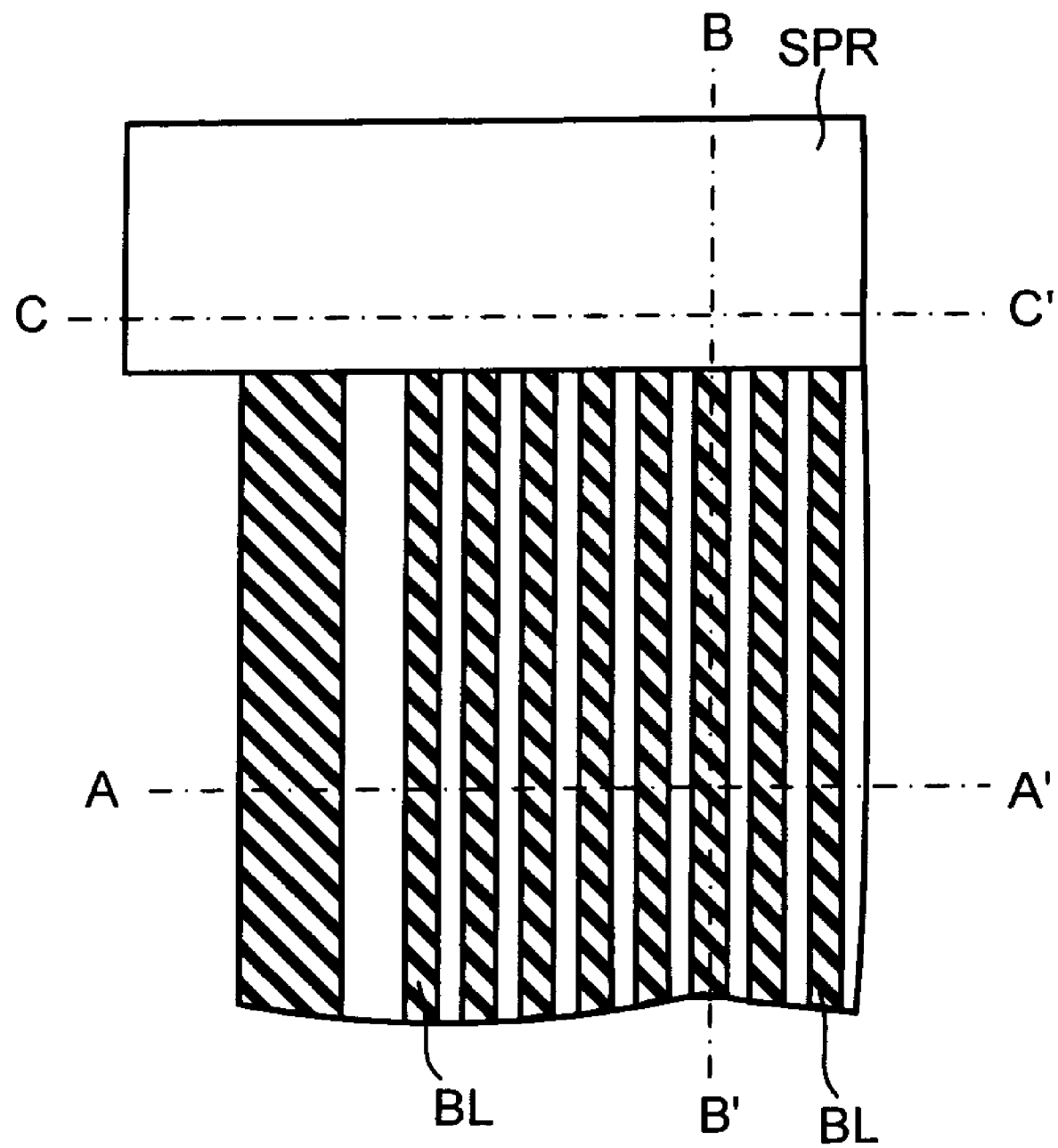
Figure 157:
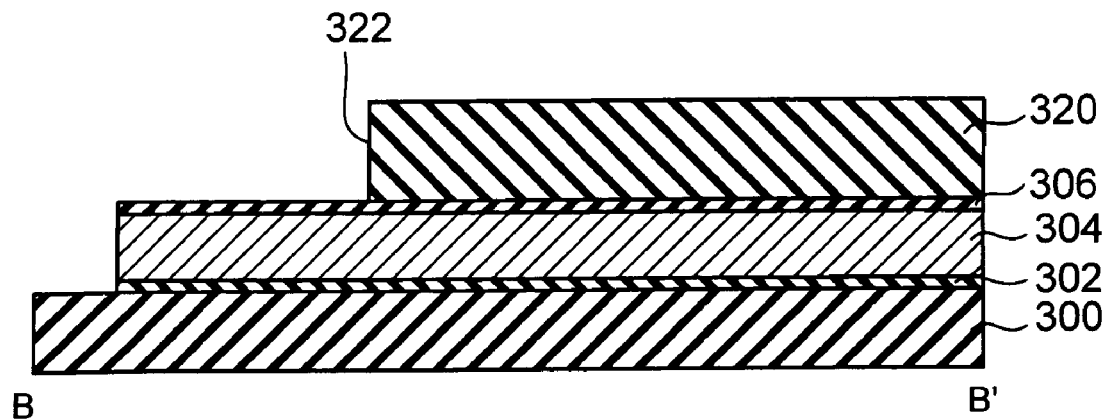
Figure 158:
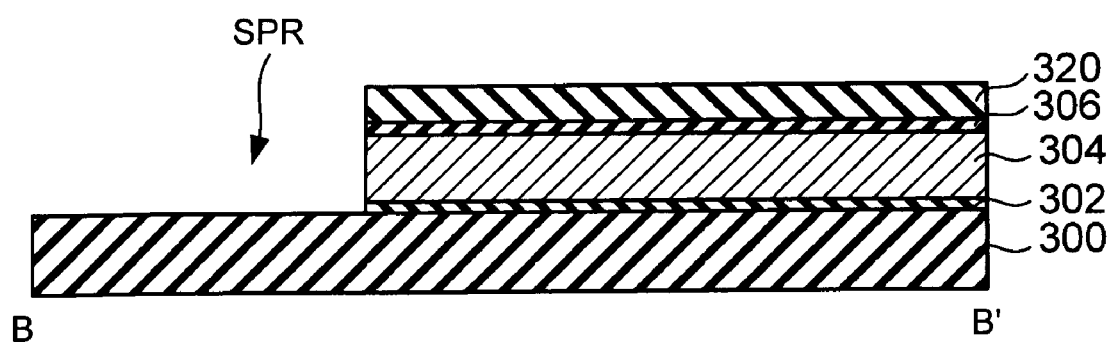
Figure 159:
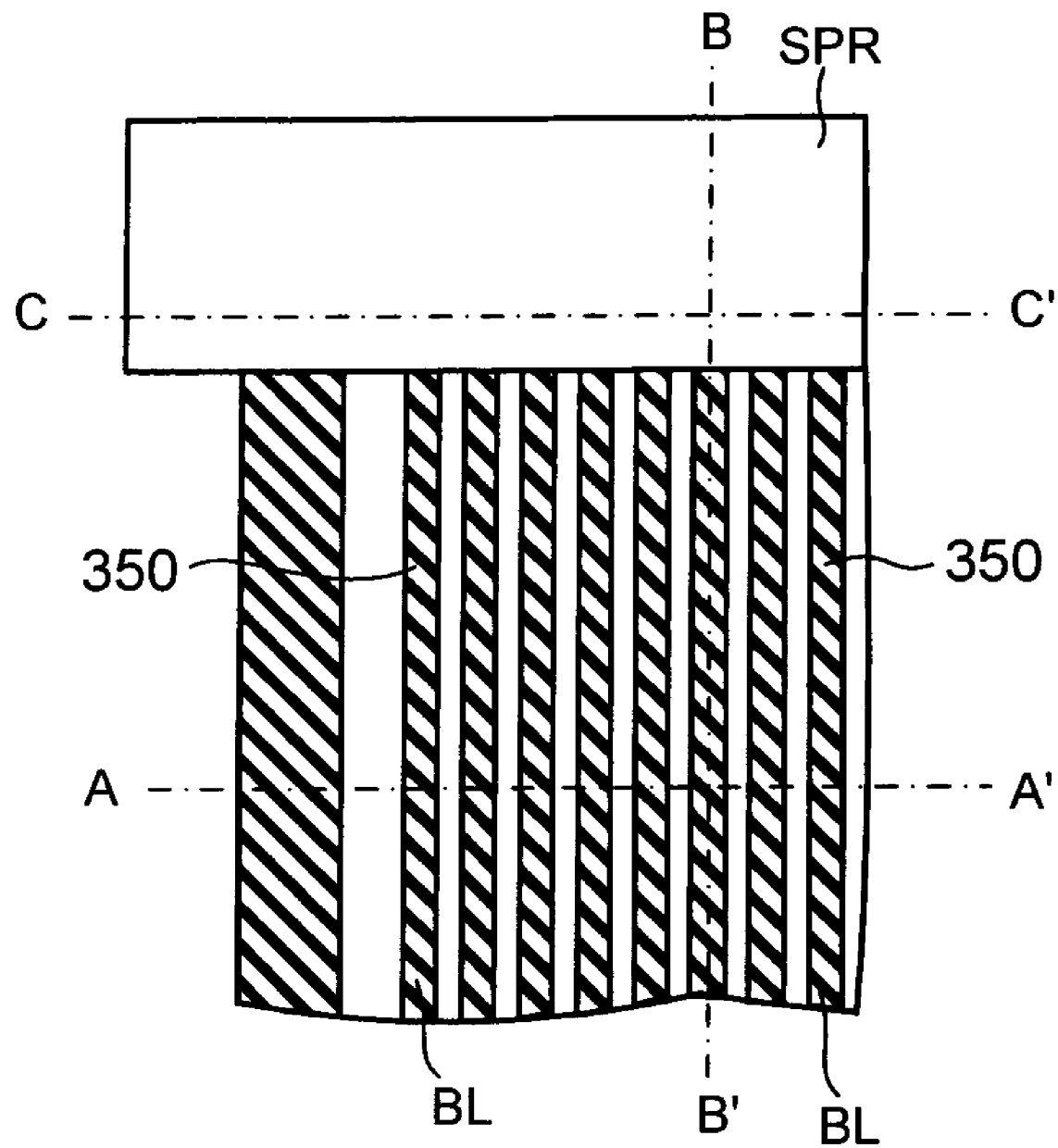
Figure 160:
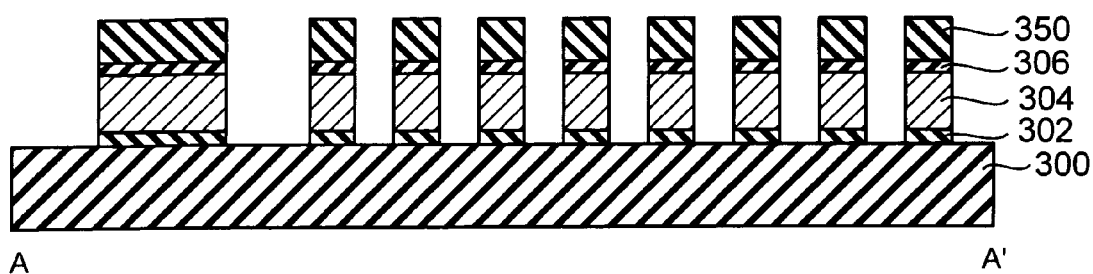
Figure 161:
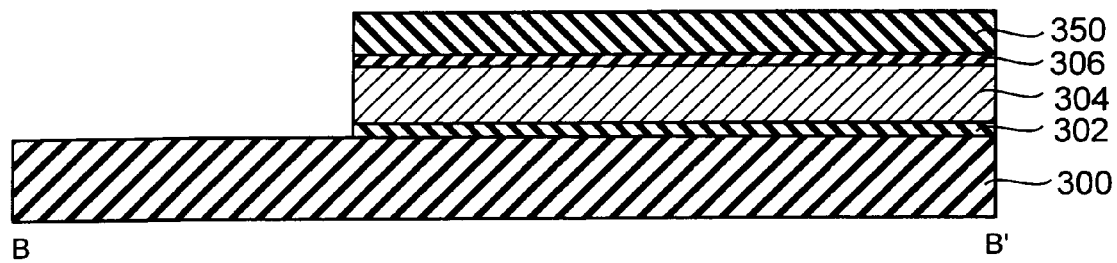
Figure 162:
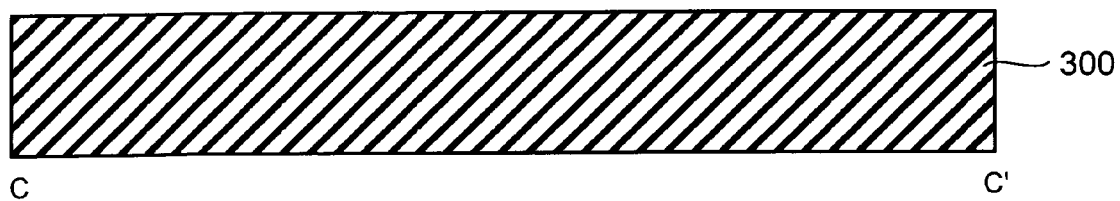
Figure 163:
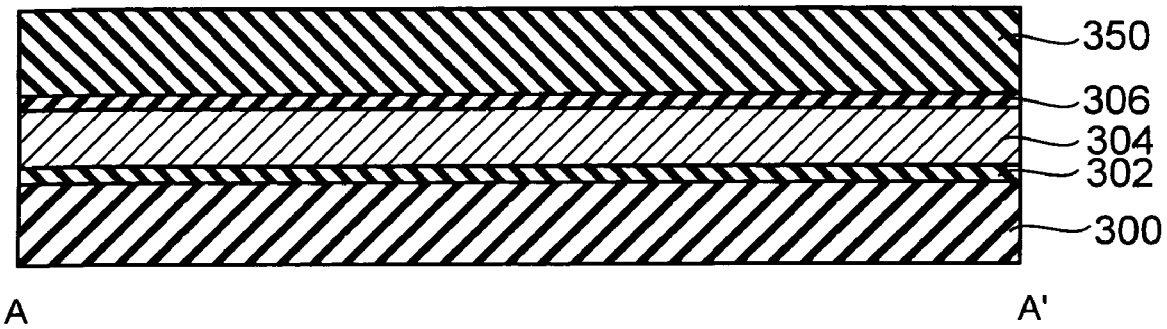
Figure 164:
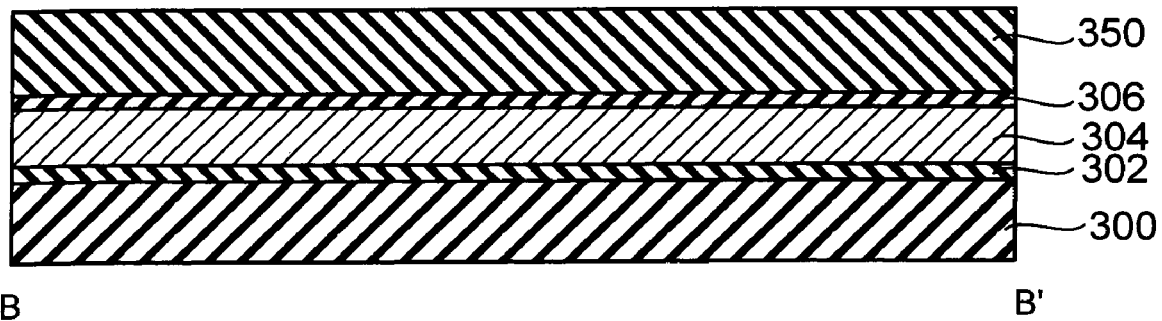
Figure 165:
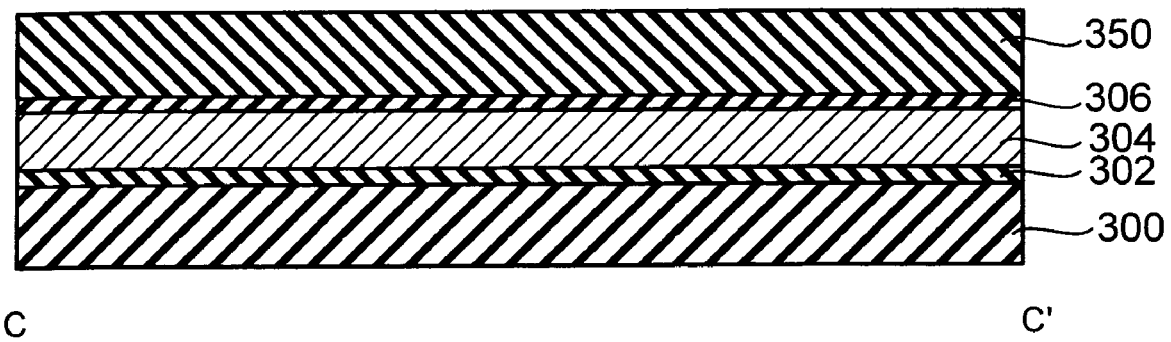
Figure 166:
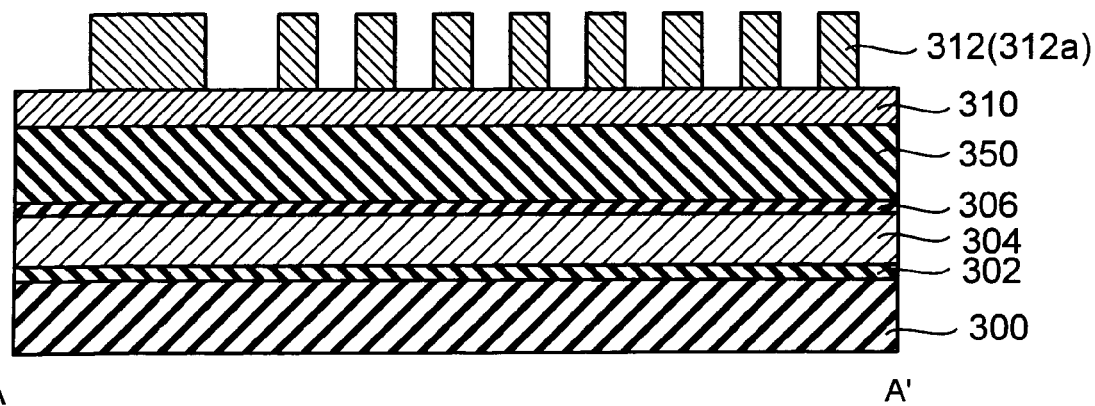
Figure 167:
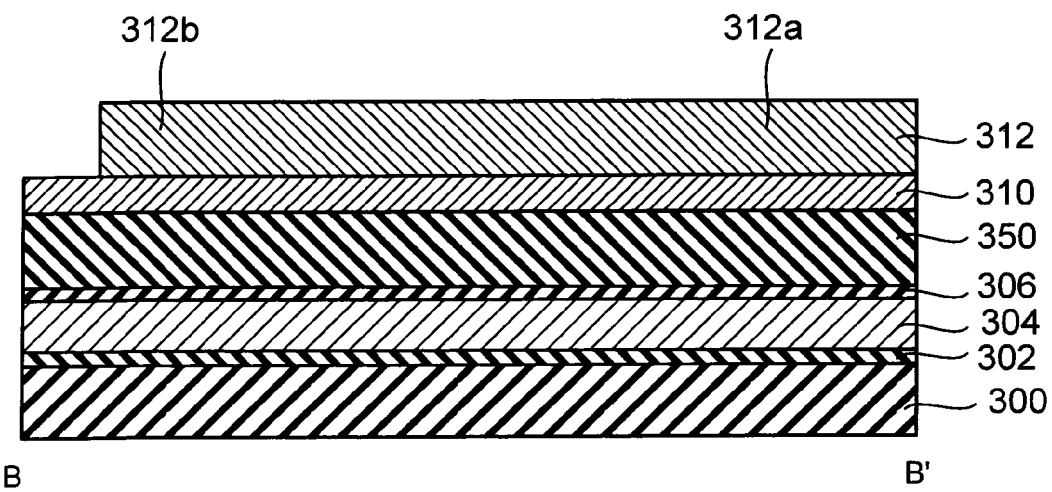
Figure 168:
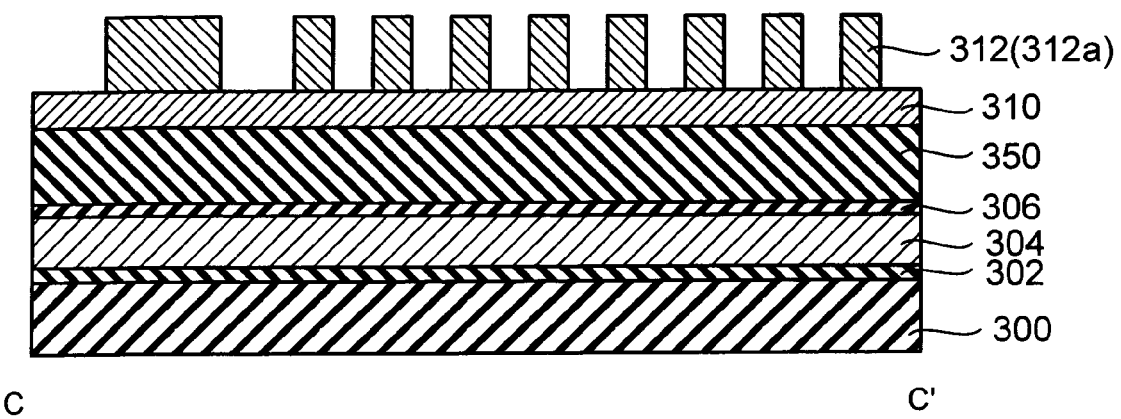
Figure 169:
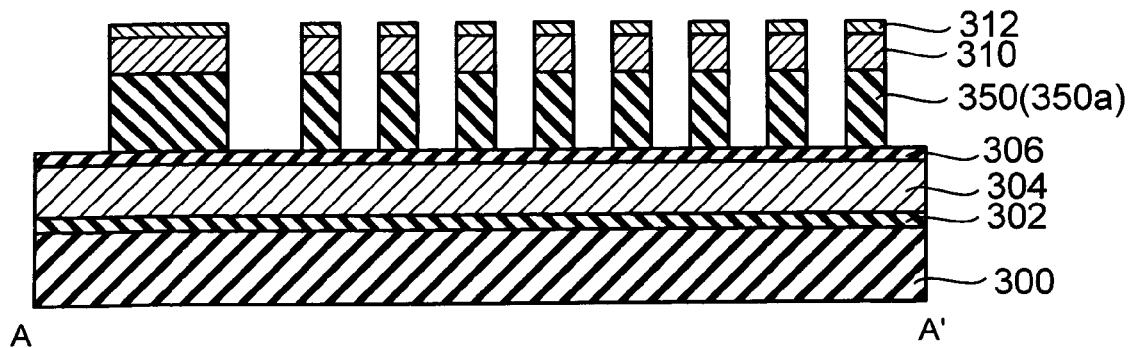
Figure 170:
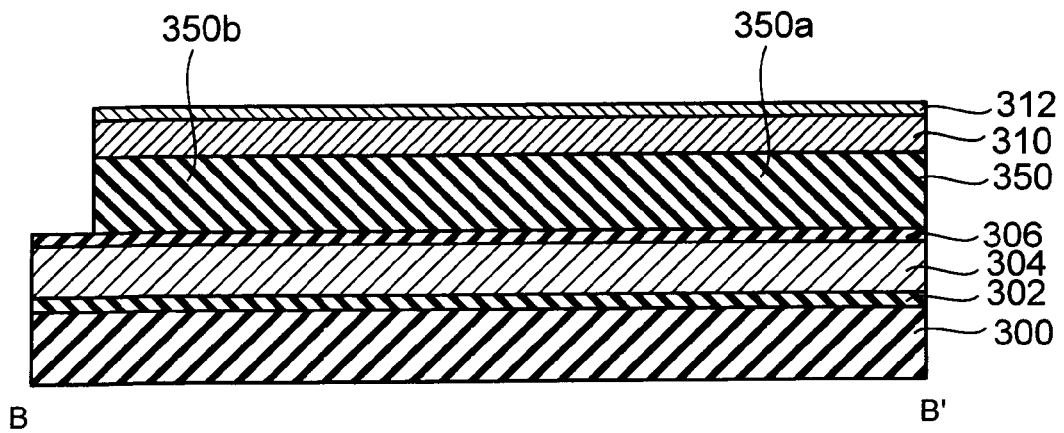
Figure 171:
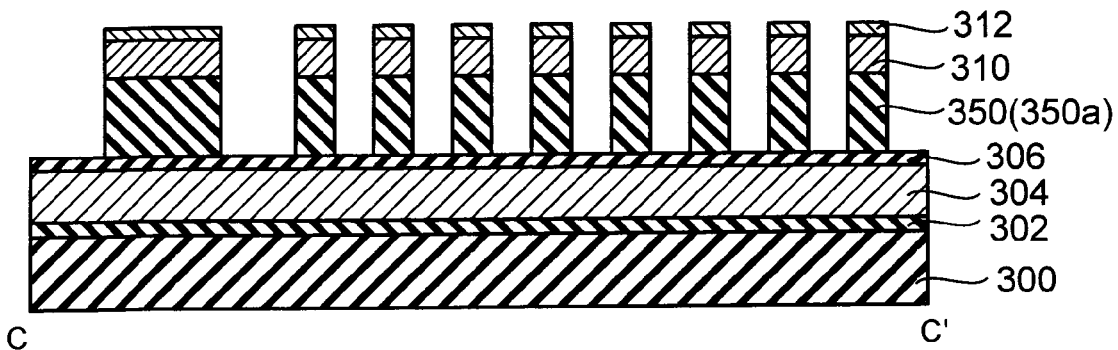
Figure 172:
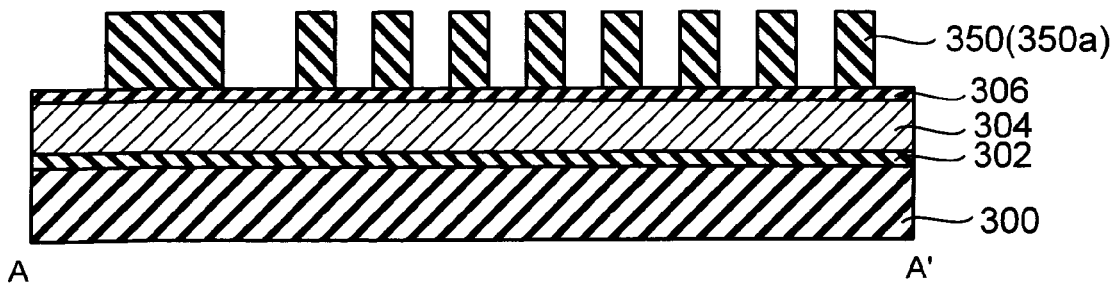
Figure 173:
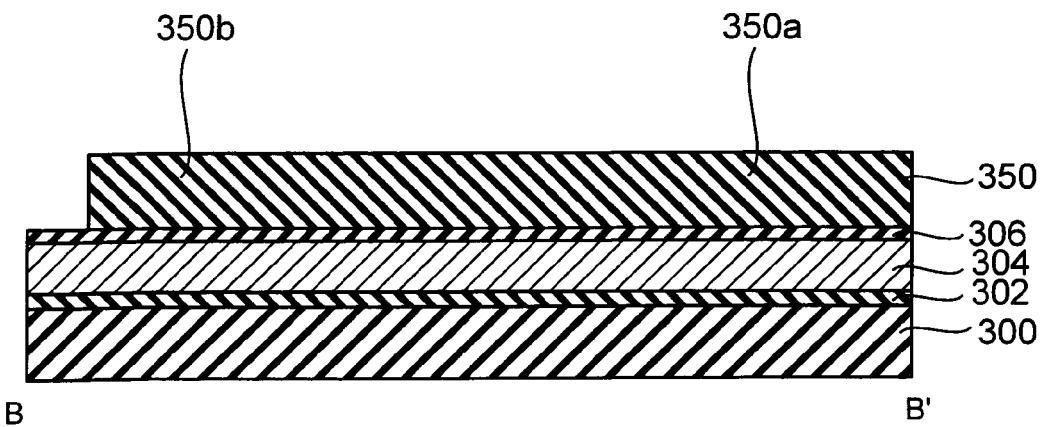
Figure 174:
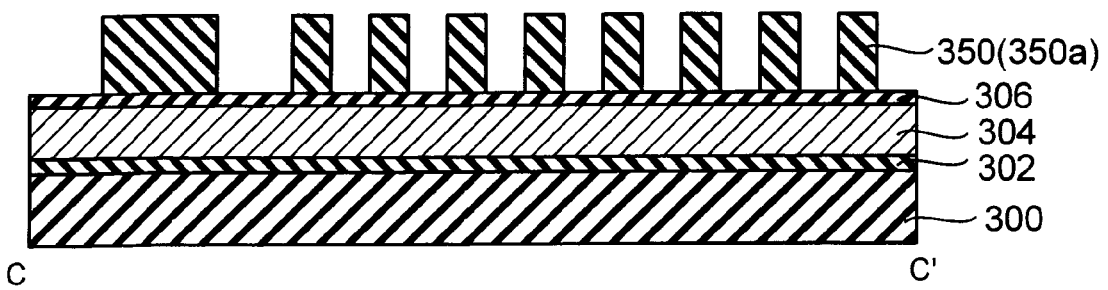
Figure 175:
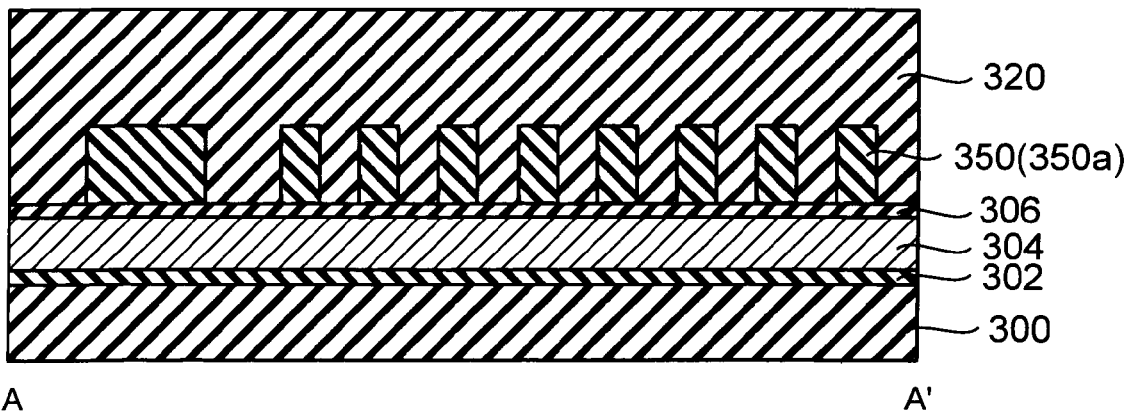
Figure 176:
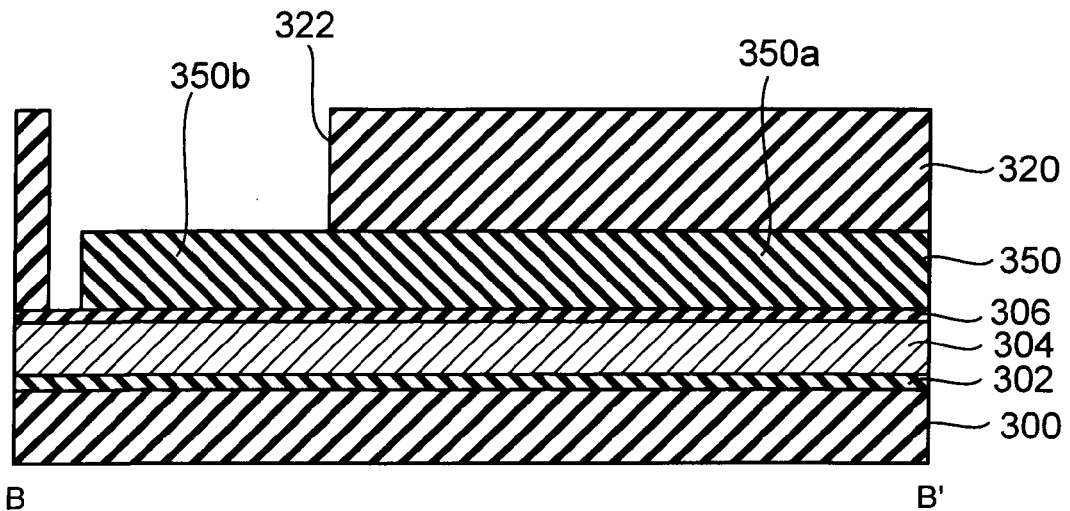
Figure 177:
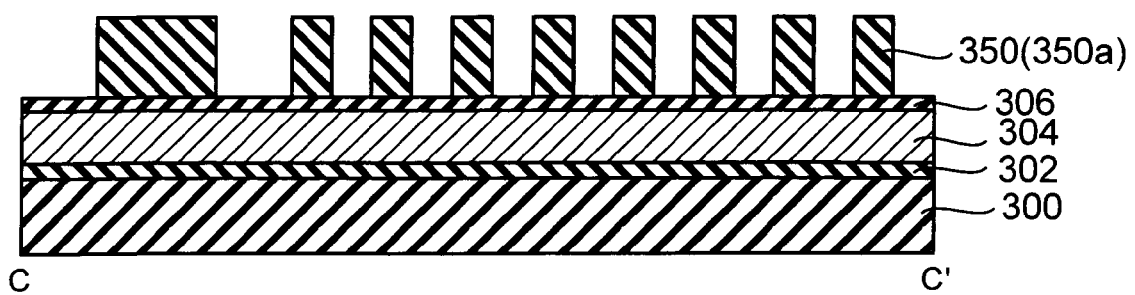
Figure 178:
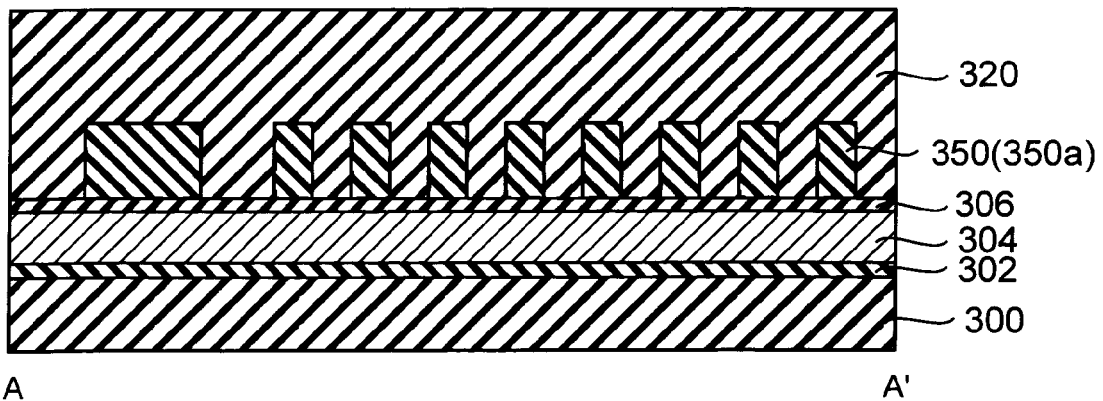
Figure 179:
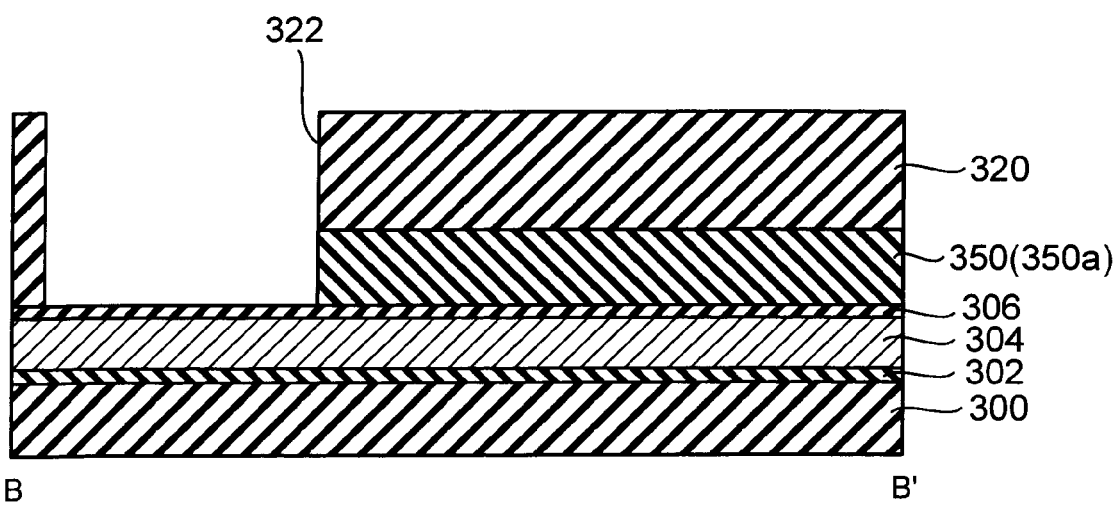
Figure 180:
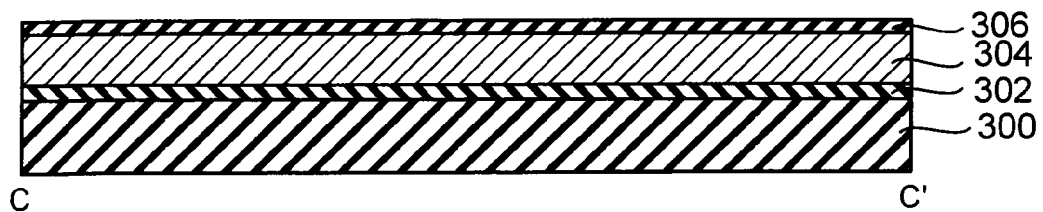
Figure 181:
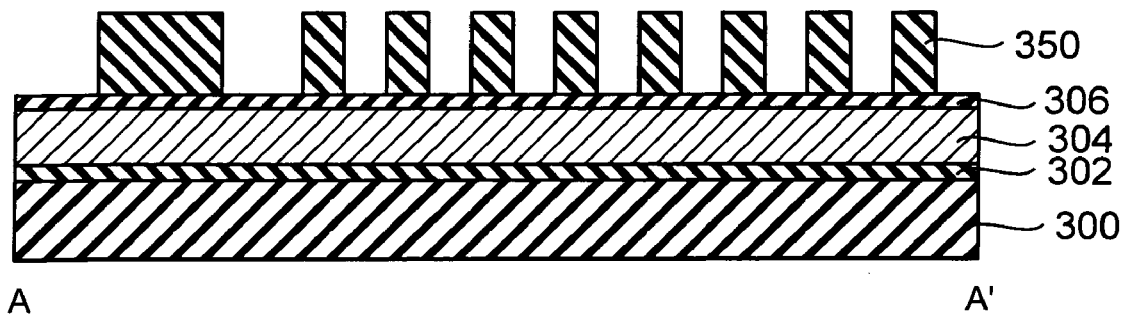
Figure 182:
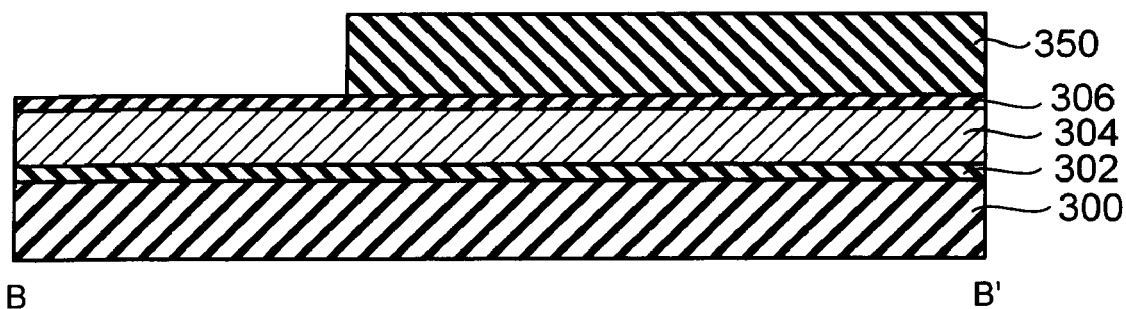
Figure 183:
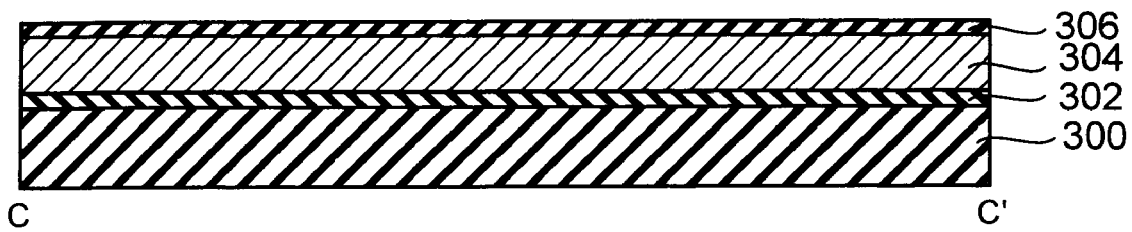
Figure 184:
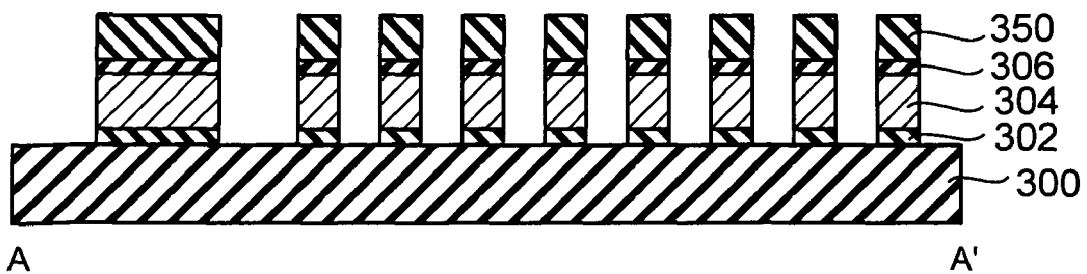
Figure 185:
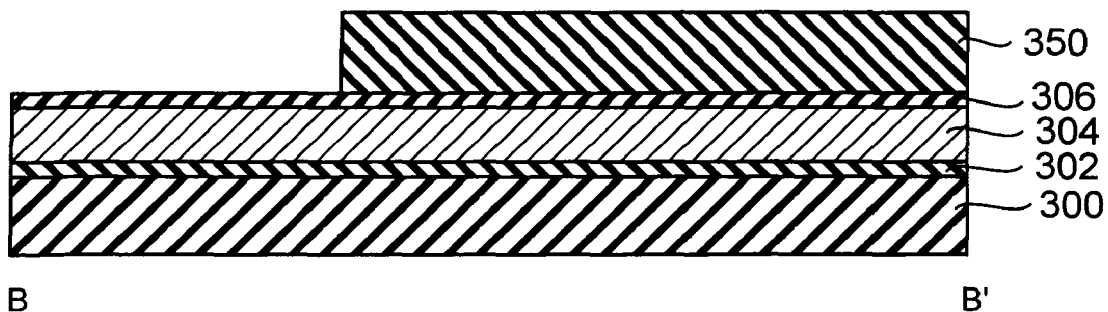
Figure 186:
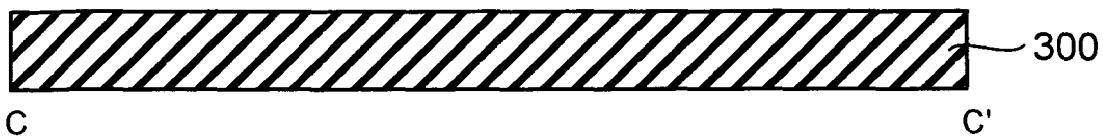

FIG. 132 is a process sectional view taken along the line B-B' of FIG. 101 for explaining a manufacturing process of the nonvolatile semiconductor memory device according to the further modified embodiment of the first embodiment;

FIG. 133 is a process sectional view taken along the line C-C' of FIG. 101 for explaining a manufacturing process of the nonvolatile semiconductor memory device according to the further modified embodiment of the first embodiment;

FIG. 134 is a process sectional view taken along the line D-D' of FIG. 101 for explaining a manufacturing process of the nonvolatile semiconductor memory device according to the further modified embodiment of the first embodiment;

FIG. 135 is a process sectional view taken along the line E-E' of FIG. 101 for explaining a manufacturing process of the nonvolatile semiconductor memory device according to the further modified embodiment of the first embodiment;

FIG. 136 is a process sectional view taken along the line A-A' of FIG. 101 for explaining a manufacturing process of the nonvolatile semiconductor memory device according to the further modified embodiment of the first embodiment;

FIG. 137 is a process sectional view taken along the line B-B' of FIG. 101 for explaining a manufacturing process of the nonvolatile semiconductor memory device according to the further modified embodiment of the first embodiment;

FIG. 138 is a process sectional view taken along the line C-C' of FIG. 101 for explaining a manufacturing process of the nonvolatile semiconductor memory device according to the further modified embodiment of the first embodiment;

FIG. 139 is a process sectional view taken along the line D-D' of FIG. 101 for explaining a manufacturing process of the nonvolatile semiconductor memory device according to the further modified embodiment of the first embodiment;

FIG. 140 is a process sectional view taken along the line E-E' of FIG. 101 for explaining a manufacturing process of the nonvolatile semiconductor memory device according to the further modified embodiment of the first embodiment;

FIG. 141 is a process sectional view taken along the line A-A' of FIG. 101 for explaining a manufacturing process of the nonvolatile semiconductor memory device according to the further modified embodiment of the first embodiment;

FIG. 142 is a process sectional view taken along the line B-B' of FIG. 101 for explaining a manufacturing process of the nonvolatile semiconductor memory device according to the further modified embodiment of the first embodiment;

FIG. 143 is a process sectional view taken along the line C-C' of FIG. 101 for explaining a manufacturing process of the nonvolatile semiconductor memory device according to the further modified embodiment of the first embodiment;

FIG. 144 is a process sectional view taken along the line D-D' of FIG. 101 for explaining a manufacturing process of the nonvolatile semiconductor memory device according to the further modified embodiment of the first embodiment;

FIG. 145 is a process sectional view taken along the line E-E' of FIG. 101 for explaining a manufacturing process of the nonvolatile semiconductor memory device according to the further modified embodiment of the first embodiment;

FIG. 146 is a process sectional view taken along the line A-A' of FIG. 101 for explaining a manufacturing process of the nonvolatile semiconductor memory device according to the further modified embodiment of the first embodiment;

FIG. 147 is a process sectional view taken along the line B-B' of FIG. 101 for explaining a manufacturing process of the nonvolatile semiconductor memory device according to the further modified embodiment of the first embodiment;

FIG. 148 is a process sectional view taken along the line C-C' of FIG. 101 for explaining a manufacturing process of the nonvolatile semiconductor memory device according to the further modified embodiment of the first embodiment;

FIG. 149 is a process sectional view taken along the line D-D' of FIG. 101 for explaining a manufacturing process of the nonvolatile semiconductor memory device according to the further modified embodiment of the first embodiment;

FIG. 150 is a process sectional view taken along the line E-E' of FIG. 101 for explaining a manufacturing process of the nonvolatile semiconductor memory device according to the further modified embodiment of the first embodiment;

FIG. 151 is a view corresponding to FIG. 42 for explaining a modification of the second embodiment;

FIG. 152 is a view corresponding to FIG. 59 for explaining the modification of the second embodiment;

FIG. 153 is a view corresponding to FIG. 62 for explaining the modification of the second embodiment;

FIG. 154 is a view corresponding to FIG. 65 for explaining the modification of the second embodiment;

FIG. 155 is a view corresponding to FIG. 68 for explaining the modification of the second embodiment;

FIG. 156 is a view corresponding to FIG. 79 for explaining a modification of the third embodiment;

FIG. 157 is a view corresponding to FIG. 96 for explaining the modification of the third embodiment;

FIG. 158 is a view corresponding to FIG. 99 for explaining the modification of the third embodiment;

FIG. 159 is a plan view showing the structure of a nonvolatile semiconductor memory device according to a further modified embodiment of the third embodiment;

FIG. 160 is a sectional view taken along the line A-A' of FIG. 159 showing the structure of the nonvolatile semiconductor memory device according to the further modified embodiment of the third embodiment;

FIG. 161 is a sectional view taken along the line B-B' of FIG. 159 showing the structure of the nonvolatile semiconductor memory device according to the further modified embodiment of the third embodiment;

FIG. 162 is a sectional view taken along the line C-C' of FIG. 159 showing the structure of the nonvolatile semiconductor memory device according to the further modified embodiment of the third embodiment;

FIG. 163 is a process sectional view taken along the line A-A' of FIG. 159 for explaining a manufacturing process of the nonvolatile semiconductor memory device according to the further modified embodiment of the third embodiment;

FIG. 164 is a process sectional view taken along the line B-B' of FIG. 159 for explaining a manufacturing process of the nonvolatile semiconductor memory device according to the further modified embodiment of the third embodiment;

FIG. 165 is a process sectional view taken along the line C-C' of FIG. 159 for explaining a manufacturing process of the nonvolatile semiconductor memory device according to the further modified embodiment of the third embodiment;

FIG. 166 is a process sectional view taken along the line A-A' of FIG. 159 for explaining a manufacturing process of the nonvolatile semiconductor memory device according to the further modified embodiment of the third embodiment;

FIG. 167 is a process sectional view taken along the line B-B' of FIG. 159 for explaining a manufacturing process of the nonvolatile semiconductor memory device according to the further modified embodiment of the third embodiment;

FIG. 168 is a process sectional view taken along the line C-C' of FIG. 159 for explaining a manufacturing process of the nonvolatile semiconductor memory device according to the further modified embodiment of the third embodiment;

FIG. 169 is a process sectional view taken along the line A-A' of FIG. 159 for explaining a manufacturing process of the nonvolatile semiconductor memory device according to the further modified embodiment of the third embodiment;

FIG. 170 is a process sectional view taken along the line B-B' of FIG. 159 for explaining a manufacturing process of the nonvolatile semiconductor memory device according to the further modified embodiment of the third embodiment;

FIG. 171 is a process sectional view taken along the line C-C' of FIG. 159 for explaining a manufacturing process of the nonvolatile semiconductor memory device according to the further modified embodiment of the third embodiment;

FIG. 172 is a process sectional view taken along the line A-A' of FIG. 159 for explaining a manufacturing process of the nonvolatile semiconductor memory device according to the further modified embodiment of the third embodiment;

FIG. 173 is a process sectional view taken along the line B-B' of FIG. 159 for explaining a manufacturing process of the nonvolatile semiconductor memory device according to the further modified embodiment of the third embodiment;

FIG. 174 is a process sectional view taken along the line C-C' of FIG. 159 for explaining a manufacturing process of the nonvolatile semiconductor memory device according to the further modified embodiment of the third embodiment;

FIG. 175 is a process sectional view taken along the line A-A' of FIG. 159 for explaining a manufacturing process of the nonvolatile semiconductor memory device according to the further modified embodiment of the third embodiment;

FIG. 176 is a process sectional view taken along the line B-B' of FIG. 159 for explaining a manufacturing process of the nonvolatile semiconductor memory device according to the further modified embodiment of the third embodiment;

FIG. 177 is a process sectional view taken along the line C-C' of FIG. 159 for explaining a manufacturing process of the nonvolatile semiconductor memory device according to the further modified embodiment of the third embodiment;

FIG. 178 is a process sectional view taken along the line A-A' of FIG. 159 for explaining a manufacturing process of the nonvolatile semiconductor memory device according to the further modified embodiment of the third embodiment;

FIG. 179 is a process sectional view taken along the line B-B' of FIG. 159 for explaining a manufacturing process of the nonvolatile semiconductor memory device according to the further modified embodiment of the third embodiment;

FIG. 180 is a process sectional view taken along the line C-C' of FIG. 159 for explaining a manufacturing process of the nonvolatile semiconductor memory device according to the further modified embodiment of the third embodiment;

FIG. 181 is a process sectional view taken along the line A-A' of FIG. 159 for explaining a manufacturing process of the nonvolatile semiconductor memory device according to the further modified embodiment of the third embodiment;

FIG. 182 is a process sectional view taken along the line B-B' of FIG. 159 for explaining a manufacturing process of the nonvolatile semiconductor memory device according to the further modified embodiment of the third embodiment;

FIG. 183 is a process sectional view taken along the line C-C' of FIG. 159 for explaining a manufacturing process of the nonvolatile semiconductor memory device according to the further modified embodiment of the third embodiment;

FIG. 184 is a process sectional view taken along the line A-A' of FIG. 159 for explaining a manufacturing process of the nonvolatile semiconductor memory device according to the further modified embodiment of the third embodiment;

FIG. 185 is a process sectional view taken along the line B-B' of FIG. 159 for explaining a manufacturing process of the nonvolatile semiconductor memory device according to the further modified embodiment of the third embodiment; and FIG. 186 is a process sectional view taken along the line C-C' of FIG. 159 for explaining a manufacturing process of the nonvolatile semiconductor memory device according to the further modified embodiment of the third embodiment.

DETAILED DESCRIPTION OF THE EMBODIMENTS

First Embodiment

In the first embodiment, a problem in a fabrication process such as resist pattern collapse or the like, which occurs in a region such as a memory cell array in a NAND-type nonvolatile semiconductor memory device requiring micro-wiring technology, is prevented by changing the pattern layout of the memory cell array, which makes it possible to realize a stable high yield. Further details will be given below.

Figure 1:
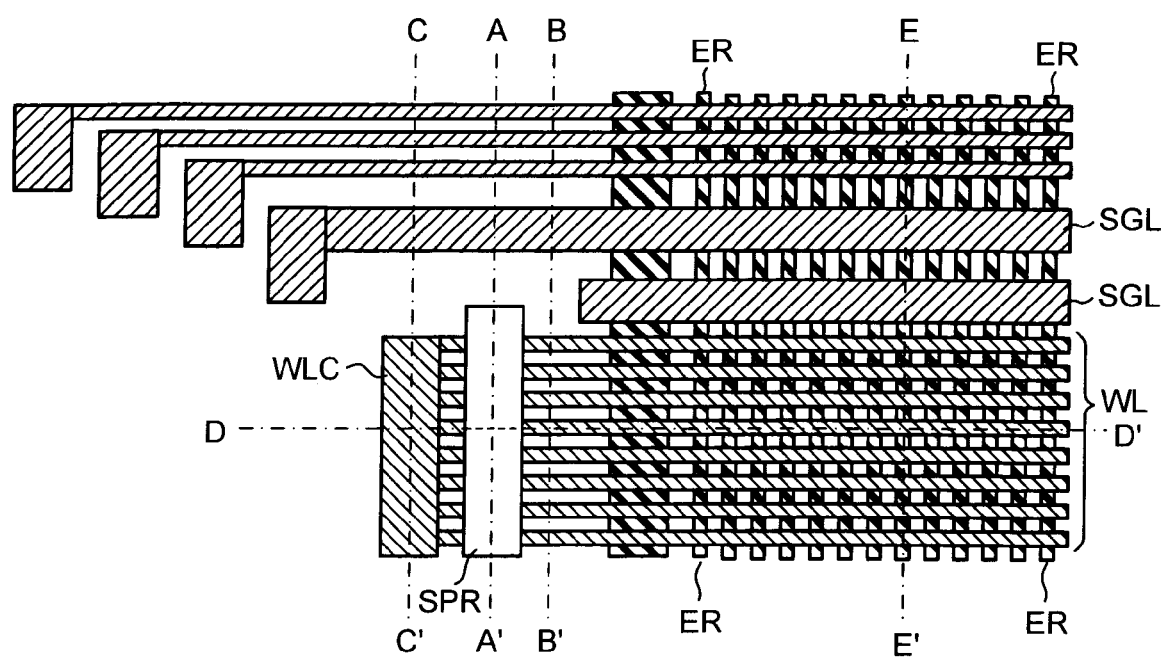
FIG. 1 is a plan view showing the structure of a nonvolatile semiconductor memory device according to a first embodiment.
Figure 2:
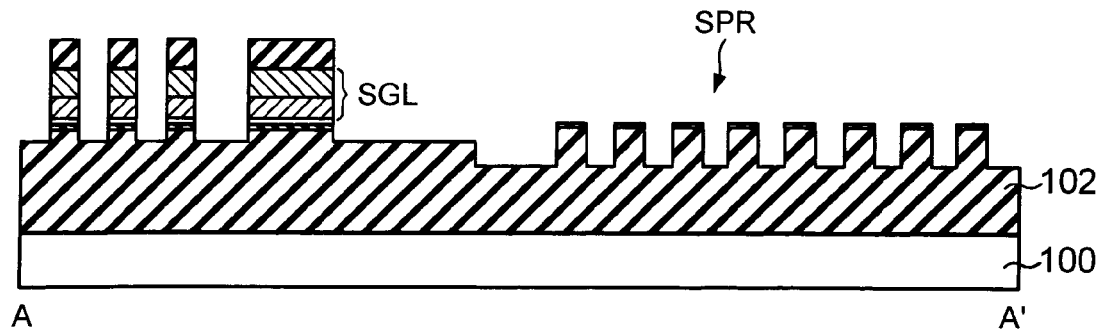
FIG. 2 is a sectional view taken along the line A-A' of FIG. 1 showing the structure of the nonvolatile semiconductor memory device according to the first embodiment.
Figure 3:
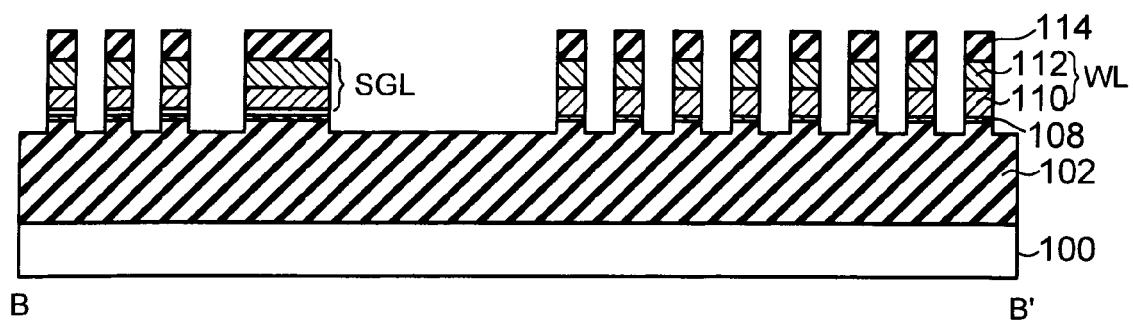
FIG. 3 is a sectional view taken along the line B-B' of FIG. 1 showing the structure of the nonvolatile semiconductor memory device according to the first embodiment.
Figure 4:
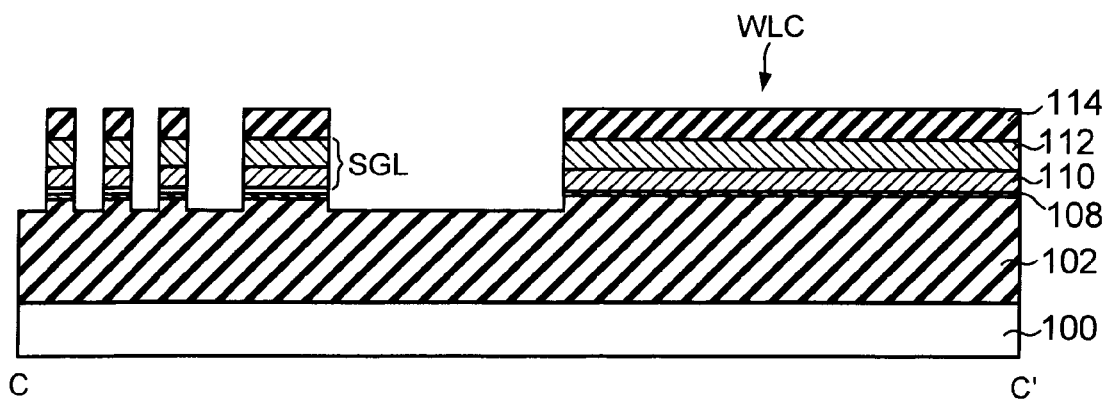
FIG. 4 is a sectional view taken along the line C-C' of FIG. 1 showing the structure of the nonvolatile semiconductor memory device according to the first embodiment.
Figure 5:
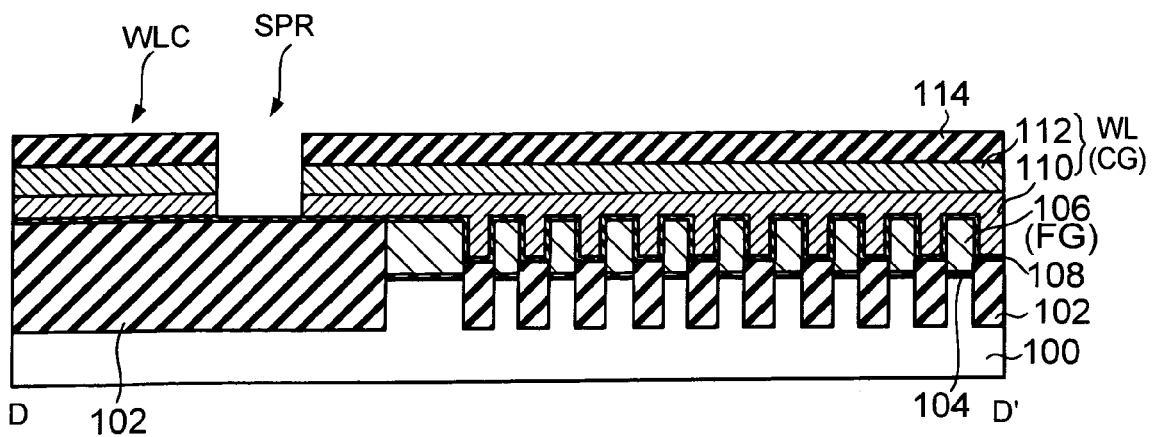
FIG. 5 is a sectional view taken along the line D-D' of FIG. 1 showing the structure of the nonvolatile semiconductor memory device according to the first embodiment.
Figure 6:
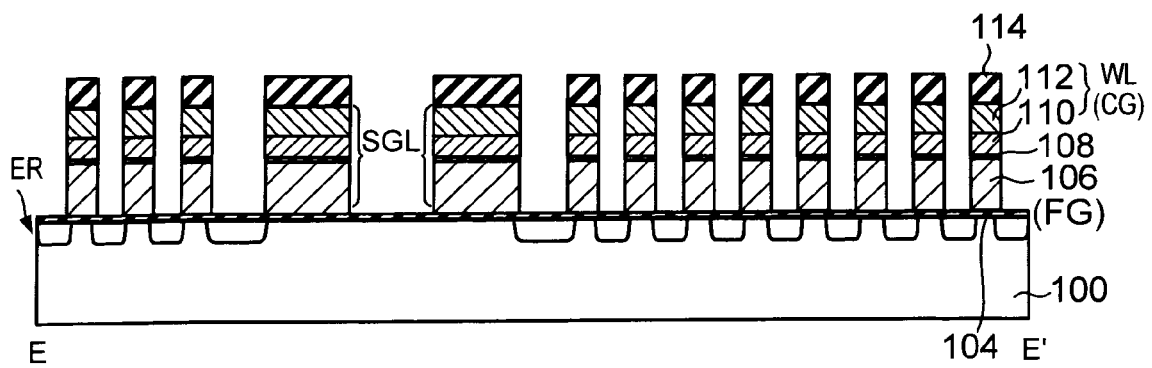
FIG. 6 is a sectional view taken along the line E-E' of FIG. 1 showing the structure of the nonvolatile semiconductor memory device according to the first embodiment.
Figure 7:
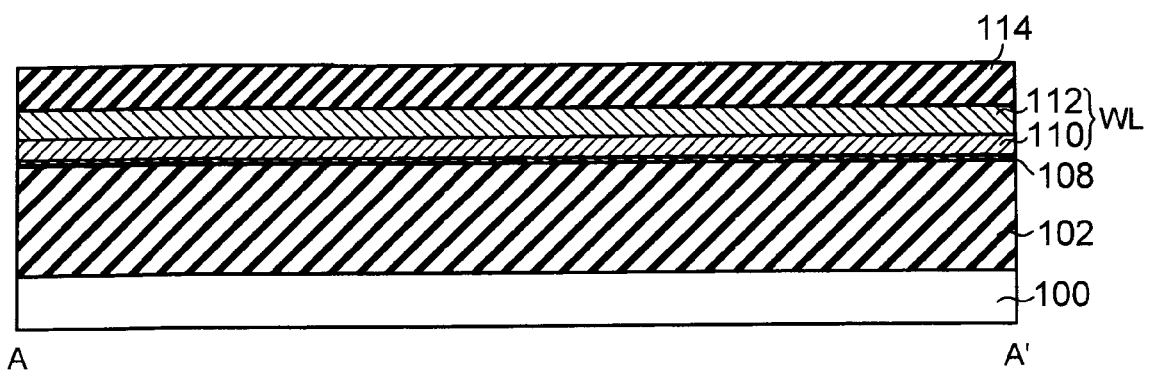
FIG. 7 is a process sectional view for explaining a manufacturing process of the nonvolatile semiconductor memory device according to the first embodiment.
Figure 8:
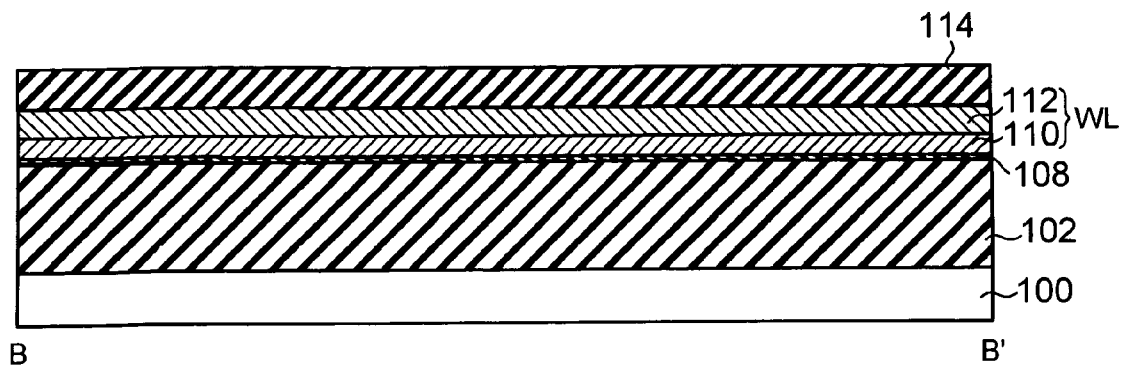
FIG. 8 is a process sectional view for explaining the manufacturing process of the nonvolatile semiconductor memory device according to the first embodiment.
Figure 9:
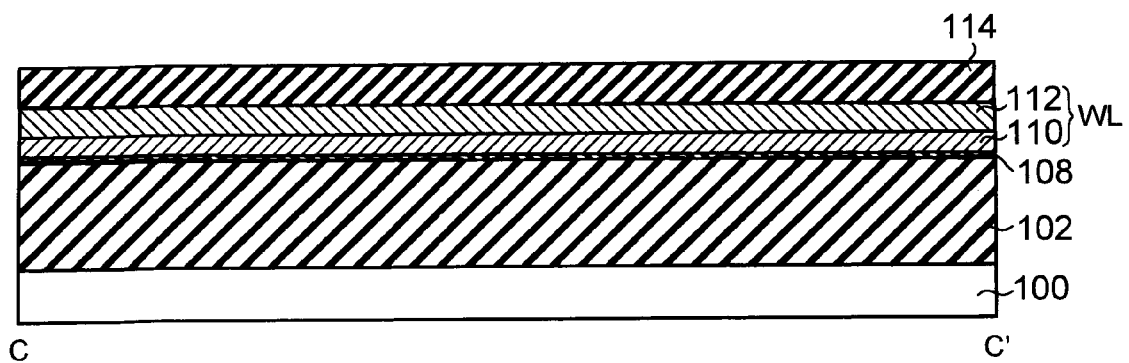
FIG. 9 is a process sectional view for explaining the manufacturing process of the nonvolatile semiconductor memory device according to the first embodiment.
Figure 10:
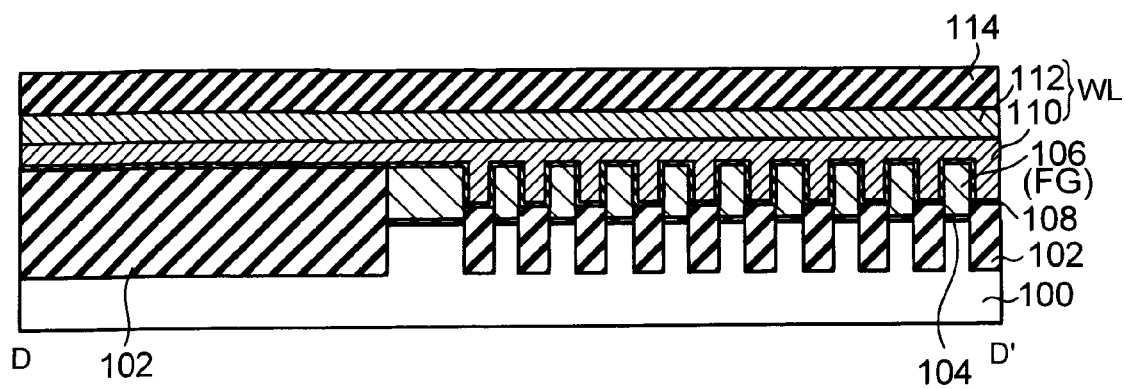
FIG. 10 is a process sectional view for explaining the manufacturing process of the nonvolatile semiconductor memory device according to the first embodiment.
Figure 11:
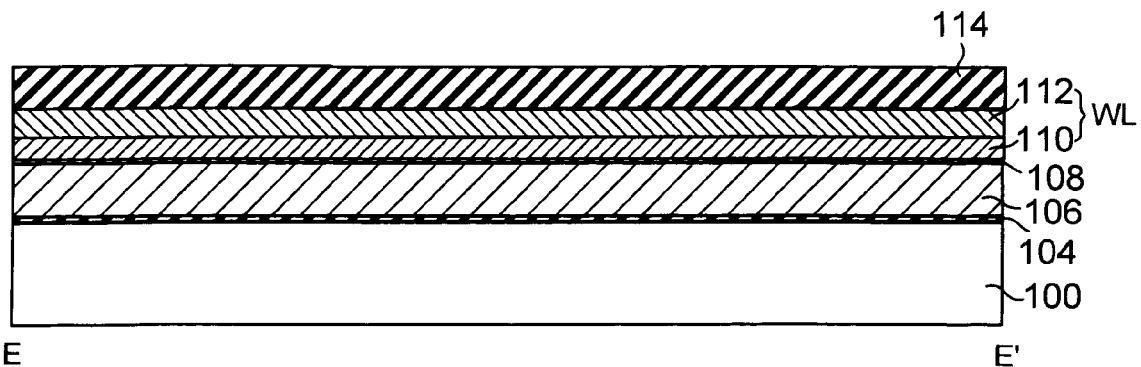
FIG. 11 is a process sectional view for explaining the manufacturing process of the nonvolatile semiconductor memory device according to the first embodiment.
Figure 12:
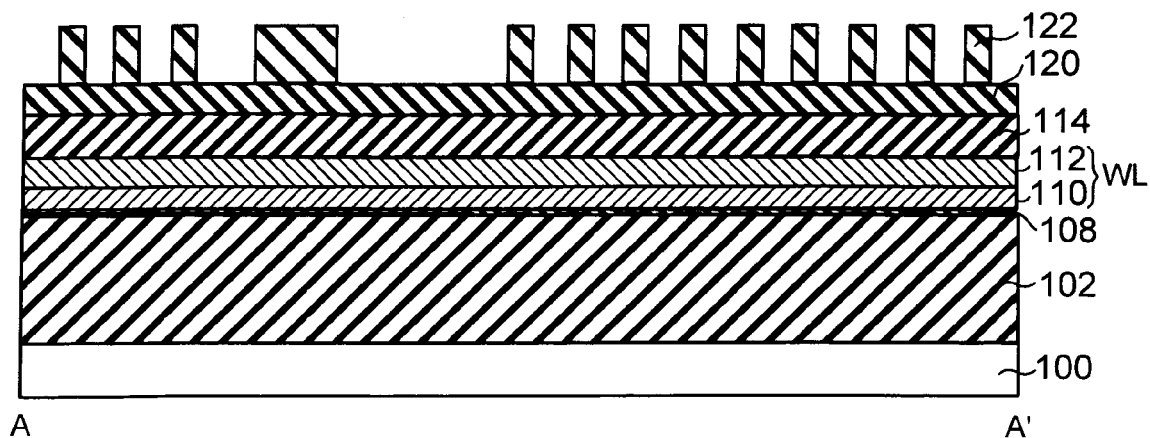
FIG. 12 is a process sectional view for explaining the manufacturing process of the nonvolatile semiconductor memory device according to the first embodiment.
Figure 13:
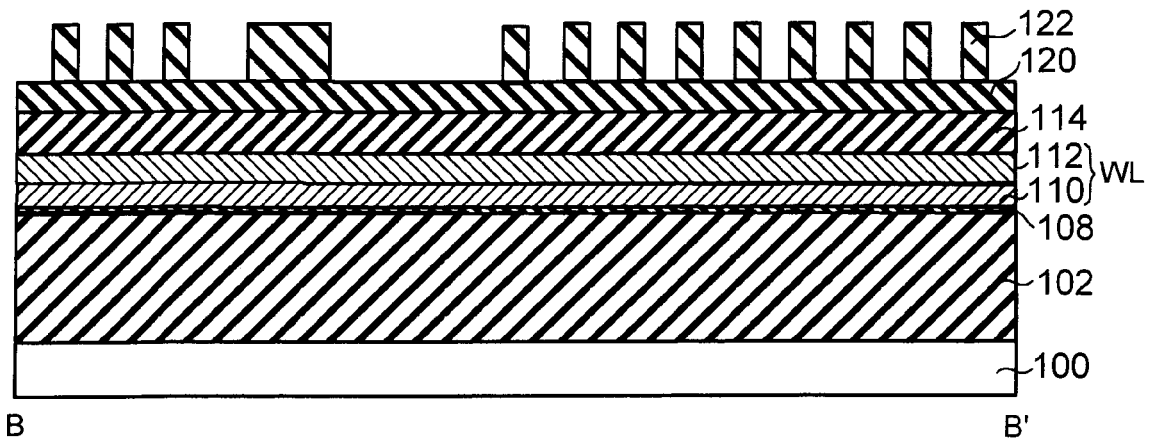
FIG. 13 is a process sectional view for explaining the manufacturing process of the nonvolatile semiconductor memory device according to the first embodiment.
Figure 14:
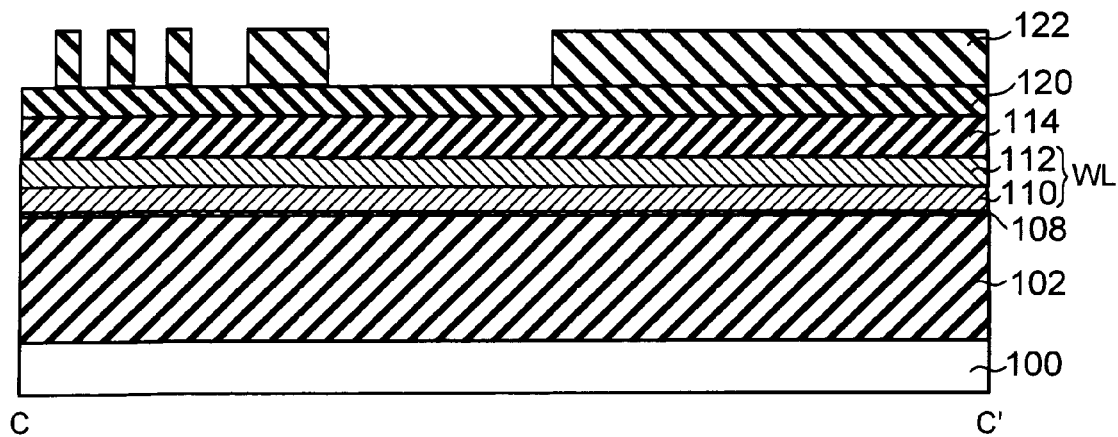
FIG. 14 is a process sectional view for explaining the manufacturing process of the nonvolatile semiconductor memory device according to the first embodiment.
Figure 15:
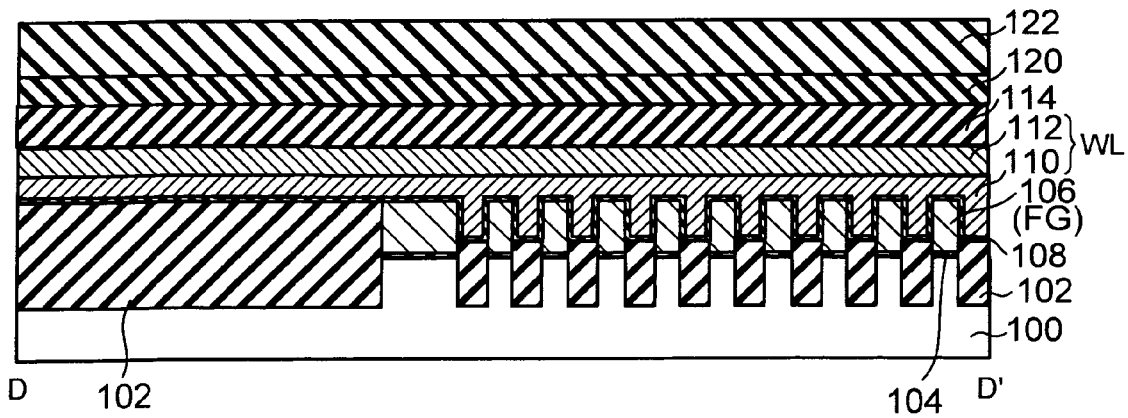
FIG. 15 is a process sectional view for explaining the manufacturing process of the nonvolatile semiconductor memory device according to the first embodiment.
Figure 16:
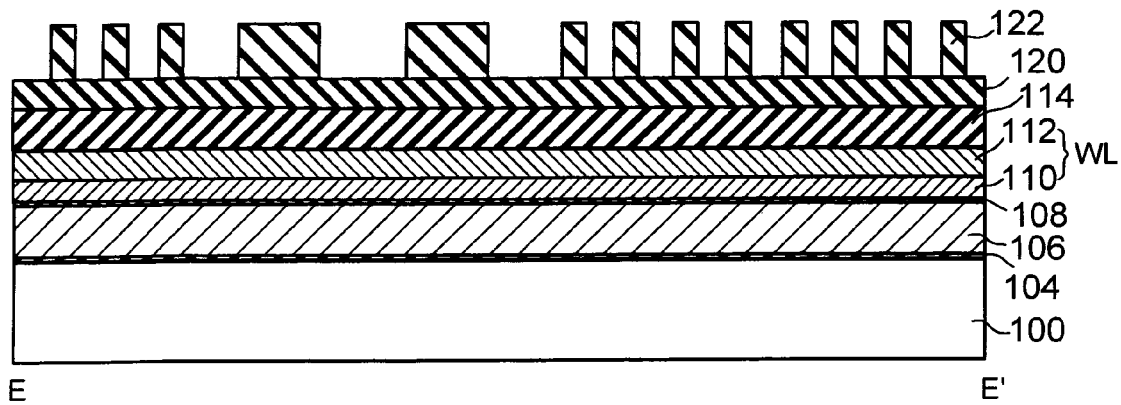
FIG. 16 is a process sectional view for explaining the manufacturing process of the nonvolatile semiconductor memory device according to the first embodiment.
Figure 17:
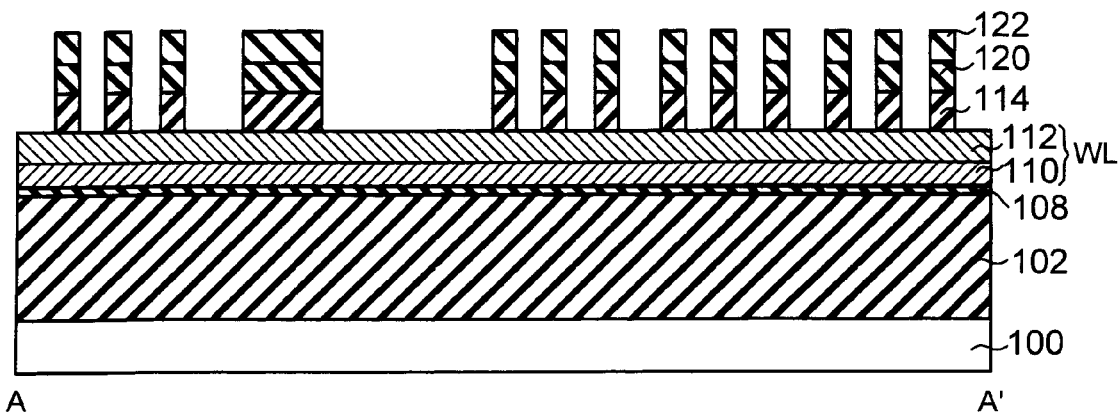
FIG. 17 is a process sectional view for explaining the manufacturing process of the nonvolatile semiconductor memory device according to the first embodiment.
Figure 18:
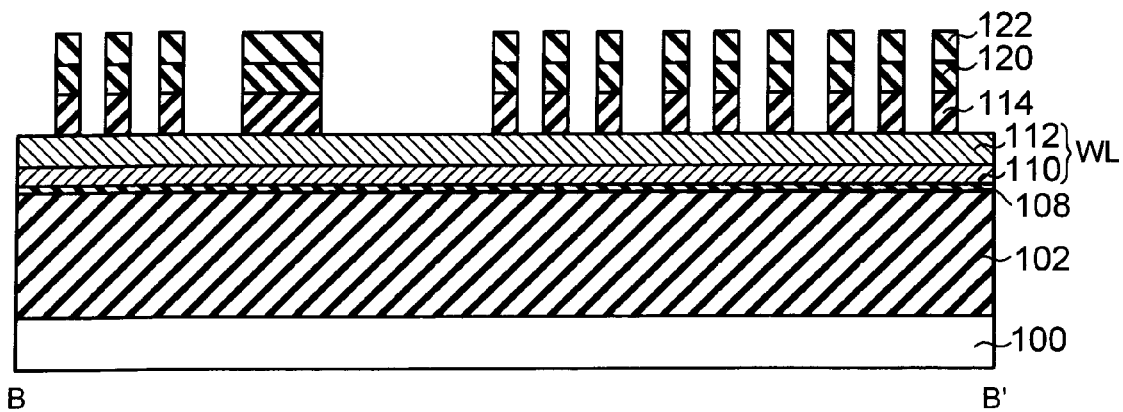
FIG. 18 is a process sectional view for explaining the manufacturing process of the nonvolatile semiconductor memory device according to the first embodiment.
Figure 19:
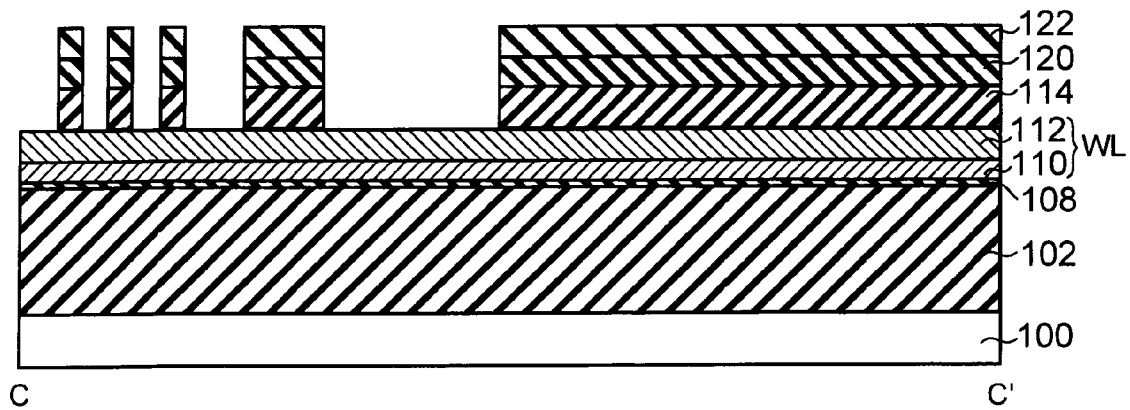
FIG. 19 is a process sectional view for explaining the manufacturing process of the nonvolatile semiconductor memory device according to the first embodiment.
Figure 20:
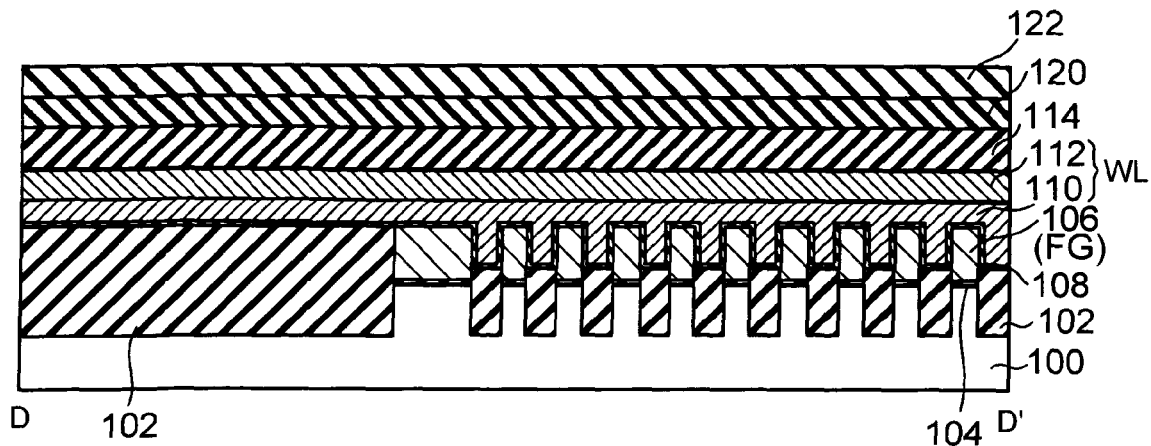
FIG. 20 is a process sectional view for explaining the manufacturing process of the nonvolatile semiconductor memory device according to the first embodiment.
Figure 21:
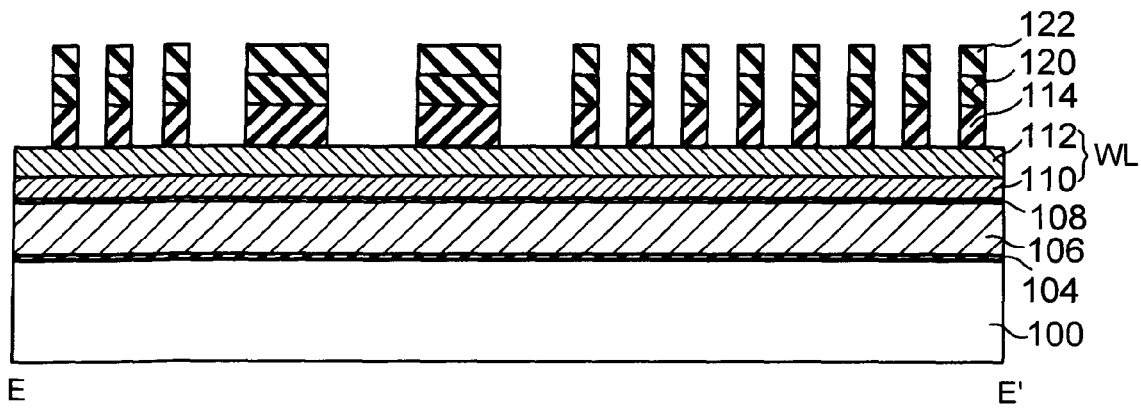
FIG. 21 is a process sectional view for explaining the manufacturing process of the nonvolatile semiconductor memory device according to the first embodiment.
Figure 22:
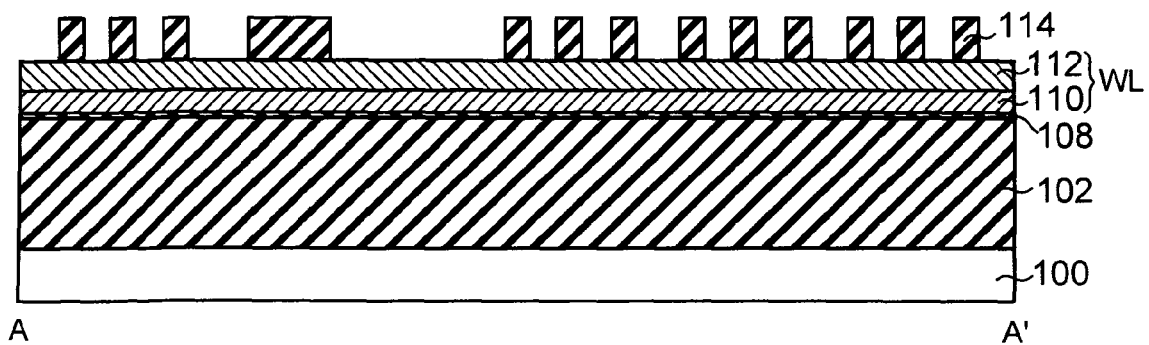
FIG. 22 is a process sectional view for explaining the manufacturing process of the nonvolatile semiconductor memory device according to the first embodiment.
Figure 23:
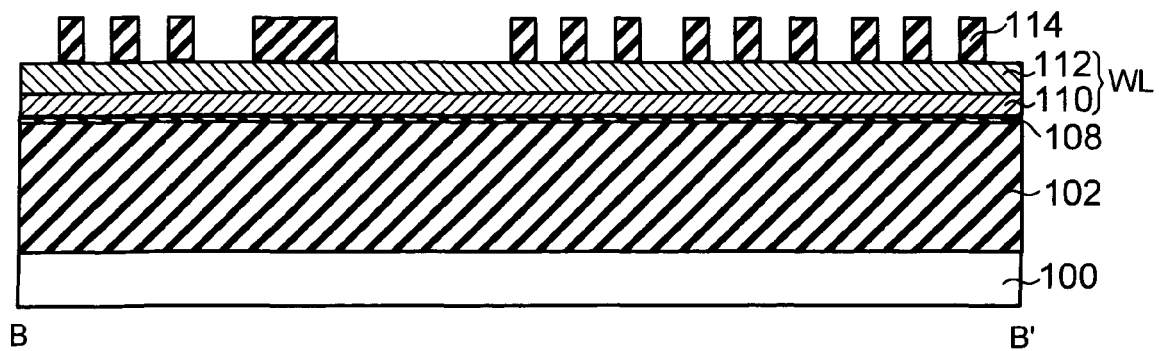
FIG. 23 is a process sectional view for explaining the manufacturing process of the nonvolatile semiconductor memory device according to the first embodiment.
Figure 24:
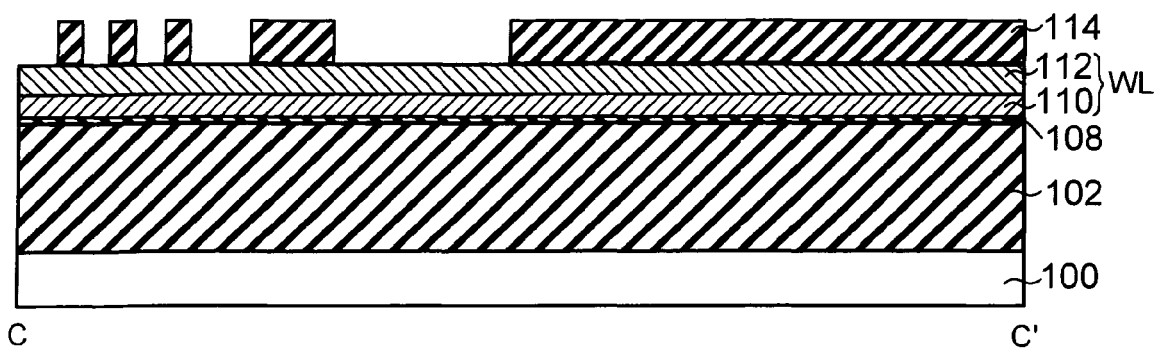
FIG. 24 is a process sectional view for explaining the manufacturing process of the nonvolatile semiconductor memory device according to the first embodiment.
Figure 25:
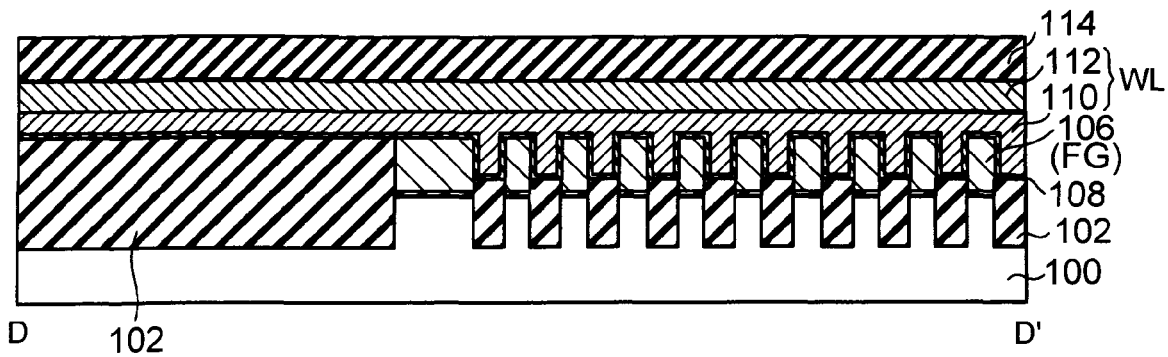
FIG. 25 is a process sectional view for explaining the manufacturing process of the nonvolatile semiconductor memory device according to the first embodiment.
Figure 26:
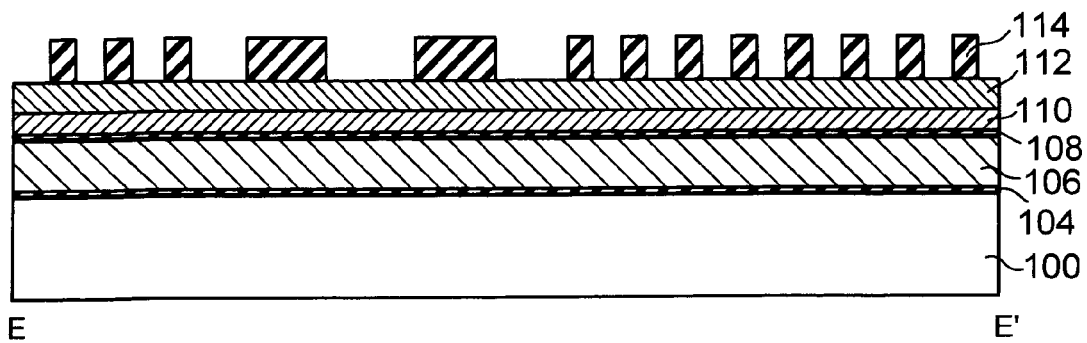
FIG. 26 is a process sectional view for explaining the manufacturing process of the nonvolatile semiconductor memory device according to the first embodiment.
Figure 27:
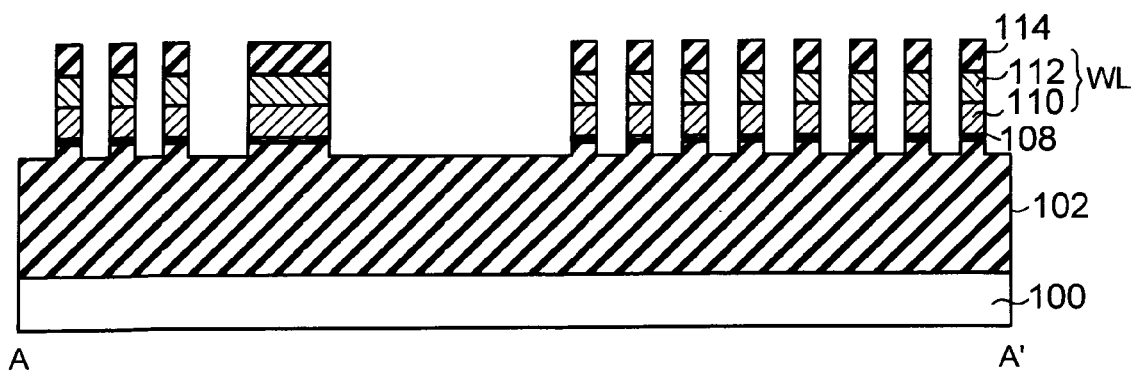
FIG. 27 is a process sectional view for explaining the manufacturing process of the nonvolatile semiconductor memory device according to the first embodiment.
Figure 28:
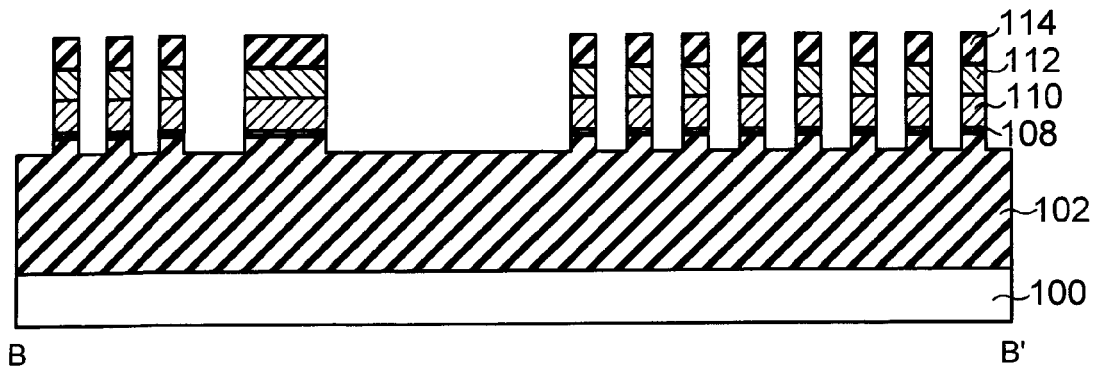
FIG. 28 is a process sectional view for explaining the manufacturing process of the nonvolatile semiconductor memory device according to the first embodiment.
Figure 29:
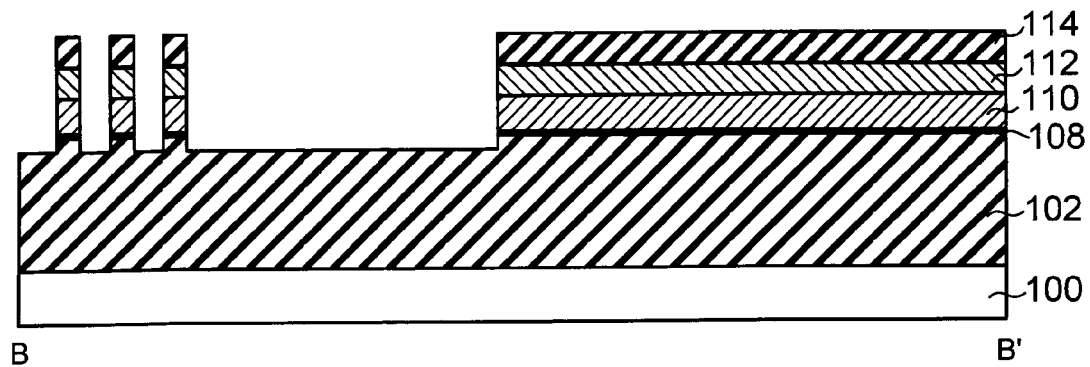
FIG. 29 is a process sectional view for explaining the manufacturing process of the nonvolatile semiconductor memory device according to the first embodiment.
Figure 30:
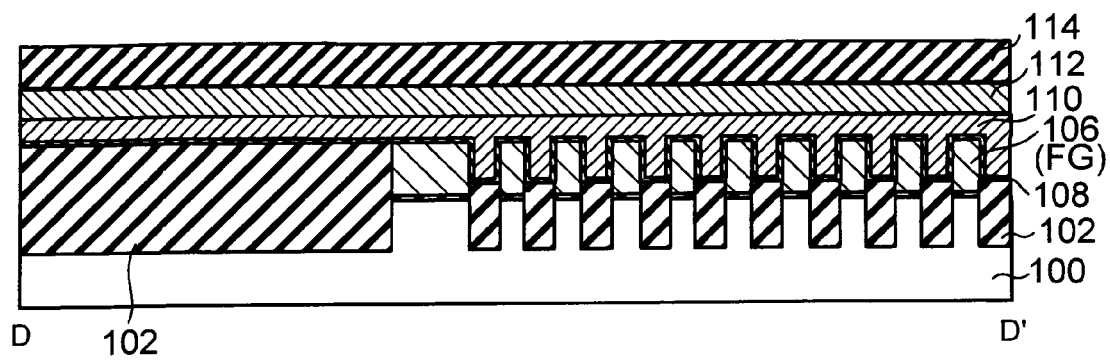
FIG. 30 is a process sectional view for explaining the manufacturing process of the nonvolatile semiconductor memory device according to the first embodiment.
Figure 31:
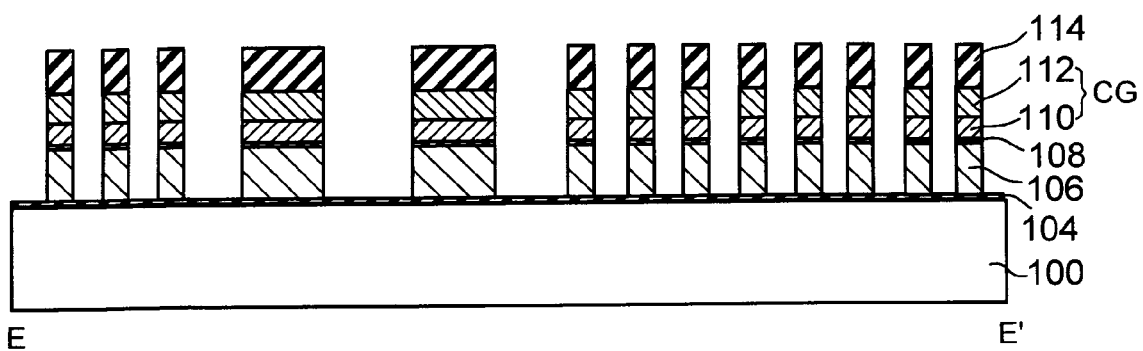
FIG. 31 is a process sectional view for explaining the manufacturing process of the nonvolatile semiconductor memory device according to the first embodiment.
Figure 32:
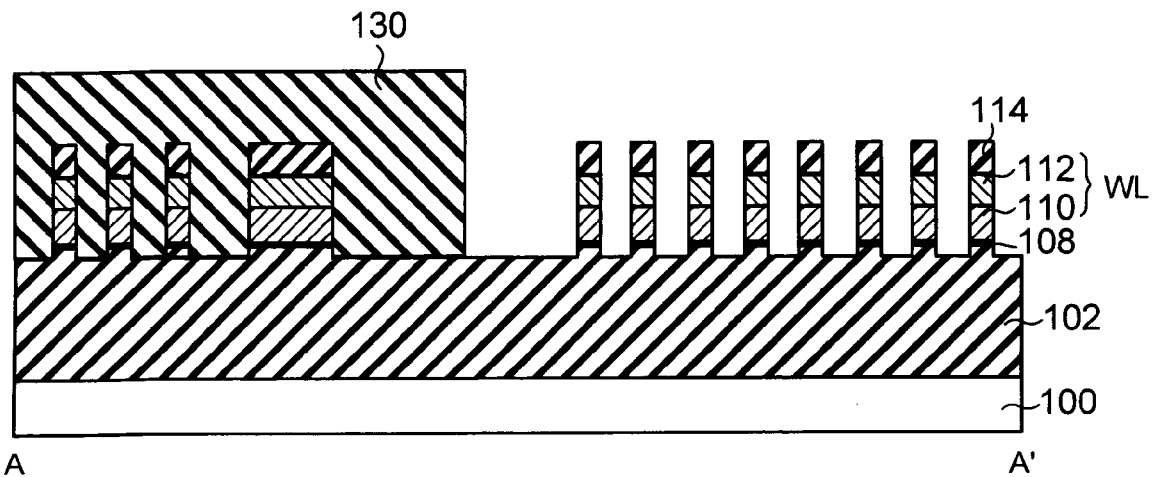
FIG. 32 is a process sectional view for explaining the manufacturing process of the nonvolatile semiconductor memory device according to the first embodiment.
Figure 33:
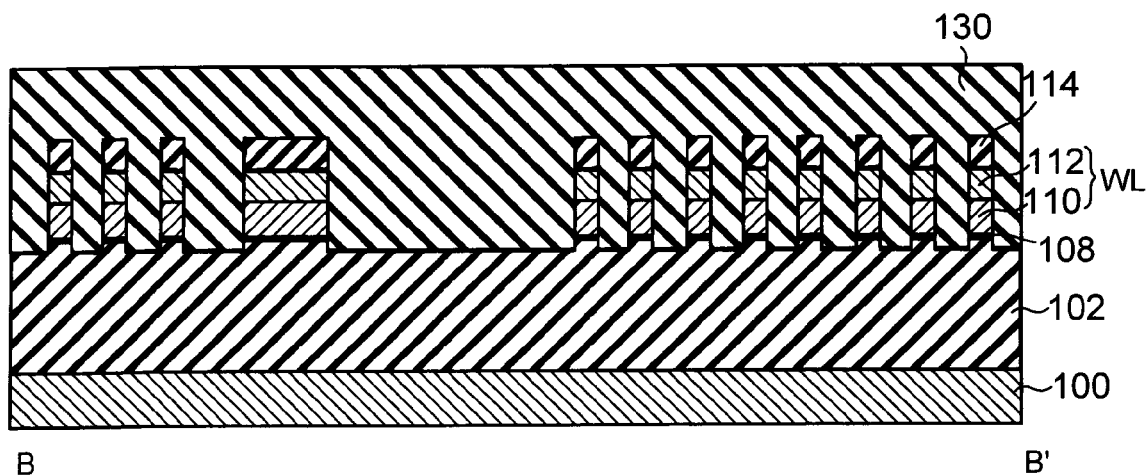
FIG. 33 is a process sectional view for explaining the manufacturing process of the nonvolatile semiconductor memory device according to the first embodiment.
Figure 34:
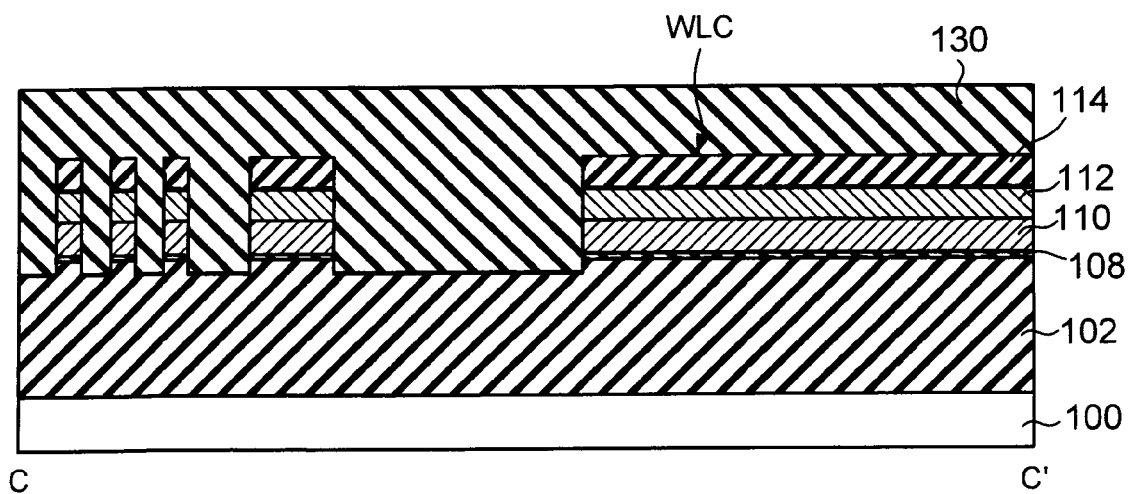
FIG. 34 is a process sectional view for explaining the manufacturing process of the nonvolatile semiconductor memory device according to the first embodiment.
Figure 35:
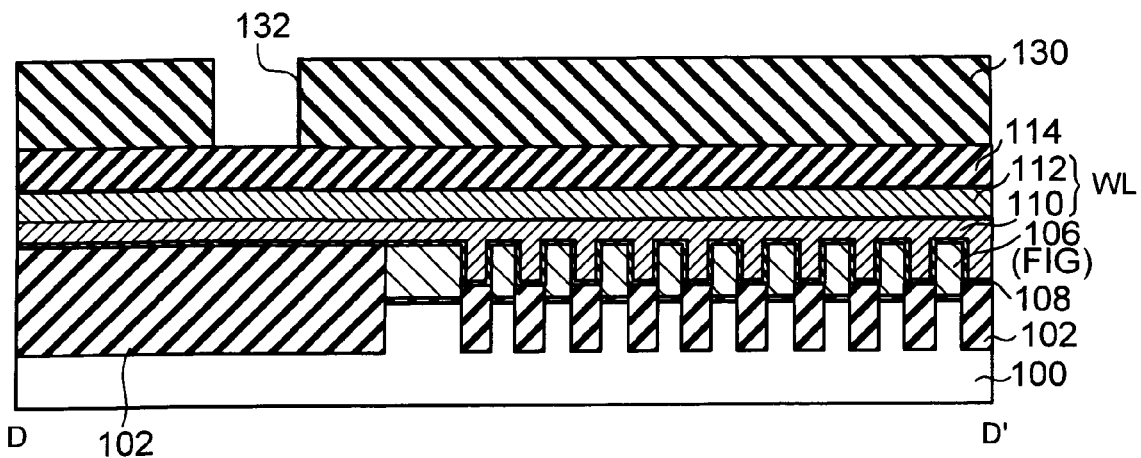
FIG. 35 is a process sectional view for explaining the manufacturing process of the nonvolatile semiconductor memory device according to the first embodiment.
Figure 36:
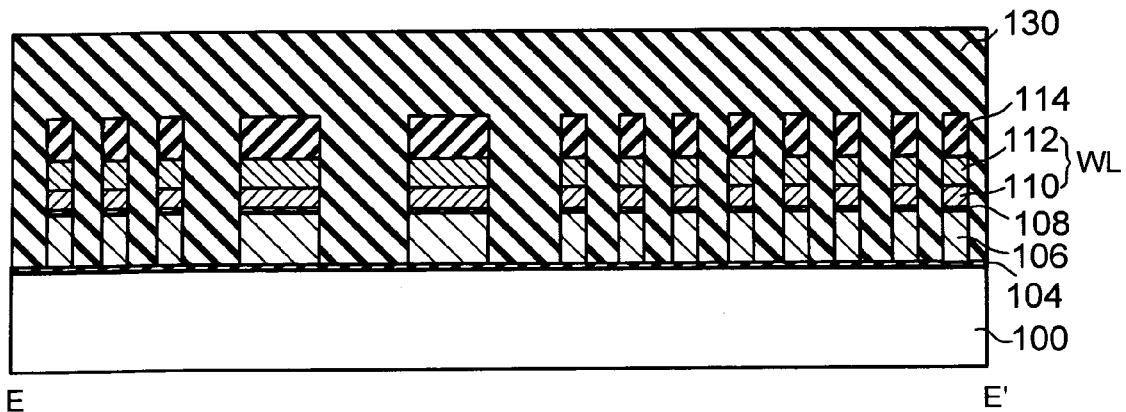
FIG. 36 is a process sectional view for explaining the manufacturing process of the nonvolatile semiconductor memory device according to the first embodiment.
Figure 37:
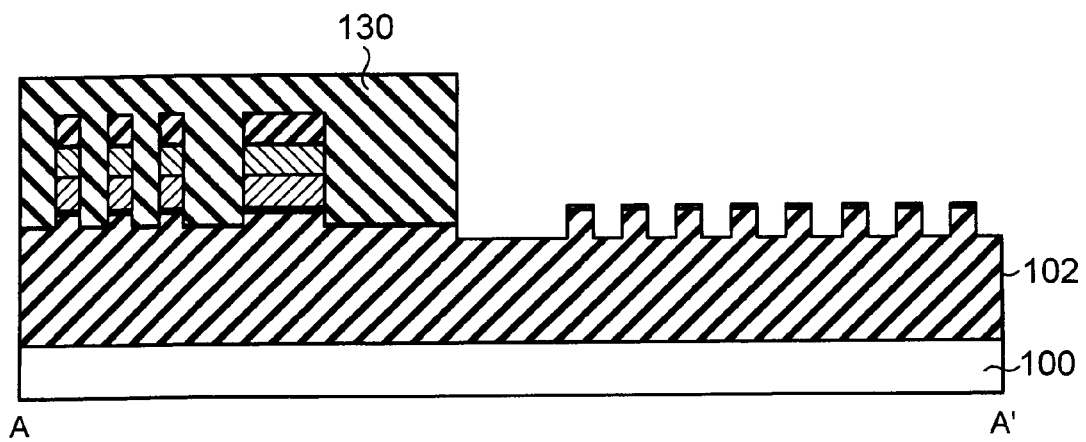
FIG. 37 is a process sectional view for explaining the manufacturing process of the nonvolatile semiconductor memory device according to the first embodiment.
Figure 38:
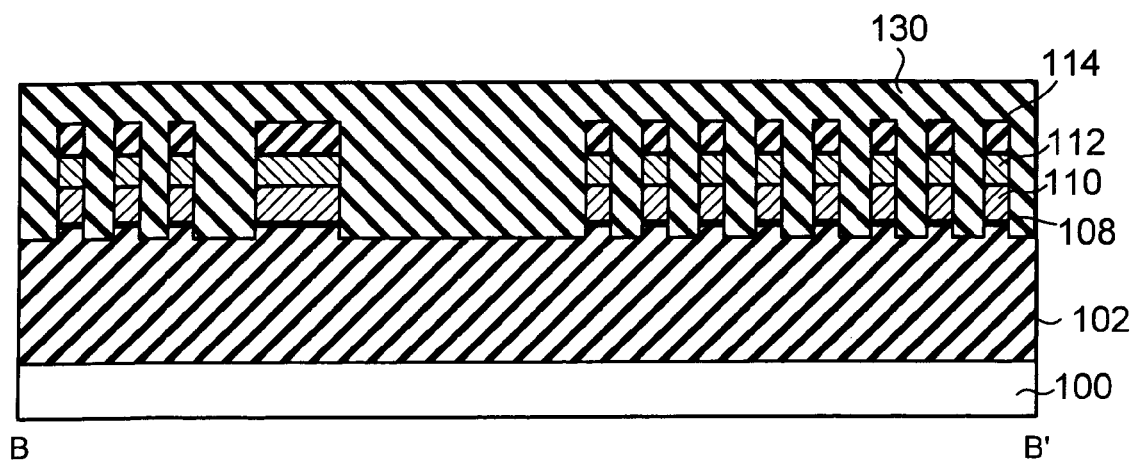
FIG. 38 is a process sectional view for explaining the manufacturing process of the nonvolatile semiconductor memory device according to the first embodiment.
Figure 39:
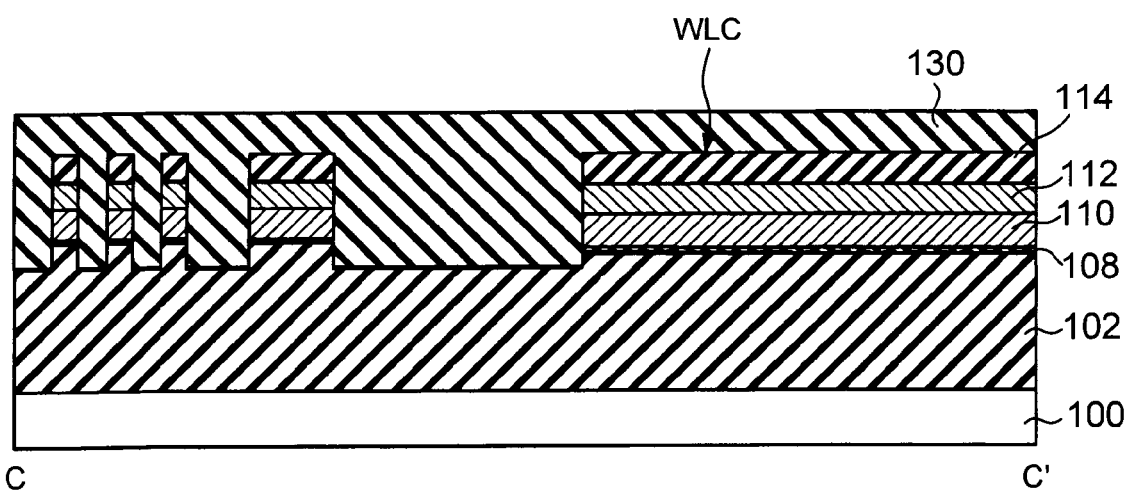
FIG. 39 is a process sectional view for explaining the manufacturing process of the nonvolatile semiconductor memory device according to the first embodiment.
Figure 40:
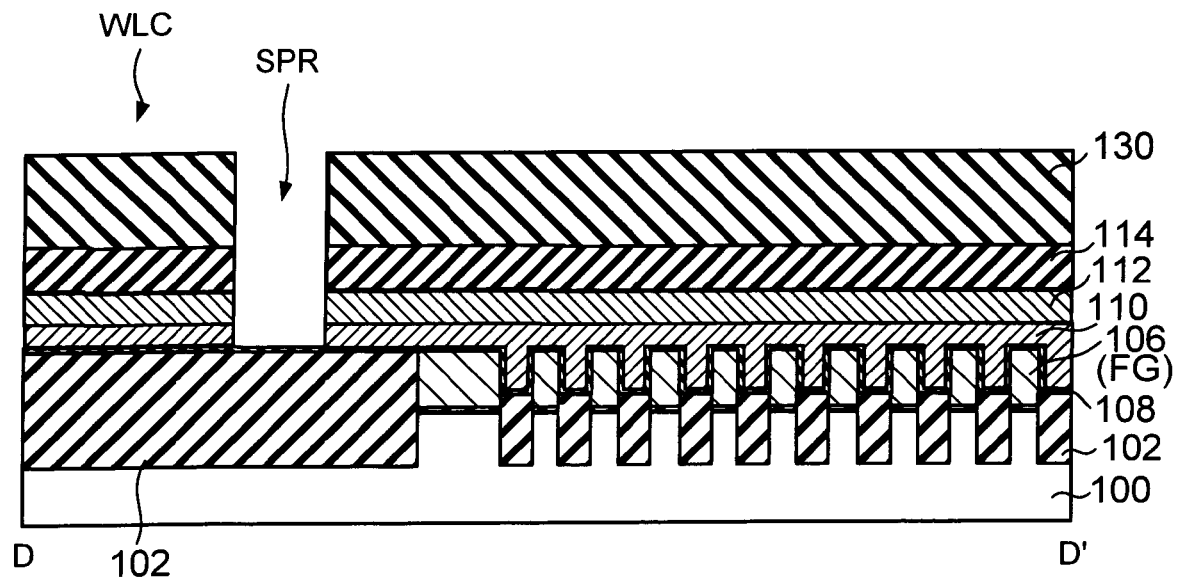
FIG. 40 is a process sectional view for explaining the manufacturing process of the nonvolatile semiconductor memory device according to the first embodiment.
Figure 41:
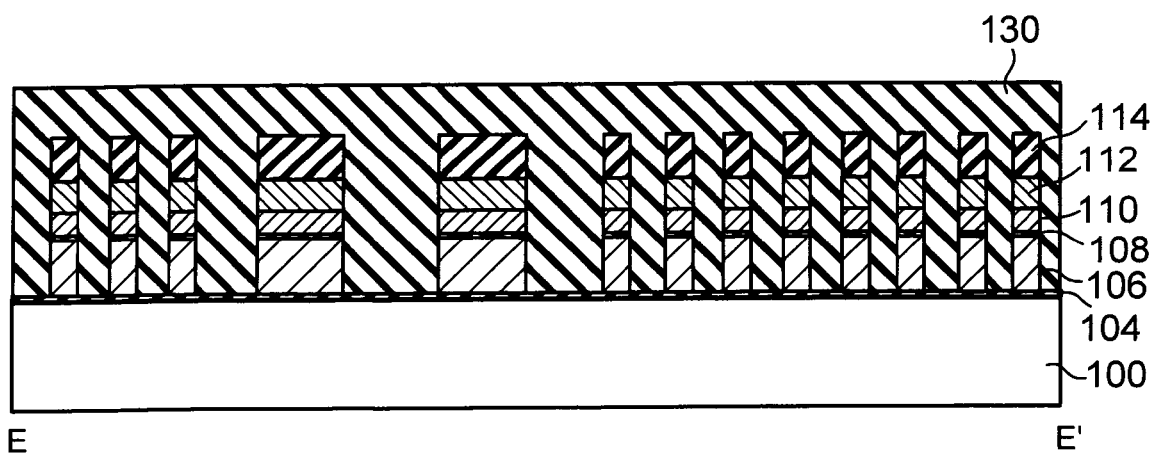
FIG. 41 is a process sectional view for explaining the manufacturing process of the nonvolatile semiconductor memory device according to the first embodiment.

First, the structure of a NAND-type nonvolatile semiconductor memory device according to this embodiment will be explained based on FIG. 1 to FIG. 6. FIG. 1 is a plan view of the nonvolatile semiconductor memory device according to this embodiment, and FIG. 2 to FIG. 6 are a sectional view taken along the line A-A', a sectional view taken along the line B-B', a sectional view taken along the line C-C', a sectional view taken along the line D-D', and a sectional view taken along the line E-E', respectively, of FIG. 1.

As can been seen from these figures, in the nonvolatile semiconductor memory device according to this embodiment, plural word lines WL are provided in parallel in a first direction. Beneath these word lines, plural memory cell regions ER are formed. Select gate lines SGL are provided in parallel with the word lines WL.

On one end side of the word lines WL, a word line connecting portion WLC is formed. The word line connecting portion WLC is formed to intentionally connect tip portions of the word lines WL.

A separation pattern region SPR is formed between this word line connecting portion WLC and the word lines WL. This separation pattern region SPR is formed to electrically separate the word line connection portion WLC and the word lines WL. After the word lines WL and the word line connecting portion WLC are formed, the separation pattern region SPR is formed by removing the word lines WL situated in the separation pattern region SPR.

Incidentally, the word lines WL correspond to plural linear patterns in this embodiment, and the word line connecting portion WLC corresponds to a connecting portion in this embodiment.

Other respects than those described above are the same as in the structure of a normal nonvolatile semiconductor memory device, and hence a detailed explanation thereof is omitted.

Next, a manufacturing process of the nonvolatile semiconductor memory device according to this embodiment will be explained based on FIG. 7 to FIG. 41. FIG. 7, FIG. 12, FIG. 17, FIG. 22, FIG. 27, FIG. 32, and FIG. 37 are sectional views taken along the line A-A' of FIG. 1 for explaining the manufacturing process, FIG. 8, FIG. 13, FIG. 18, FIG. 23, FIG. 28, FIG. 33, and FIG. 38 are sectional views taken along the line B-B' of FIG. 1 for explaining the manufacturing process, FIG. 9, FIG. 14, FIG. 19, FIG. 24, FIG. 29, FIG. 34, and FIG. 39 are sectional views taken along the line C-C' of FIG. 1 for explaining the manufacturing process, FIG. 10, FIG. 15, FIG. 20, FIG. 25, FIG. 30, FIG. 35, and FIG. 40 are sectional views taken along the line D-D' of FIG. 1 for explaining the manufacturing process, and FIG. 11, FIG. 16, FIG. 21, FIG. 26, FIG. 31, FIG. 36, and FIG. 41 are sectional views taken along the line E-E' of FIG. 1 for explaining the manufacturing process.

First, as shown in FIG. 7 to FIG. 11, an element separation insulating film 102 is formed by STI (Shallow Trench Isolation) on the surface side of a semiconductor substrate 100. Subsequently, a tunnel insulating film 104 is formed by a silicon oxide film or the like in a memory cell region where memory cells are formed. Thereafter, a polycrystalline silicon film 106 which becomes floating gates later is formed on the tunnel insulating film 104. Then, an ONO film 108 which becomes an interpoly insulating film is formed on the polycrystalline silicon film 106. Subsequently, a polycrystalline silicon film 110 and a tungsten silicide film 112 which become control gates later are formed on the ONO film 108. Subsequently, a silicon nitride film 114 which is used as a mask material is formed on the tungsten silicide film 112.

Next, as shown in FIG. 12 to FIG. 16, an antireflection film 120, for example, with a thickness of approximately 10 nm is formed on the silicon nitride film 114. Subsequently, a photoresist 122, for example, with a thickness of approximately 200 nm is formed on the antireflection film 120. Then, the photoresist 122 is patterned as desired by lithography technology. In this embodiment, the wiring width and space width of the pattern are approximately 90 nm.

In this embodiment, by patterning the photoresist 122 as just described, plural parallel patterns of word lines WL and a pattern of the word line connecting portion WLC which is provided on one end side of the word lines WL and connects the word lines WL are formed.

Then, as shown in FIG. 17 to FIG. 21, the antireflection film 120 and the silicon nitride film 114 are etched by RIE technology with the photoresist 122 as a mask.

Subsequently, as shown in FIG. 22 to FIG. 26, the antireflection film 120 and the photoresist 122 are removed using ashing technology.

Thereafter, as shown in FIG. 27 to FIG. 31, the tungsten silicide film 112, the polycrystalline silicon film 110, the ONO film 108, the polycrystalline silicon film 106 are etched with the silicon nitride film 114 as a mask to obtain a desired gate pattern. Namely, control gates CG which become word lines WL are formed by the tungsten silicide film 112 and the polycrystalline silicon film 110, and floating gates FG are formed by the polycrystalline silicon film 106. In particular, as can be seen from FIG. 30, on one end side of the word line WL, the word line connection portion WLC is formed, and plural word lines WL are connected to each other. This word line connecting portion WLC is also formed by the tungsten silicide film 112 and the polycrystalline silicon film 110. Accordingly, the tungsten silicide film 112 and the polycrystalline silicon film 110 correspond to a first member to be patterned which is formed by a conductive member.

Next, as shown in FIG. 32 to FIG. 36, after a photoresist 130, for example, with a thickness of 1000 nm is formed, this photoresist 130 is patterned as desired by the lithography technology. More specifically, particularly as can be seen from FIG. 35, an opening 132 is formed in a portion of the photoresist 130 where a separation pattern region SPR is positioned.

Then, as shown in FIG. 37 to FIG. 41, the silicon nitride film 114, the tungsten silicide film 112, and the polycrystalline silicon film 110 are etched by the RIE technology with the photoresist 130 as a mask. As a result, the separation pattern region SPR is formed, and thereby the word line connecting portion WLC is electrically separated from the word lines WL. Thereafter, the photoresist 130 is removed using the ashing technology. Consequently, the nonvolatile semiconductor memory device shown in FIG. 2 to FIG. 6 is obtained.

As described above, according to the nonvolatile semiconductor memory device of this embodiment, by providing the word line connecting portion WLC on one end side of the word lines WL, it becomes possible that when the word lines WL are formed by etching with the silicon nitride film 114 as a mask, a portion such as a tip of the word line WL where resist pattern collapse tends to occur does not exist. Accordingly, a margin for patterning improves, which makes it possible to provide the stable high-yield nonvolatile semiconductor memory device.

Second Embodiment

In the second embodiment, by forming a memory cell region connecting portion which connects respective memory cell regions in end portions of a memory cell array and element separation regions, the occurrence of resist pattern collapse when the memory cell regions are formed is prevented. Further details will be given below.

Figure 43:
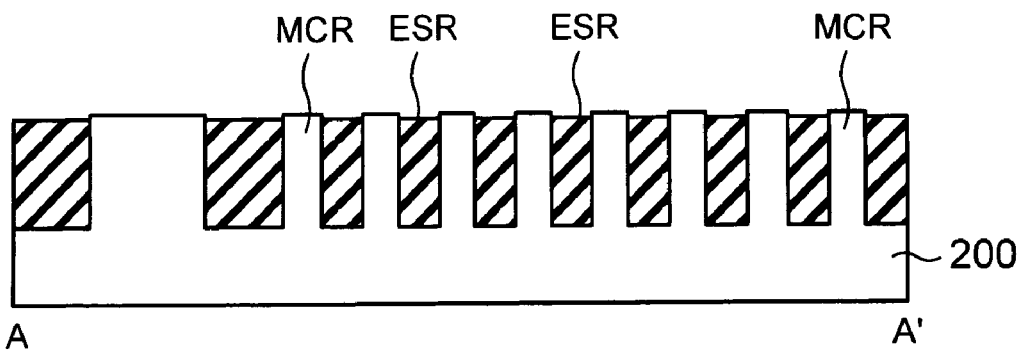
FIG. 43 is a sectional view taken along the line A-A' of FIG. 42 showing the structure of the nonvolatile semiconductor memory device according to the second embodiment.
Figure 44:
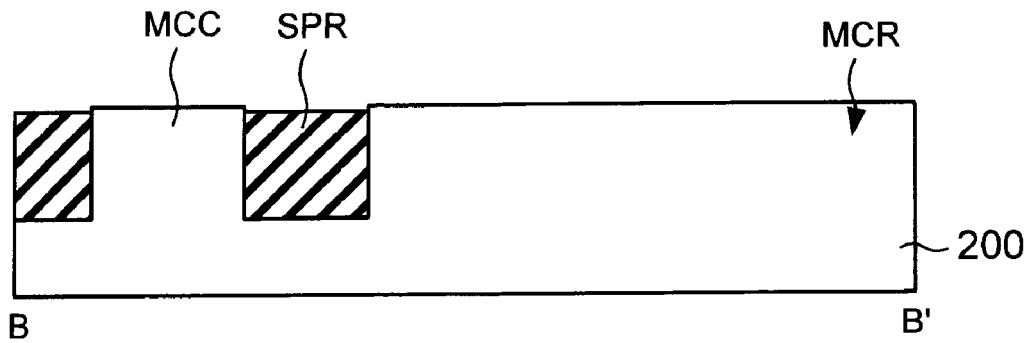
FIG. 44 is a sectional view taken along the line B-B' of FIG. 42 showing the structure of the nonvolatile semiconductor memory device according to the second embodiment.
Figure 45:
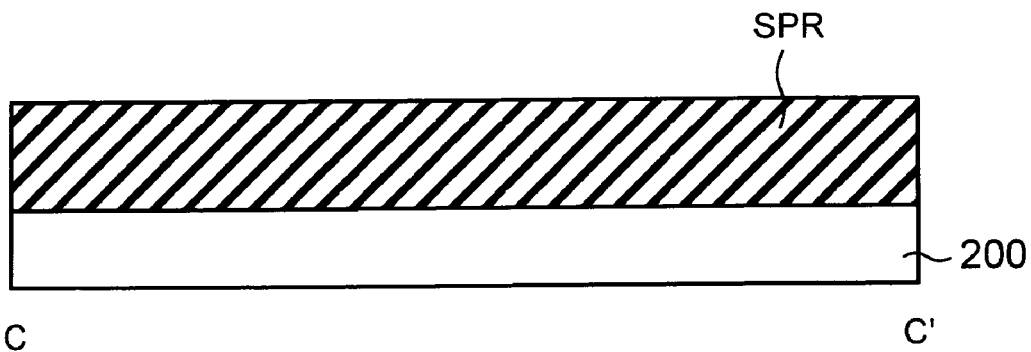
FIG. 45 is a sectional view taken along the line C-C' of FIG. 42 showing the structure of the nonvolatile semiconductor memory device according to the second embodiment.

First, the structure of a NAND-type nonvolatile semiconductor memory device according to this embodiment will be explained based on FIG. 42 to FIG. 45. FIG. 42 is a plan view of the nonvolatile semiconductor memory device according to this embodiment, and FIG. 43 to FIG. 45 are a sectional view taken along the line A-A', a sectional view taken along the line B-B', and a sectional view taken along the line C-C', respectively, of FIG. 42.

As can been seen from these figures, in the nonvolatile semiconductor memory device according to this embodiment, plural memory cell regions MCR are formed in parallel along a second direction which is a direction crossing word lines. In other words, the memory cell regions MCR and element separation regions ESR are formed alternately in a striped pattern along the second direction.

On one end side of the memory cell regions MCR, a memory cell region connecting portion MCC which connects respective memory cell regions MCR is formed. This memory cell region connecting portion MCC is formed to prevent the occurrence of resist collapse when a mask to form trenches for the element separation regions ESR in a semiconductor substrate 200 is patterned with a photoresist.

Moreover, the separation pattern region SPR which electrically separates these memory cell region connecting portion MCC and memory cell regions MCR is formed between the memory cell region connecting portion MCC and the memory cell regions MCR. Other respects than those described above are the same as in the structure of the normal nonvolatile semiconductor memory device, and hence a detailed explanation thereof is omitted.

Incidentally, the memory cell regions MCR correspond to plural linear patterns in this embodiment, and the memory cell region connecting portion MCC corresponds to a connecting portion which connects the plural linear patterns in this embodiment.

Next, a manufacturing process of the nonvolatile semiconductor memory device according to this embodiment will be explained based on FIG. 46 to FIG. 78. FIG. 46, FIG. 49, FIG. 52, FIG. 55, FIG. 58, FIG. 61, FIG. 64, FIG. 67, FIG. 70, FIG. 73, and FIG. 76 are sectional views taken along the line A-A' of FIG. 42 for explaining the manufacturing process, FIG. 47, FIG. 50, FIG. 53, FIG. 56, FIG. 59, FIG. 62, FIG. 65, FIG. 68, FIG. 71, FIG. 74, and FIG. 77 are sectional views taken along the line B-B' of FIG. 42 for explaining the manufacturing process, and FIG. 48, FIG. 51, FIG. 54, FIG. 57, FIG. 60, FIG. 63, FIG. 66, FIG. 69, FIG. 72, FIG. 75 and FIG. 78 are sectional views taken along the line C-C' of FIG. 42 for explaining the manufacturing process.

Figure 46:
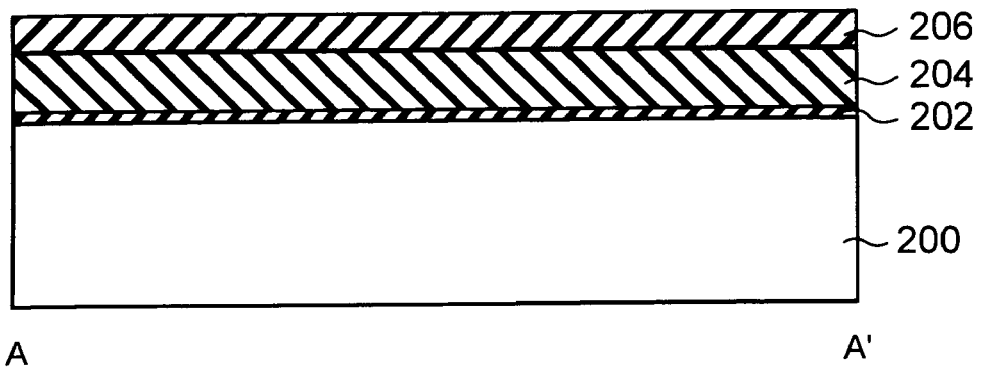
FIG. 46 is a process sectional view for explaining a manufacturing process of the nonvolatile semiconductor memory device according to the second embodiment.
Figure 47:
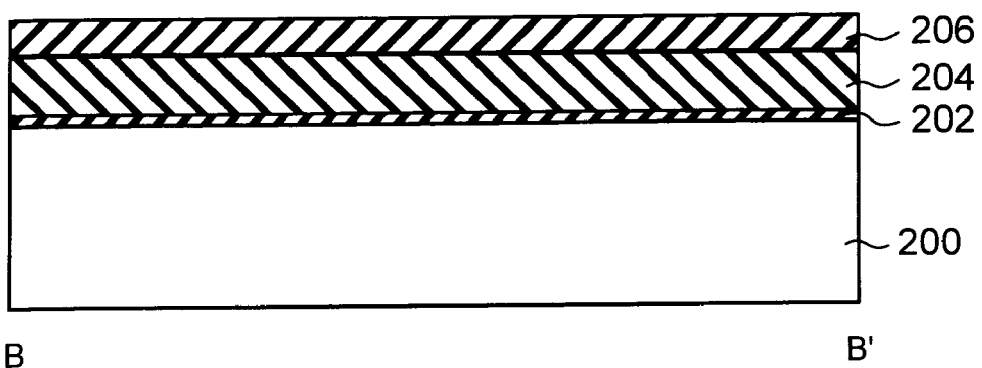
FIG. 47 is a process sectional view for explaining the manufacturing process of the nonvolatile semiconductor memory device according to the second embodiment.
Figure 48:
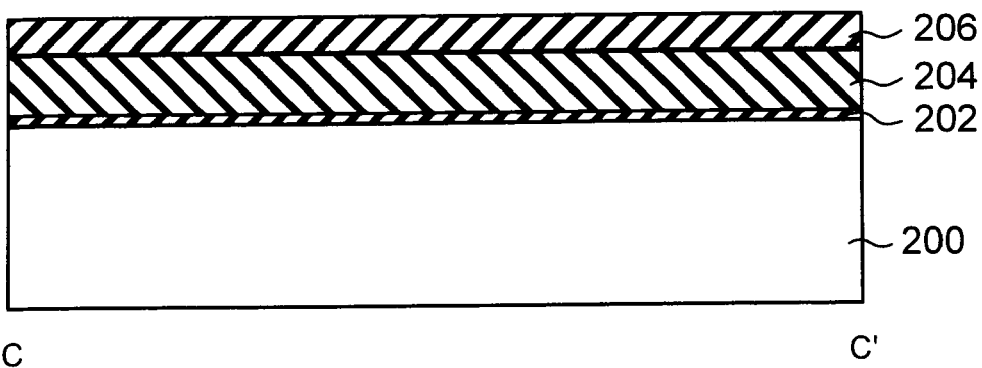
FIG. 48 is a process sectional view for explaining the manufacturing process of the nonvolatile semiconductor memory device according to the second embodiment.

First, as shown in FIG. 46 to FIG. 48, on the surface side of a semiconductor substrate 200, a silicon oxide film 202 is formed, and a silicon nitride film 204 is formed on the silicon oxide film 202. Subsequently, a silicon oxide film 206 is formed on the silicon nitride film 204. These silicon oxide film 202, silicon nitride film 204, and silicon oxide film 206 serve as a mask member later.

Figure 49:
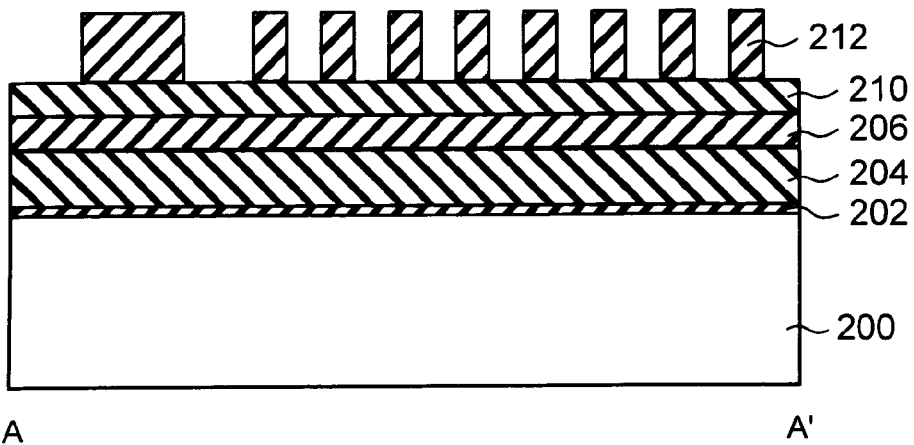
FIG. 49 is a process sectional view for explaining the manufacturing process of the nonvolatile semiconductor memory device according to the second embodiment.
Figure 50:
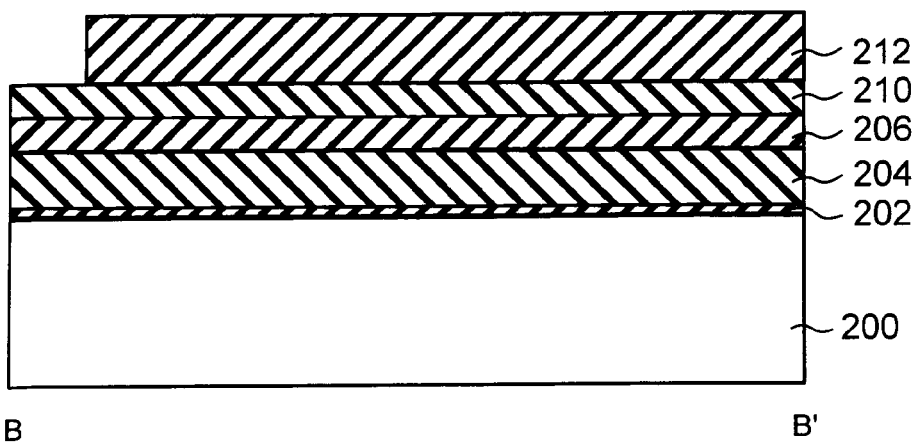
FIG. 50 is a process sectional view for explaining the manufacturing process of the nonvolatile semiconductor memory device according to the second embodiment.
Figure 51:
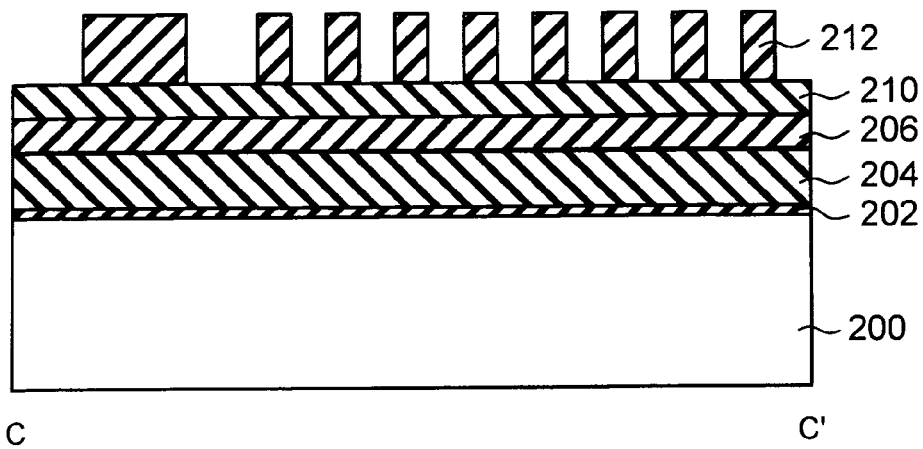
FIG. 51 is a process sectional view for explaining the manufacturing process of the nonvolatile semiconductor memory device according to the second embodiment.

Next, as shown in FIG. 49 to FIG. 51, an antireflection film 210, for example, with a thickness of 10 nm is formed on the silicon oxide film 206, and a photoresist 212, for example, with a thickness of 200 nm is formed on the antireflection film 210. Subsequently, the photoresist 212 is patterned as desired by the lithography technology. In this embodiment, the wiring width and space width of the pattern are approximately 90 nm.

By this patterning, linear patterns to form the element separation regions ESR and the memory cell regions MCR and a pattern to form the memory cell region connecting portion MCC are formed in the photoresist 212.

Figure 52:
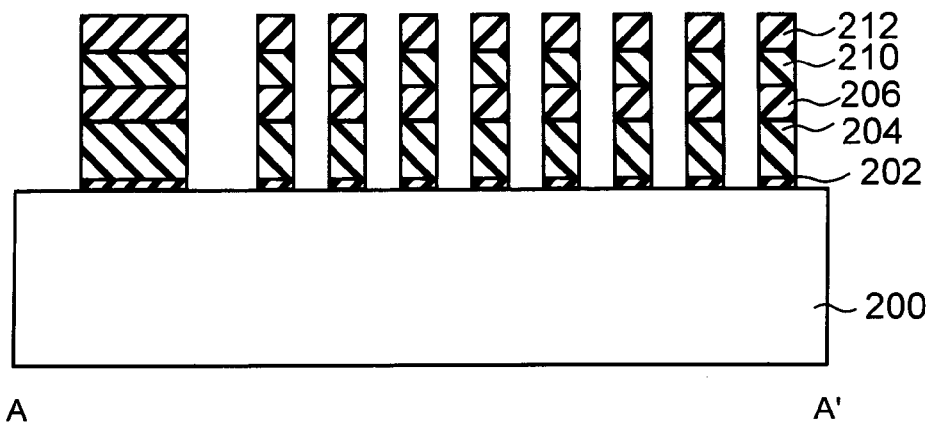
FIG. 52 is a process sectional view for explaining the manufacturing process of the nonvolatile semiconductor memory device according to the second embodiment.
Figure 53:
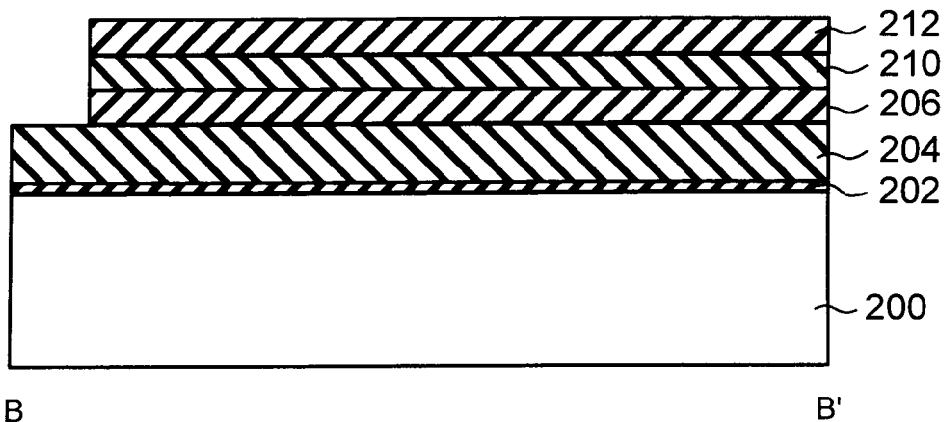
FIG. 53 is a process sectional view for explaining the manufacturing process of the nonvolatile semiconductor memory device according to the second embodiment.
Figure 54:
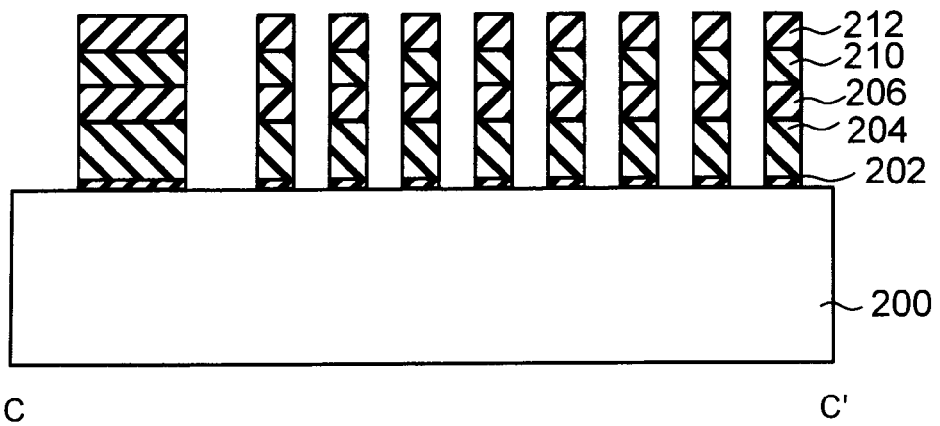
FIG. 54 is a process sectional view for explaining the manufacturing process of the nonvolatile semiconductor memory device according to the second embodiment.

Then, as shown in FIG. 52 to FIG. 54, the antireflection film 210, the silicon oxide film 206, the silicon nitride film 204, and the silicon oxide film 202 are etched by the RIE technology with the photoresist 212 as a mask.

Figure 55:
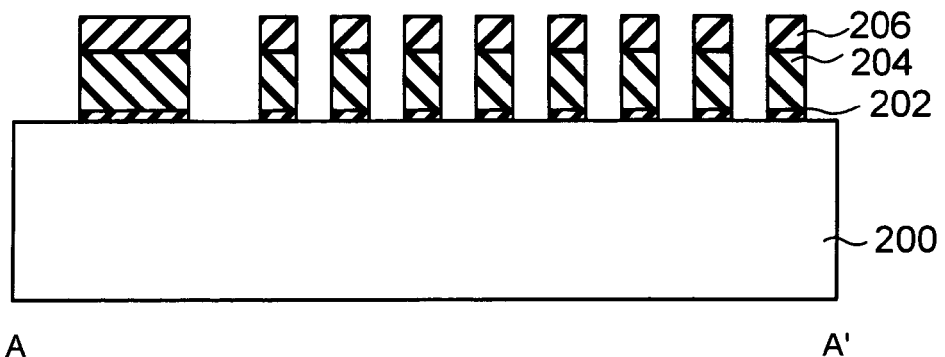
FIG. 55 is a process sectional view for explaining the manufacturing process of the nonvolatile semiconductor memory device according to the second embodiment.
Figure 56:
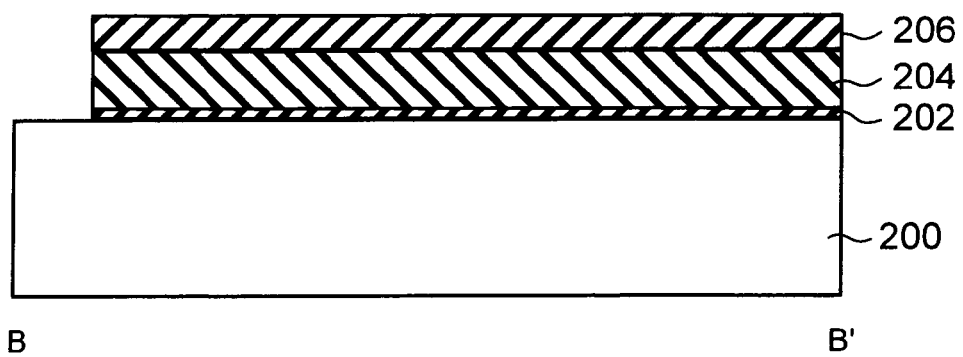
FIG. 56 is a process sectional view for explaining the manufacturing process of the nonvolatile semiconductor memory device according to the second embodiment.
Figure 57:
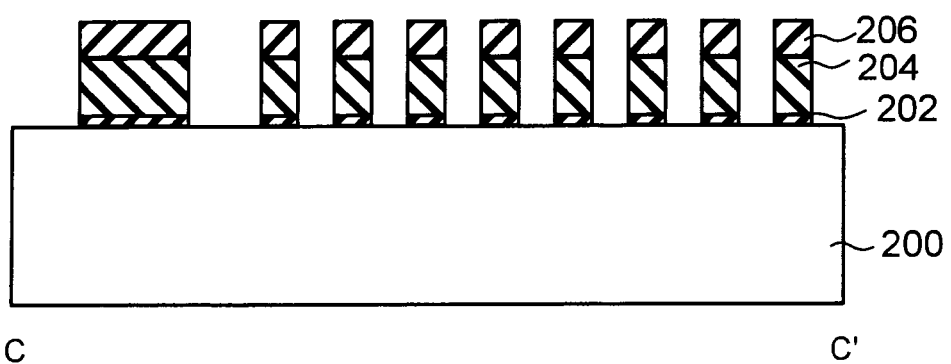
FIG. 57 is a process sectional view for explaining the manufacturing process of the nonvolatile semiconductor memory device according to the second embodiment.

Subsequently, as shown in FIG. 55 to FIG. 57, the antireflection film 210 and the photoresist 212 are removed using the ashing technology.

Figure 58:
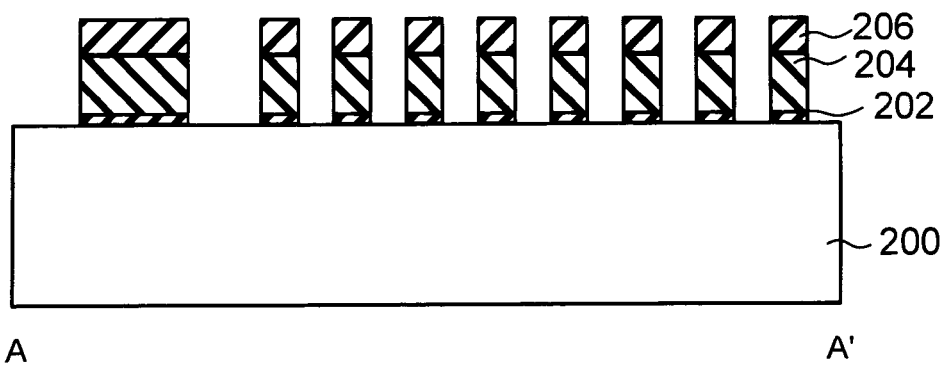
FIG. 58 is a process sectional view for explaining the manufacturing process of the nonvolatile semiconductor memory device according to the second embodiment.
Figure 60:
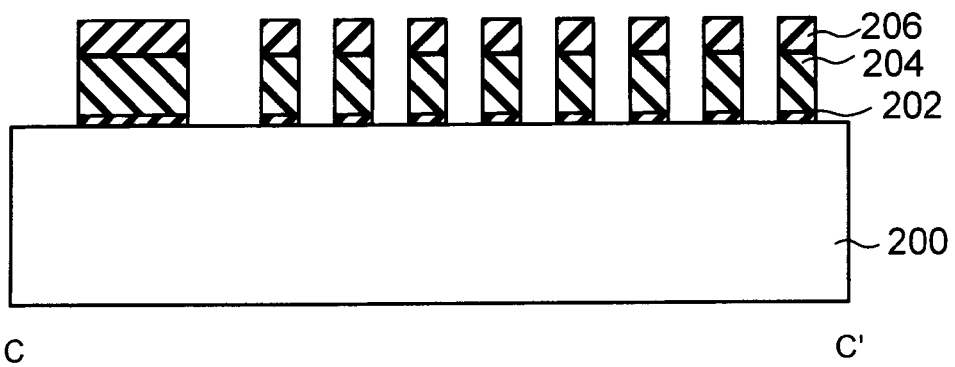
FIG. 60 is a process sectional view for explaining the manufacturing process of the nonvolatile semiconductor memory device according to the second embodiment.

Thereafter, as shown in FIG. 58 to FIG. 60, after a photoresist 220 is formed on this nonvolatile semiconductor memory device, the photoresist 220 is patterned as desired by the lithography technology. Thereby, an opening 222 is formed in a region corresponding to the separation pattern region SPR in the photoresist 220.

Figure 61:
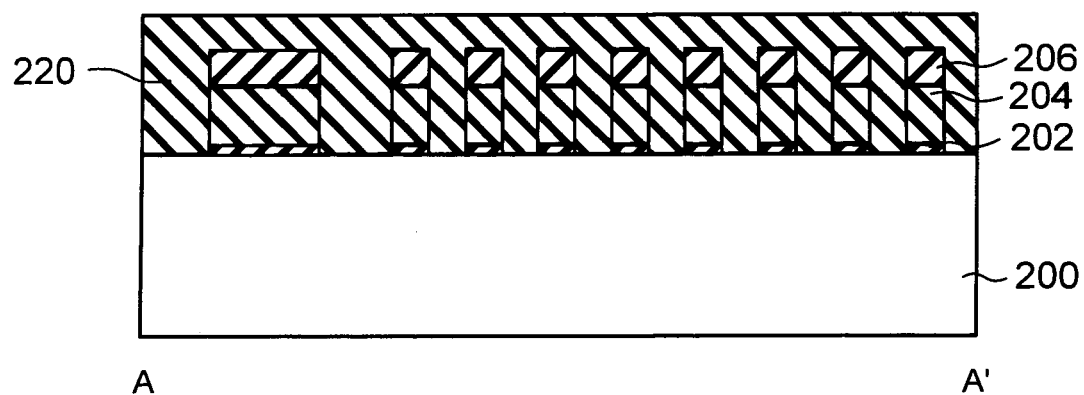
FIG. 61 is a process sectional view for explaining the manufacturing process of the nonvolatile semiconductor memory device according to the second embodiment.
Figure 63:
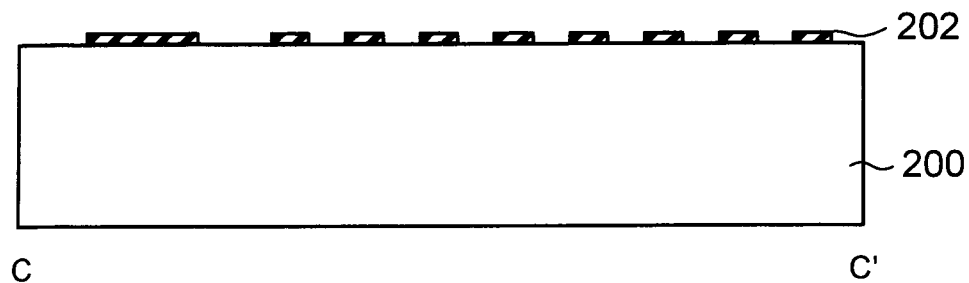
FIG. 63 is a process sectional view for explaining the manufacturing process of the nonvolatile semiconductor memory device according to the second embodiment.

Next, as shown in FIG. 61 to FIG. 63, the silicon oxide film 206, the silicon nitride film 204, and the silicon oxide film 202 are etched using the RIE technology with the photoresist 220 as a mask to thereby form an opening 224 to form the separation pattern region SPR which electrically separates the memory cell regions MCR and the memory cell region connecting portion MCC.

Figure 64:
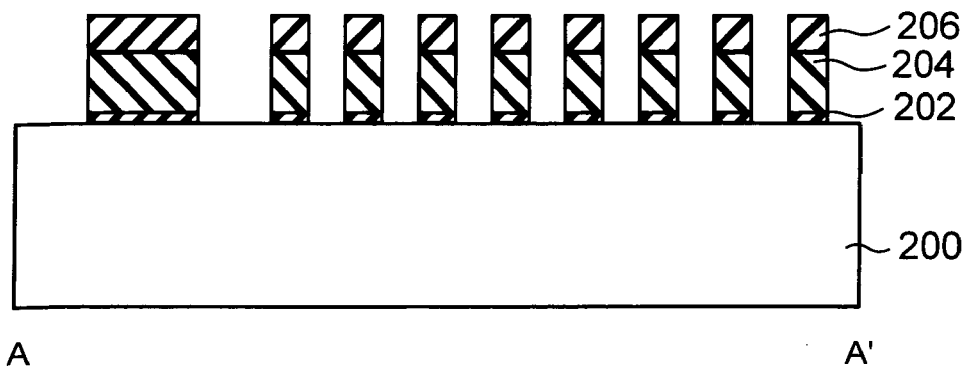
FIG. 64 is a process sectional view for explaining the manufacturing process of the nonvolatile semiconductor memory device according to the second embodiment.
Figure 66:
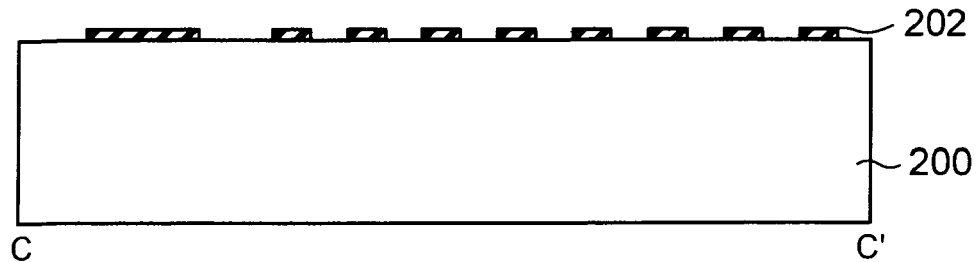
FIG. 66 is a process sectional view for explaining the manufacturing process of the nonvolatile semiconductor memory device according to the second embodiment.

Then, as shown in FIG. 64 to FIG. 66, the photoresist 220 is removed using the ashing technology.

Figure 67:
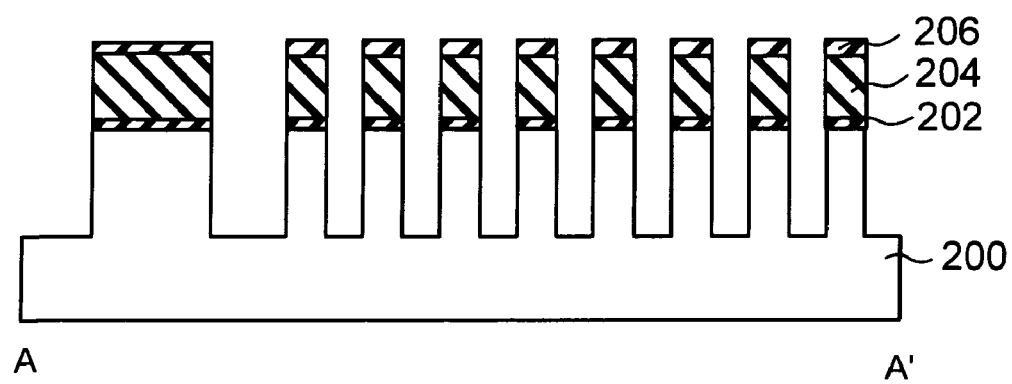
FIG. 67 is a process sectional view for explaining the manufacturing process of the nonvolatile semiconductor memory device according to the second embodiment.
Figure 69:
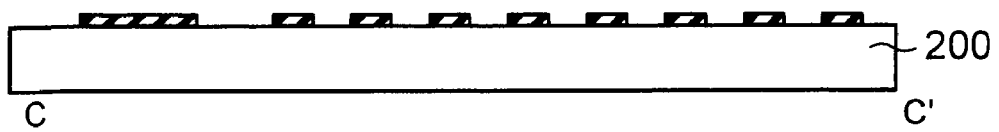
FIG. 69 is a process sectional view for explaining the manufacturing process of the nonvolatile semiconductor memory device according to the second embodiment.

Subsequently, as shown in FIG. 67 to FIG. 69, the semiconductor substrate 200 is etched by the RIE technology with the silicon oxide film 206 as a mask, and thereby trenches which become the element separation regions ESR and a trench which becomes the separation pattern region SPR are formed in the semiconductor substrate 200. Accordingly, the semiconductor substrate 200 corresponds to a second member to be patterned in this embodiment.

Figure 70:
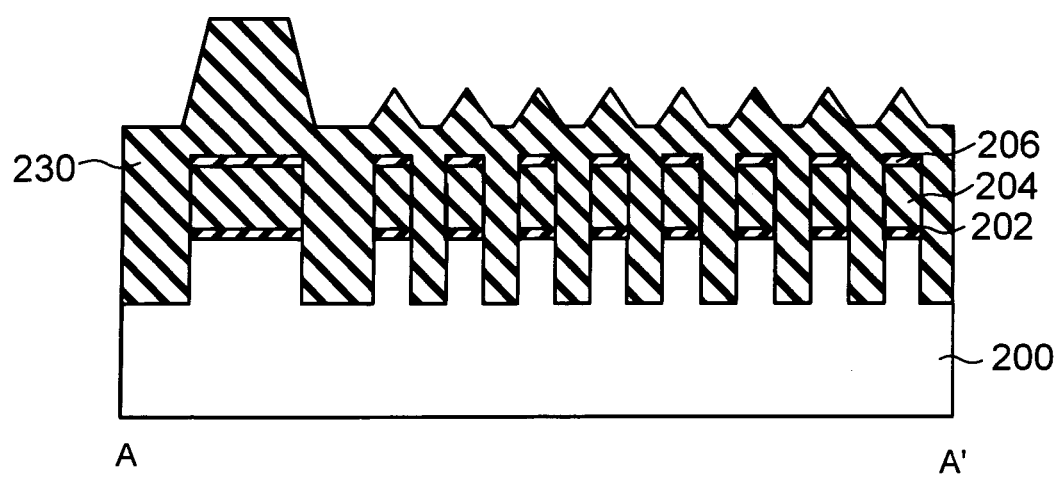
FIG. 70 is a process sectional view for explaining the manufacturing process of the nonvolatile semiconductor memory device according to the second embodiment.
Figure 71:
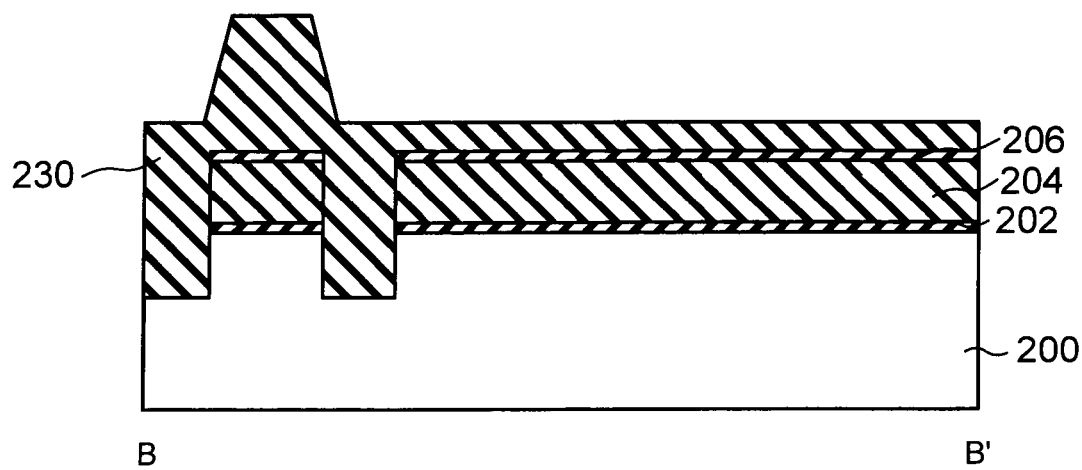
FIG. 71 is a process sectional view for explaining the manufacturing process of the nonvolatile semiconductor memory device according to the second embodiment.
Figure 72:
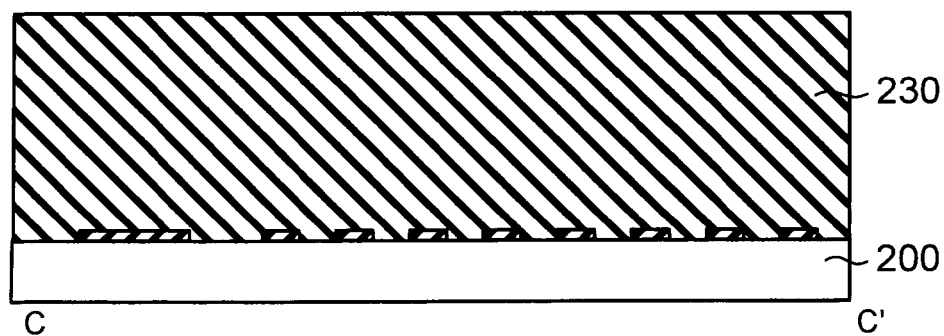
FIG. 72 is a process sectional view for explaining the manufacturing process of the nonvolatile semiconductor memory device according to the second embodiment.

Thereafter, as shown in FIG. 70 to FIG. 72, an element separation insulating film 230 such as a silicon oxide film or the like is formed using HDP technology. Consequently, the element separation insulating film 230 is embedded in the trenches which become the element separation regions ESR and the trench which becomes the separation pattern region SPR.

Figure 73:
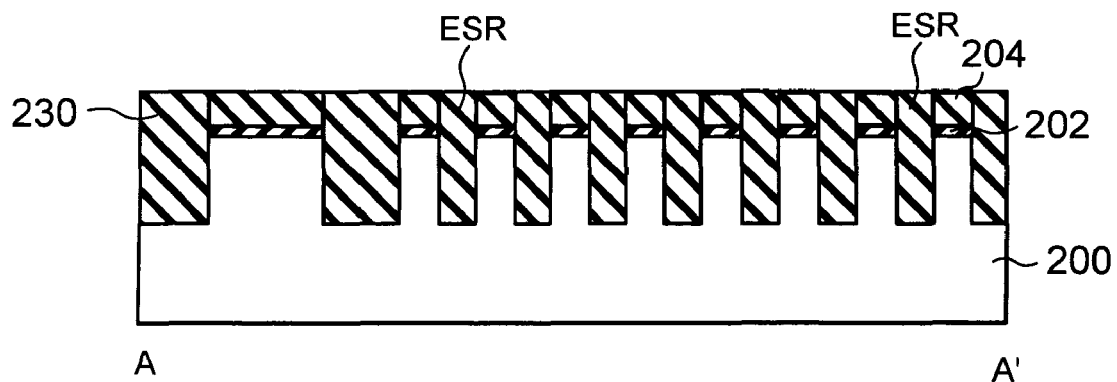
FIG. 73 is a process sectional view for explaining the manufacturing process of the nonvolatile semiconductor memory device according to the second embodiment.
Figure 74:
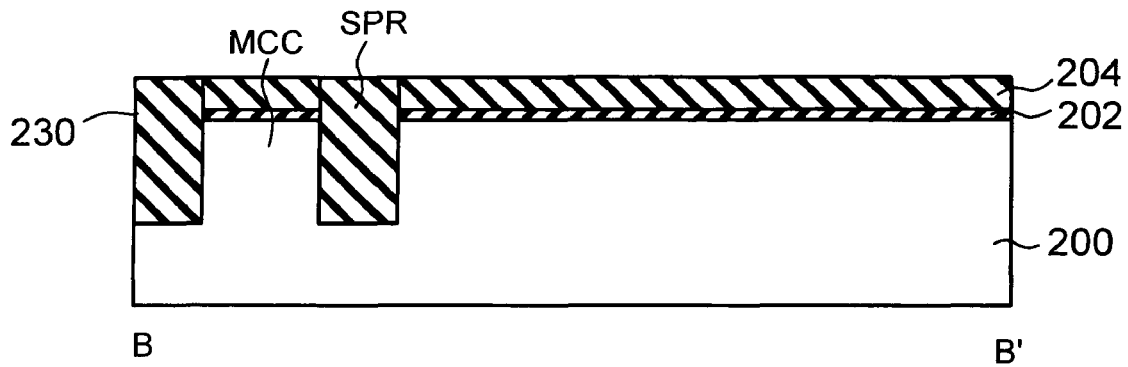
FIG. 74 is a process sectional view for explaining the manufacturing process of the nonvolatile semiconductor memory device according to the second embodiment.
Figure 75:
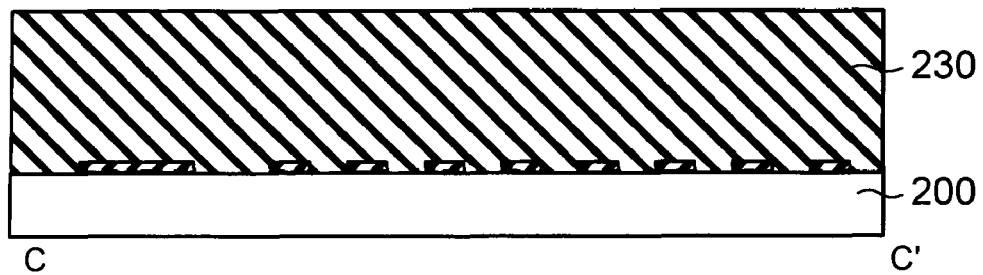
FIG. 75 is a process sectional view for explaining the manufacturing process of the nonvolatile semiconductor memory device according to the second embodiment.

Next, as shown in FIG. 73 to FIG. 75, the element separation insulating film 230 is planarized using CMP technology with the silicon nitride film 204 as a stopper.

Figure 76:
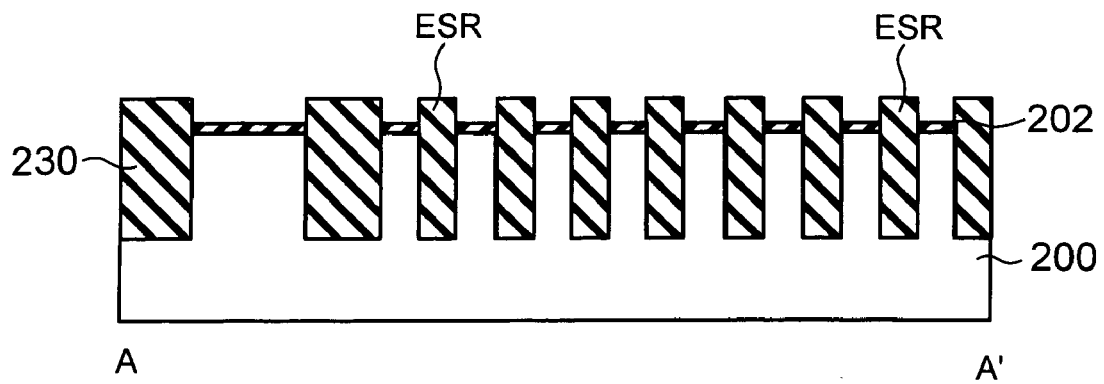
FIG. 76 is a process sectional view for explaining the manufacturing process of the nonvolatile semiconductor memory device according to the second embodiment.
Figure 77:
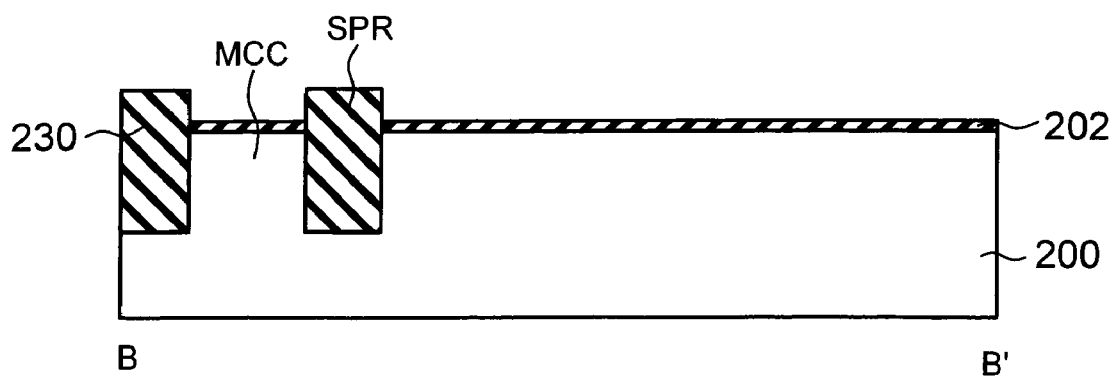
FIG. 77 is a process sectional view for explaining the manufacturing process of the nonvolatile semiconductor memory device according to the second embodiment.
Figure 78:
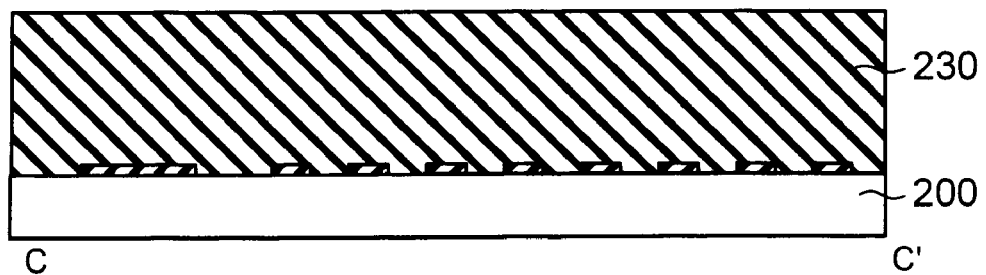
FIG. 78 is a process sectional view for explaining the manufacturing process of the nonvolatile semiconductor memory device according to the second embodiment.

Then, as shown in FIG. 76 to FIG. 78, the silicon nitride film 204 is removed by phosphoric acid treatment. Subsequently, the silicon oxide film 202 is removed by hydrofluoric acid treatment. Consequently, the element separation regions of the nonvolatile semiconductor memory device shown in FIG. 42 to FIG. 45 are obtained.

As described above, according to the nonvolatile semiconductor memory device of this embodiment, by providing the memory cell regions with the memory cell region connecting portion MCC, it becomes possible that in the step of patterning the mask to form the memory cell regions MCR (See FIG. 49 to FIG. 51), a portion where resist pattern collapse tends to occur does not exist in the resist pattern 212. Accordingly, a margin for patterning improves, which makes it possible to provide the stable high-yield nonvolatile semiconductor memory device.

Third Embodiment

In the third embodiment, by forming a bit line connecting portion on one end side of bit lines being a metal wiring layer in a memory cell array region, the occurrence of resist pattern collapse when the bit lines are formed is prevented. Further details will be given below.

Figure 80:
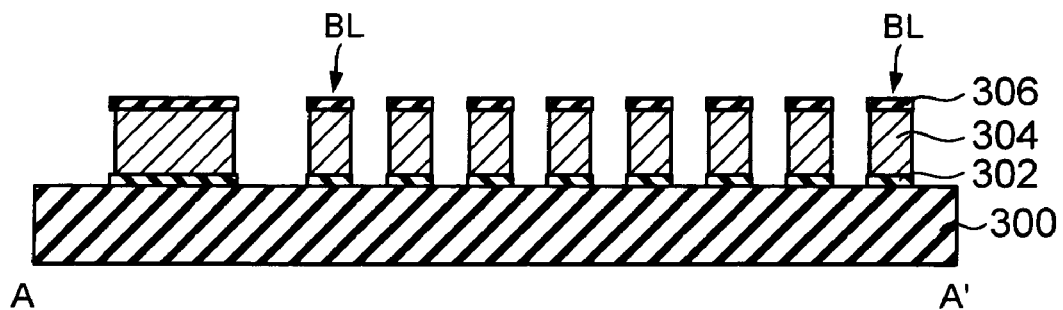
FIG. 80 is a sectional view taken along the line A-A' of FIG. 79 showing the structure of the nonvolatile semiconductor memory device according to the third embodiment.
Figure 81:
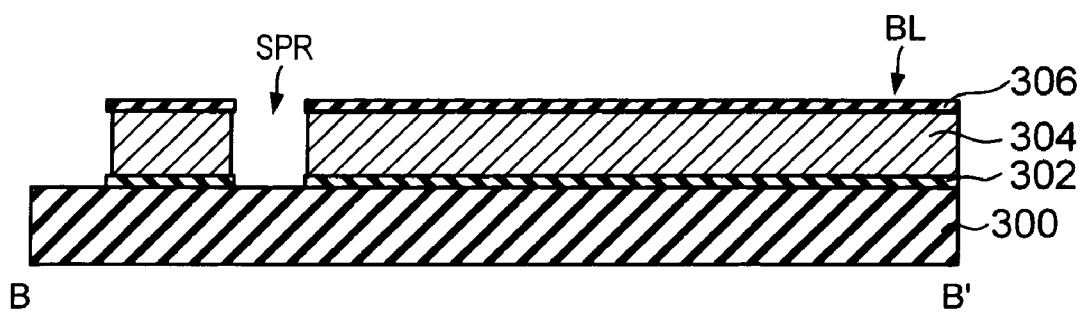
FIG. 81 is a sectional view taken along the line B-B' of FIG. 79 showing the structure of the nonvolatile semiconductor memory device according to the third embodiment.
Figure 82:
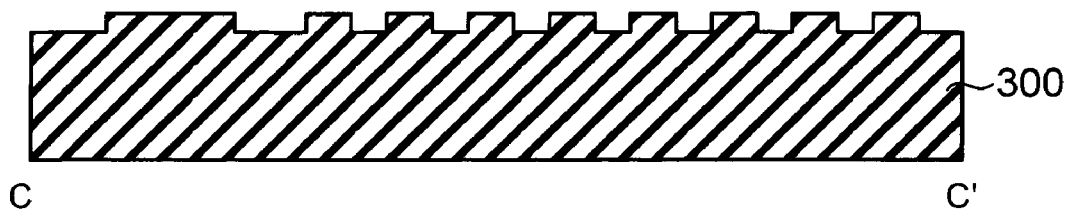
FIG. 82 is a sectional view taken along the line C-C' of FIG. 79 showing the structure of the nonvolatile semiconductor memory device according to the third embodiment.

First, the structure of a NAND-type nonvolatile semiconductor memory device according to this embodiment will be explained based on FIG. 79 to FIG. 82. FIG. 79 is a plan view of the nonvolatile semiconductor memory device according to this embodiment, and FIG. 80 to FIG. 82 are a sectional view taken along the line A-A', a sectional view taken along the line B-B', and a sectional view taken along the line C-C', respectively, of FIG. 79.

As can been seen from these figures, in the nonvolatile semiconductor memory device according to this embodiment, plural bit line BL are formed in parallel in the second direction which is a direction crossing the word lines WL. At end portions of these bit lines BL, a bit line connecting portion BLC which connects respective bit lines BL is formed. The separation pattern region SPR which electrically separates these bit line connecting portion BLC and bit lines BL is formed between the bit line connecting portion BLC and the bit lines BL. Other respects than those described above are the same as in the structure of the normal nonvolatile semiconductor memory device, and hence a detailed explanation thereof is omitted.

Incidentally, the bit lines BL correspond to plural linear patterns in this embodiment, and the bit line connecting portion BLC corresponds to a connecting portion which connects the plural linear patterns in this embodiment.

Next, a manufacturing process of the nonvolatile semiconductor memory device according to this embodiment will be explained based on FIG. 83 to FIG. 100. FIG. 83, FIG. 86, FIG. 89, FIG. 92, FIG. 95, and FIG. 98 are sectional views taken along the line A-A' of FIG. 79 for explaining the manufacturing process, FIG. 84, FIG. 87, FIG. 90, FIG. 93, FIG. 96, and FIG. 99 are sectional views taken along the line B-B' of FIG. 79 for explaining the manufacturing process, and FIG. 85, FIG. 88, FIG. 91, FIG. 94, FIG. 97, and FIG. 100 are sectional views taken along the line C-C' of FIG. 79 for explaining the manufacturing process.

Figure 83:
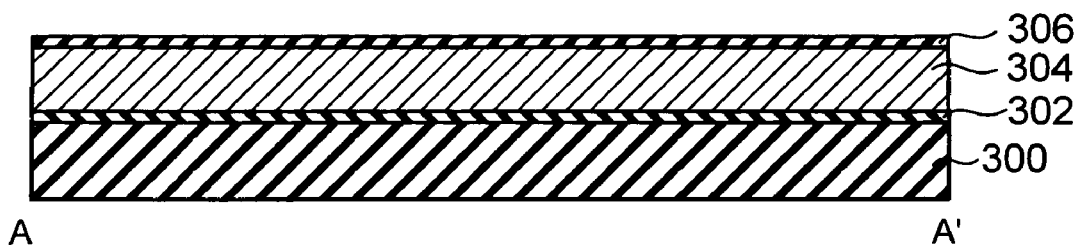
FIG. 83 is a process sectional view for explaining a manufacturing process of the nonvolatile semiconductor memory device according to the third embodiment.
Figure 84:
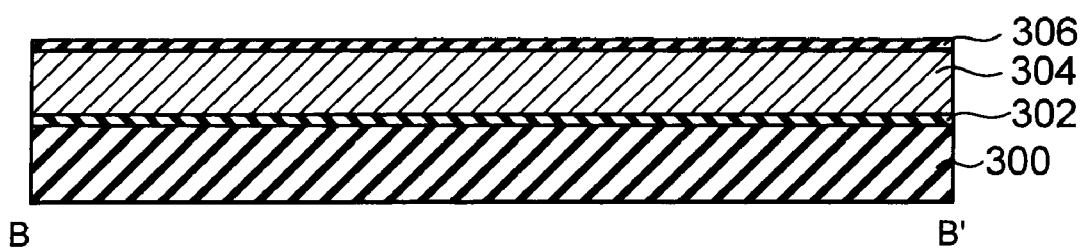
FIG. 84 is a process sectional view for explaining the manufacturing process of the nonvolatile semiconductor memory device according to the third embodiment.
Figure 85:
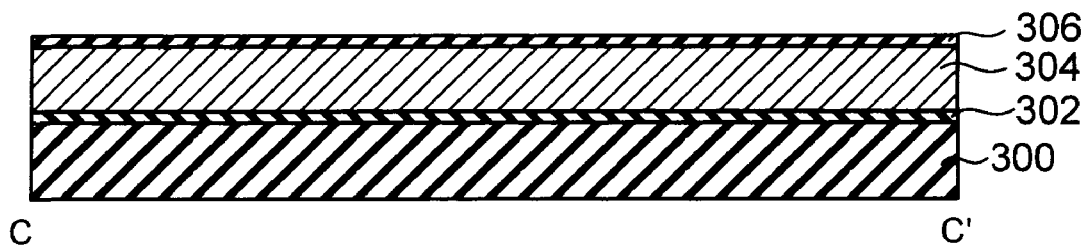
FIG. 85 is a process sectional view for explaining the manufacturing process of the nonvolatile semiconductor memory device according to the third embodiment.

First, as shown in FIG. 83 to FIG. 85, a barrier metal film 302 is formed on an insulating film 300. It is assumed that beneath this insulating film 300, plural word lines and plural memory cells are formed. In this embodiment, the barrier metal layer 302 is composed of a titanium film and a titanium nitride film. Subsequently, an aluminum film 304 is formed on the barrier metal film 302, and a titanium nitride film 306 is formed on the aluminum film 304.

Figure 86:
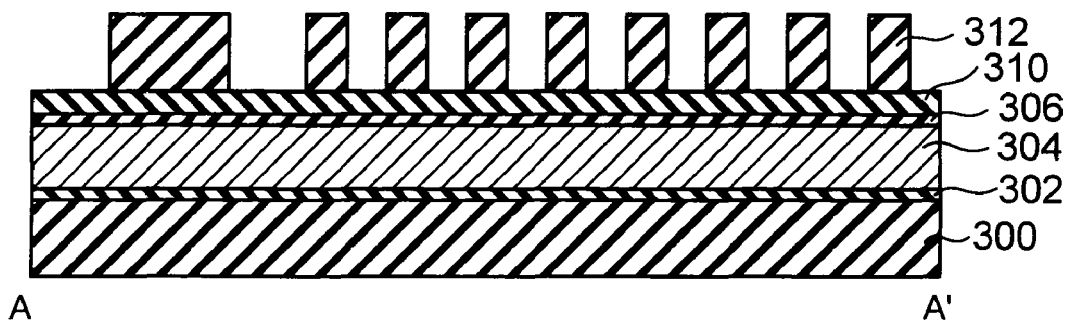
FIG. 86 is a process sectional view for explaining the manufacturing process of the nonvolatile semiconductor memory device according to the third embodiment.
Figure 87:
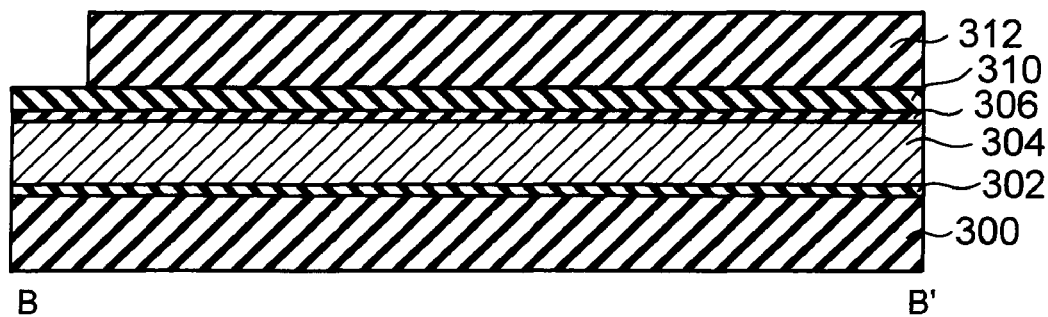
FIG. 87 is a process sectional view for explaining the manufacturing process of the nonvolatile semiconductor memory device according to the third embodiment.
Figure 88:
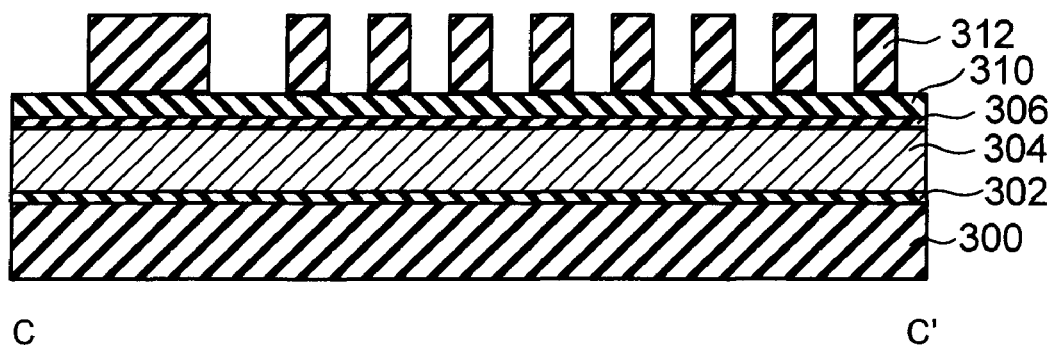
FIG. 88 is a process sectional view for explaining the manufacturing process of the nonvolatile semiconductor memory device according to the third embodiment.

Next, as shown in FIG. 86 to FIG. 88, an antireflection film 310, for example, with a thickness of 10 nm is formed on the titanium nitride film 306, and a photoresist 312, for example, with a thickness of 200 nm is formed on the antireflection film 310. Subsequently, the photoresist 312 is patterned as desired. In this embodiment, the wiring width and space width of the pattern are approximately 90 nm. By this patterning, patterns to form the bit lines BL and a pattern to form the bit line connecting portion BLC are formed in the photoresist 312.

Figure 89:
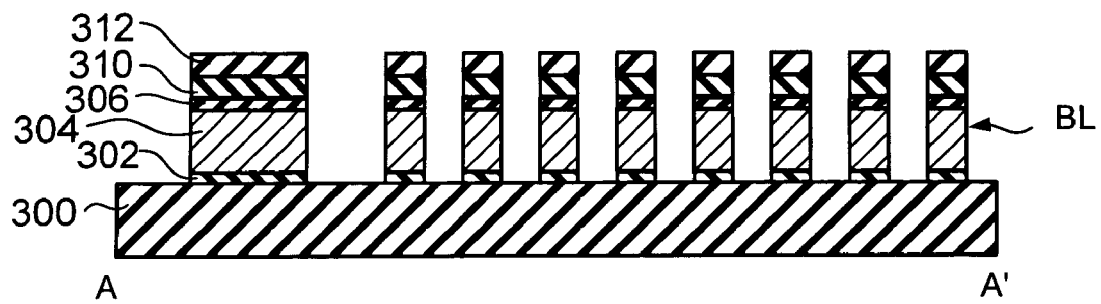
FIG. 89 is a process sectional view for explaining the manufacturing process of the nonvolatile semiconductor memory device according to the third embodiment.
Figure 90:
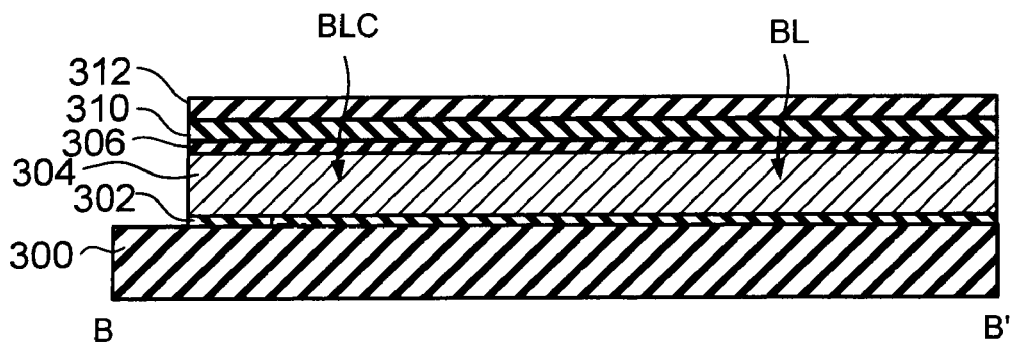
FIG. 90 is a process sectional view for explaining the manufacturing process of the nonvolatile semiconductor memory device according to the third embodiment.
Figure 91:
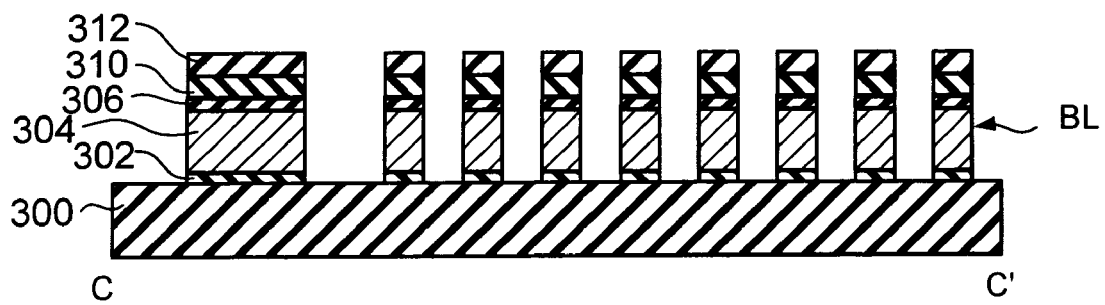
FIG. 91 is a process sectional view for explaining the manufacturing process of the nonvolatile semiconductor memory device according to the third embodiment.

Then, as shown in FIG. 89 to FIG. 91, the antireflection film 310, the titanium nitride film 306, the aluminum film 304, and the barrier metal film 302 are etched by the RIE technology with the photoresist 312 as a mask. By this etching, plural bit lines BL and the bit line connecting portion BLC which connects the plural bit lines BL on one end side of these bit lines are formed. Accordingly, the titanium nitride film 306, the aluminum film 304, and the barrier metal film 302 correspond to a first member to be patterned in this embodiment.

Figure 92:
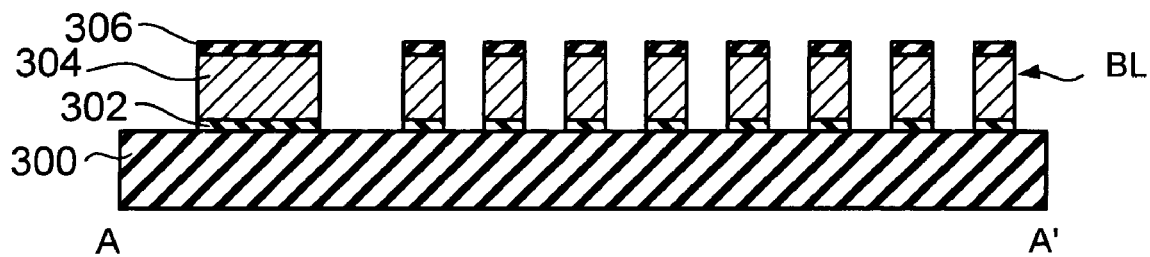
FIG. 92 is a process sectional view for explaining the manufacturing process of the nonvolatile semiconductor memory device according to the third embodiment.
Figure 93:
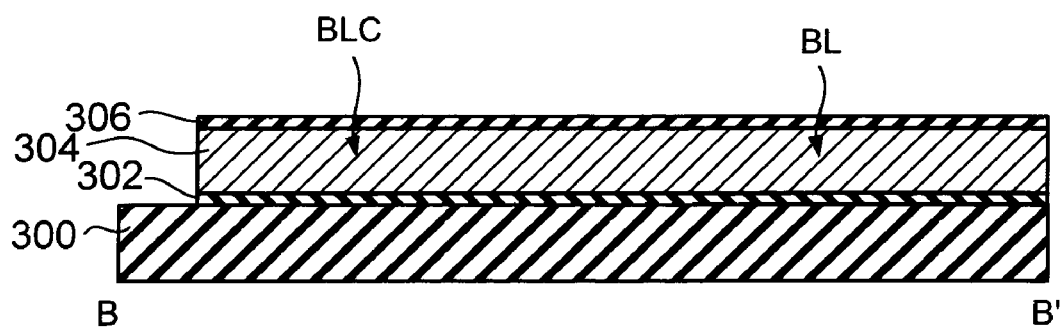
FIG. 93 is a process sectional view for explaining the manufacturing process of the nonvolatile semiconductor memory device according to the third embodiment.
Figure 94:
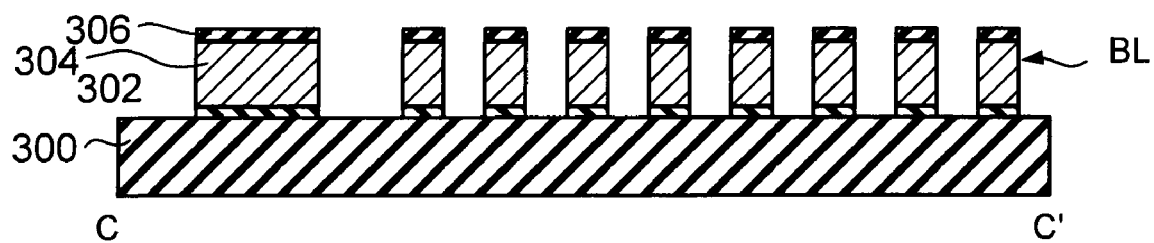
FIG. 94 is a process sectional view for explaining the manufacturing process of the nonvolatile semiconductor memory device according to the third embodiment.

Subsequently, as shown in FIG. 92 to FIG. 94, the antireflection film 310 and the photoresist 312 are removed using the ashing technology.

Figure 95:
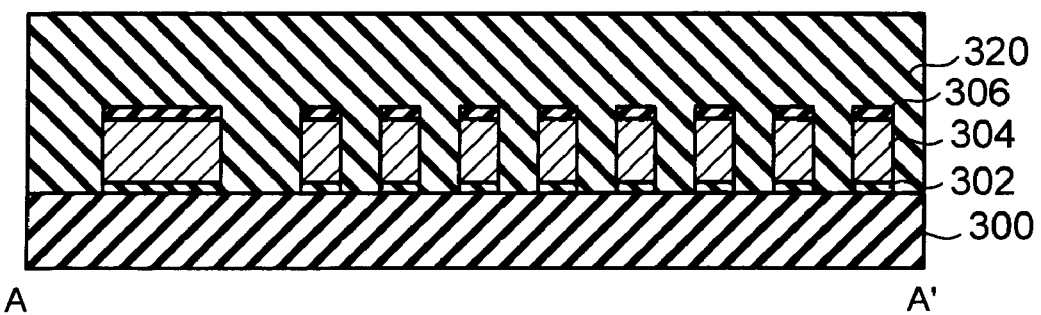
FIG. 95 is a process sectional view for explaining the manufacturing process of the nonvolatile semiconductor memory device according to the third embodiment.
Figure 97:
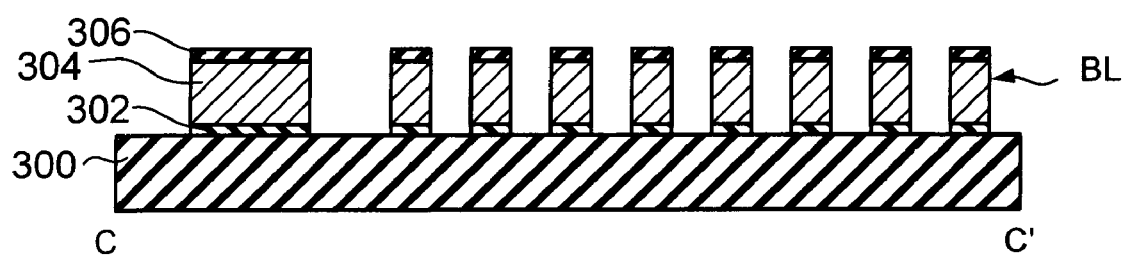
FIG. 97 is a process sectional view for explaining the manufacturing process of the nonvolatile semiconductor memory device according to the third embodiment.

Thereafter, as shown in FIG. 95 to FIG. 97, after a photoresist 320, for example, with a thickness of 100 nm is formed on this nonvolatile semiconductor memory device, the photoresist 320 is patterned as desired by the lithography technology. By this patterning, an opening 322 is formed in a portion corresponding to the separation pattern region SPR in the photoresist 320.

Figure 98:
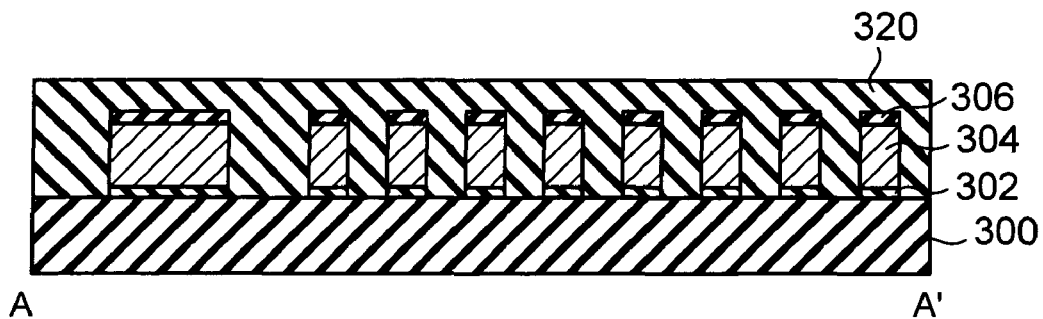
FIG. 98 is a process sectional view for explaining the manufacturing process of the nonvolatile semiconductor memory device according to the third embodiment.
Figure 100:
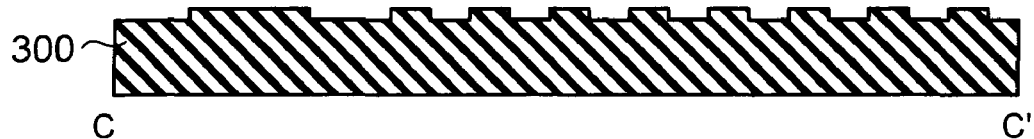
FIG. 100 is a process sectional view for explaining the manufacturing process of the nonvolatile semiconductor memory device according to the third embodiment.

Next, as shown in FIG. 98 to FIG. 100, the titanium nitride film 306, the aluminum film 304, and the barrier metal film 302 are etched using the RIE technology with the photoresist 320 as a mask. Thereby, the separation pattern region SPR is formed, so that the bit lines BL and the bit line connecting portion BLC in the memory cell array region are electrically separated. Then, the photoresist 320 is removed using the ashing technology, and a wiring process is completed. Consequently, the nonvolatile semiconductor memory device shown in FIG. 79 to FIG. 82 is obtained.

As described above, according to the nonvolatile semiconductor memory device of this embodiment, by providing the bit line connecting portion BLC on one end side of the bit lines BL, it becomes possible that when the bit lines BL are formed by etching with the photoresist 312 as a mask, a portion such as a tip of the bit line BL where resist pattern collapse tends to occur does not exist. Accordingly, a margin for patterning improves, which makes it possible to provide the stable high-yield nonvolatile semiconductor memory device.

Figure 102:
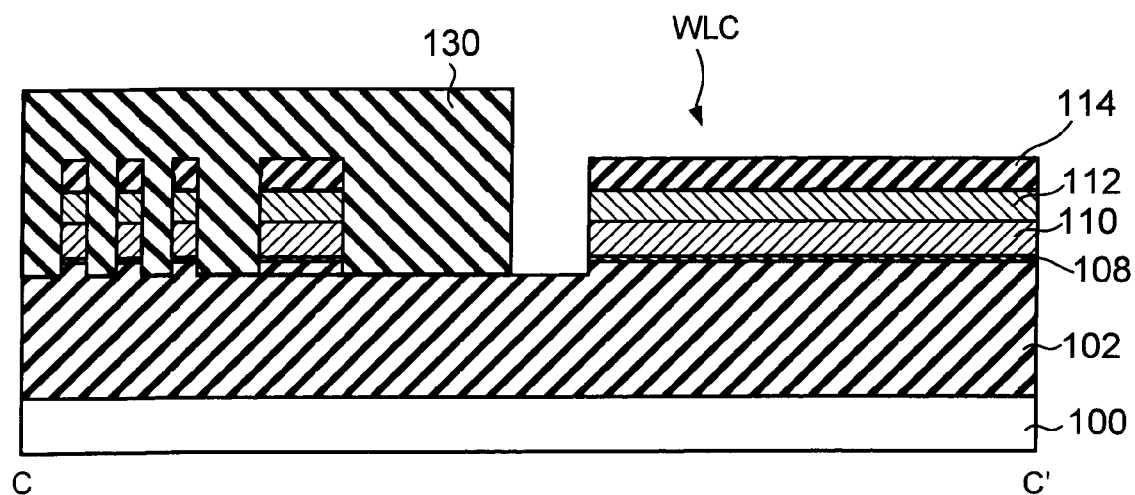
FIG. 102 is a view corresponding to FIG. 34 for explaining the modification of the first embodiment.
Figure 103:
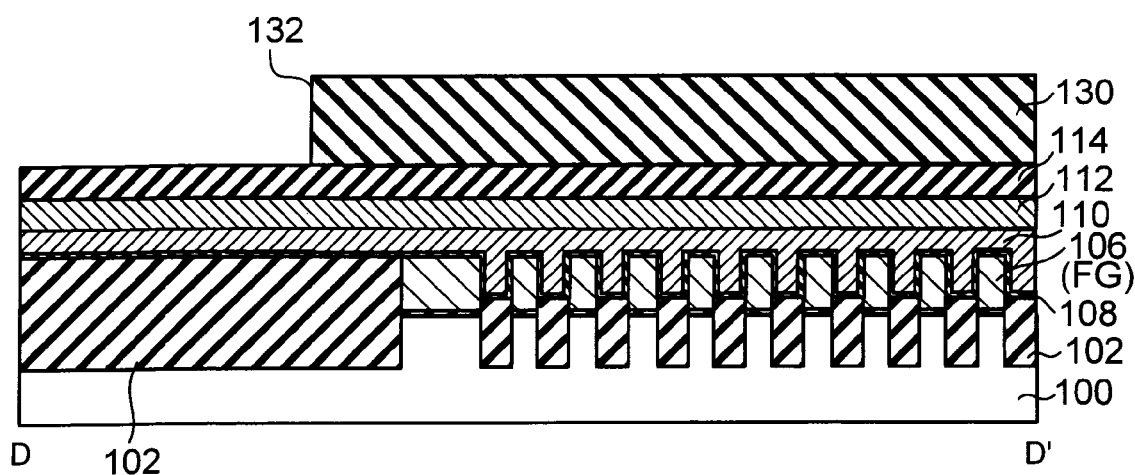
FIG. 103 is a view corresponding to FIG. 35 for explaining the modification of the first embodiment.
Figure 104:
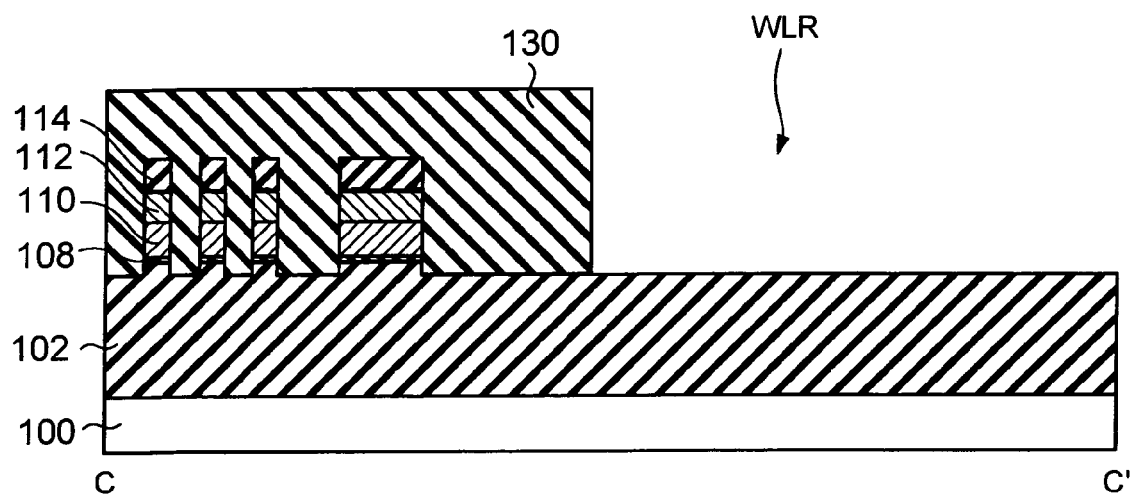
FIG. 104 is a view corresponding to FIG. 39 for explaining the modification of the first embodiment.
Figure 105:
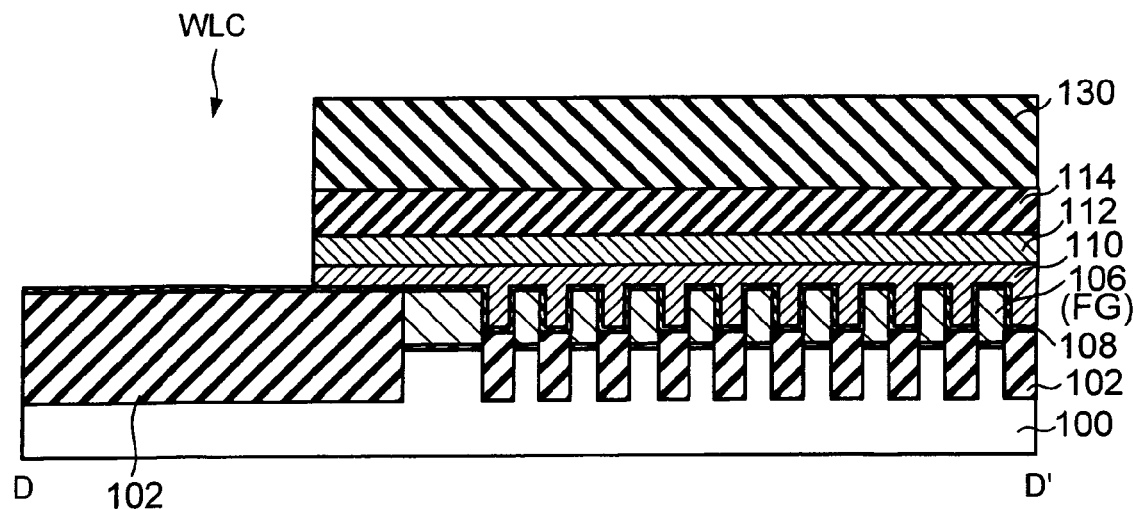
FIG. 105 is a view corresponding to FIG. 40 for explaining the modification of the first embodiment.

It should be mentioned that the present invention is not limited to the aforementioned embodiments, and various changes may be made therein. For example, in the aforementioned embodiments, the word line connecting portion WLC, the memory cell region connecting portion MCC, and the bit line connecting portion BLC are finally left, but they need not necessarily be left. For example, in the first embodiment, as shown in FIG. 101, it is also possible to extend the separation pattern region SPR to a region where the word line connecting portion WLC is provided and remove the word line connecting portion WLC. In this case, as shown in FIG. 102 (which corresponds to FIG. 34) and FIG. 103 (which corresponds to FIG. 35), the opening 132 of the photoresist 130 is formed widely so as to contain all of the word line connecting portion WLC. Then, as shown in FIG. 104 (which corresponds to FIG. 39) and FIG. 105 (which corresponds to FIG. 40), the separation pattern region SPR is formed by removing also the portion of the word line connecting portion WLC when the silicon nitride film 114, the tungsten silicide film 112, and the polycrystalline silicon film 110 are removed by etching with the photoresist 130 as a mask.

Moreover, in the first embodiment, the connecting portion of the silicon nitride film 114 may be removed after the etching pattern having the connecting portion of the photoresist 122 is transcribed to the silicon nitride film 114 which is used as a mask in the etching process and before the etching process is performed with the silicon nitride film 114 as the mask.

The structure of the NAND-type nonvolatile semiconductor memory device according to the first embodiment modified in such a manner will be explained based on FIG. 106 to FIG. 110. However, the plan view thereof is omitted because it is the same as FIG. 101.

Figure 106:
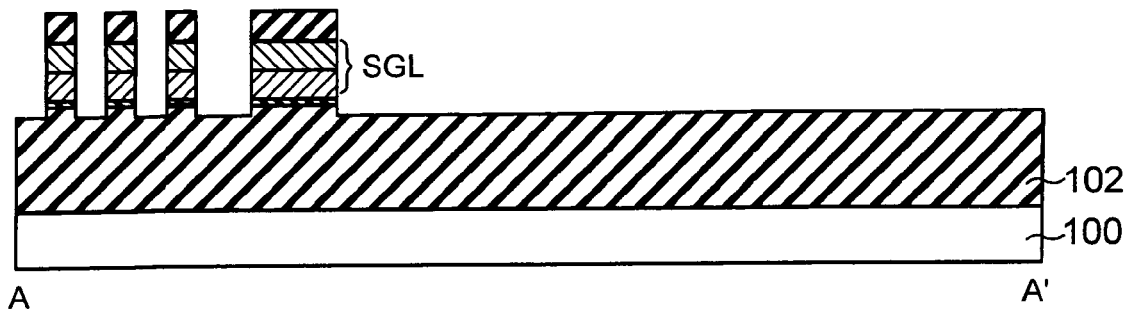
FIG. 106 is a sectional view taken along the line A-A' of FIG. 101 showing the structure of the nonvolatile semiconductor memory device according to a further modified embodiment of the first embodiment.
Figure 107:
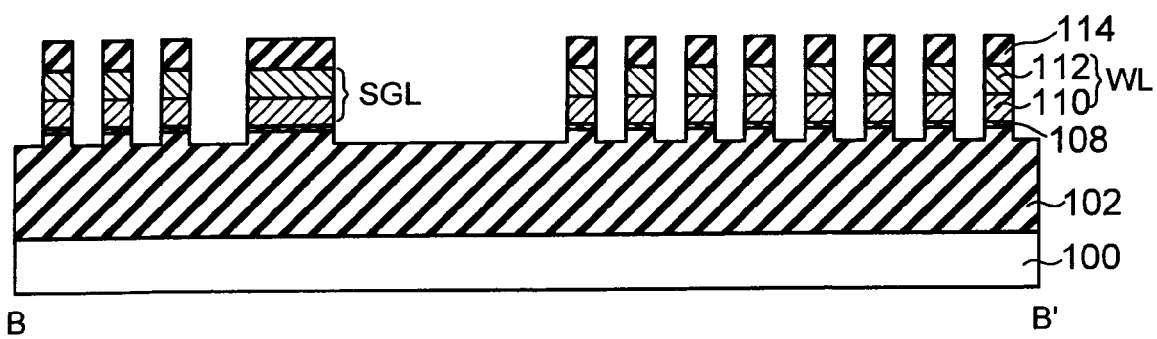
FIG. 107 is a sectional view taken along the line B-B' of FIG. 101 showing the structure of the nonvolatile semiconductor memory device according to the further modified embodiment of the first embodiment.
Figure 108:
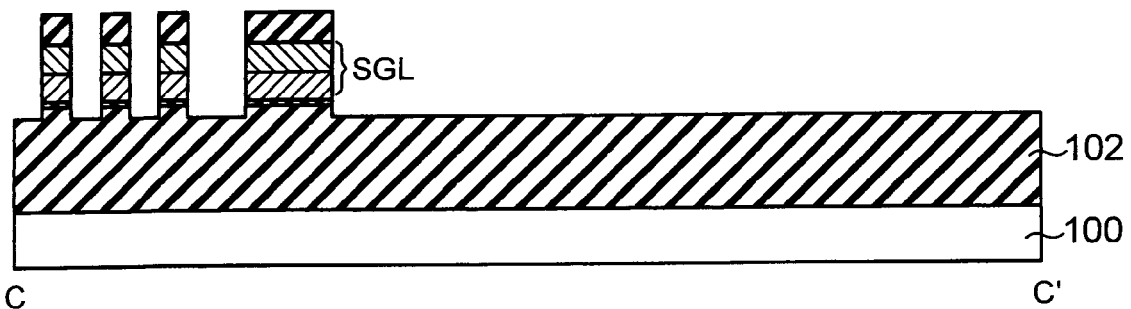
FIG. 108 is a sectional view taken along the line C-C' of FIG. 101 showing the structure of the nonvolatile semiconductor memory device according to the further modified embodiment of the first embodiment.
Figure 109:
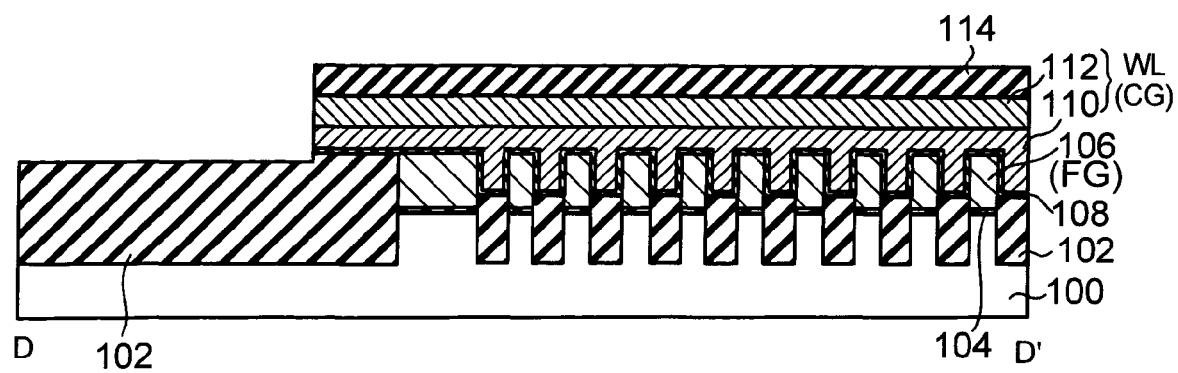
FIG. 109 is a sectional view taken along the line D-D' of FIG. 101 showing the structure of the nonvolatile semiconductor memory device according to the further modified embodiment of the first embodiment.
Figure 110:
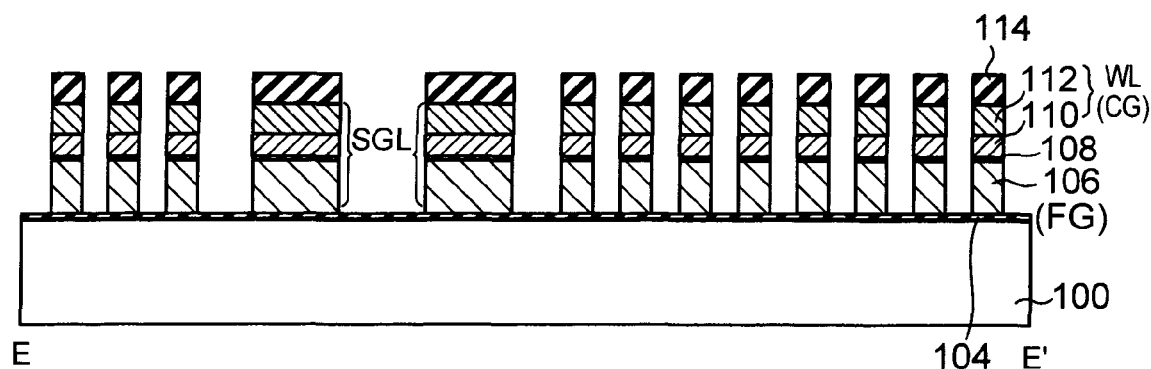
FIG. 110 is a sectional view taken along the line E-E' of FIG. 101 showing the structure of the nonvolatile semiconductor memory device according to the further modified embodiment of the first embodiment.
Figure 111:
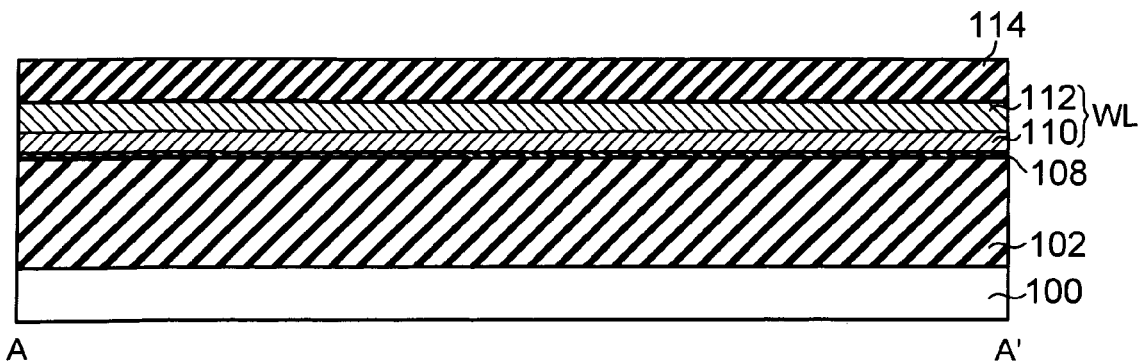
FIG. 111 is a process sectional view taken along the line A-A' of FIG. 101 for explaining a manufacturing process of the nonvolatile semiconductor memory device according to the further modified embodiment of the first embodiment.
Figure 112:
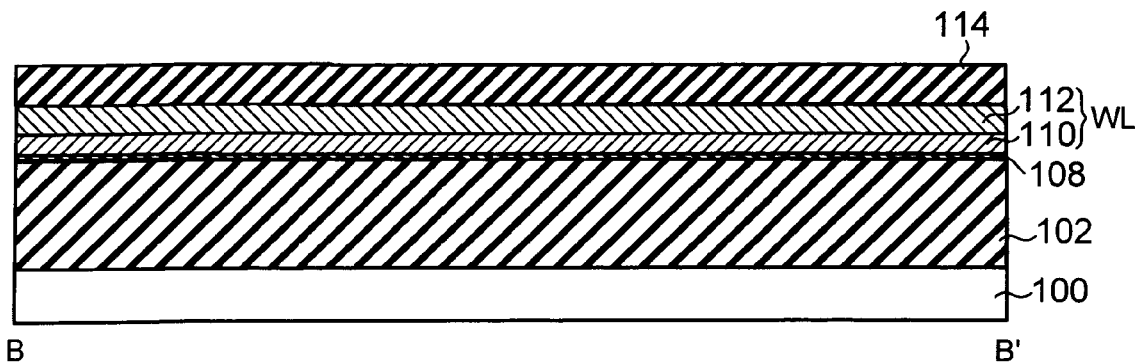
FIG. 112 is a process sectional view taken along the line B-B' of FIG. 101 for explaining a manufacturing process of the nonvolatile semiconductor memory device according to the further modified embodiment of the first embodiment.
Figure 113:
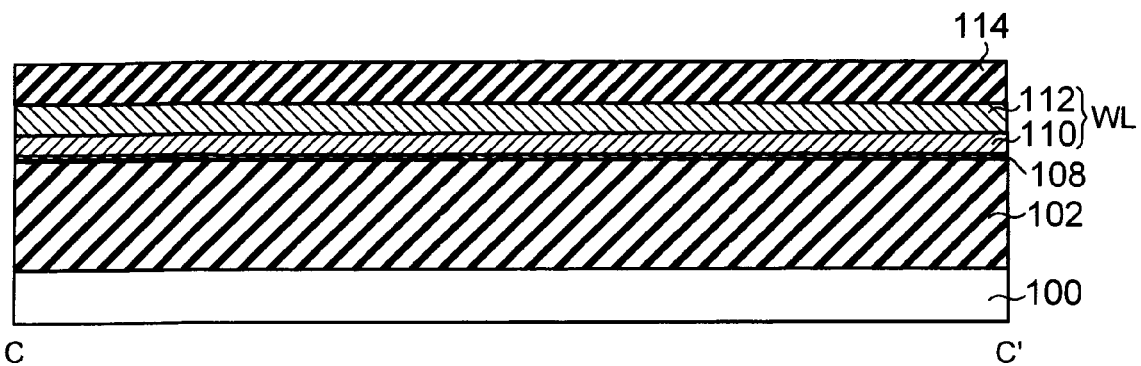
FIG. 113 is a process sectional view taken along the line C-C' of FIG. 101 for explaining a manufacturing process of the nonvolatile semiconductor memory device according to the further modified embodiment of the first embodiment.
Figure 114:
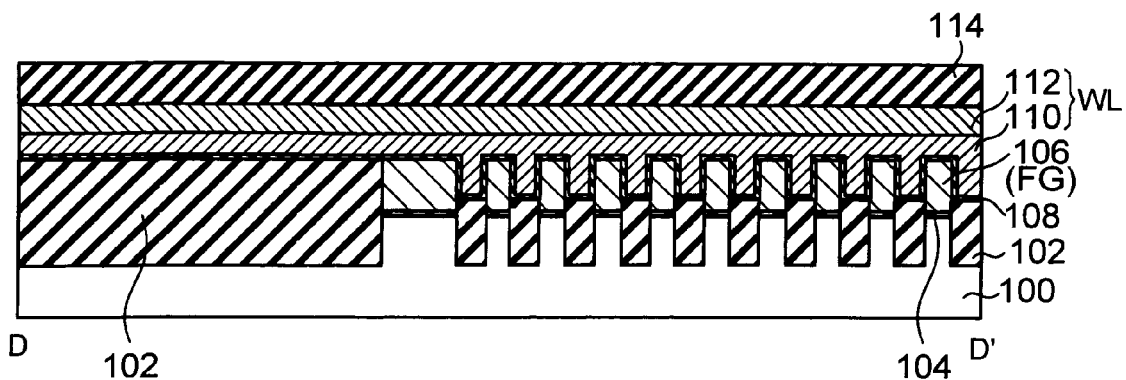
FIG. 114 is a process sectional view taken along the line D-D' of FIG. 101 for explaining a manufacturing process of the nonvolatile semiconductor memory device according to the further modified embodiment of the first embodiment.
Figure 115:
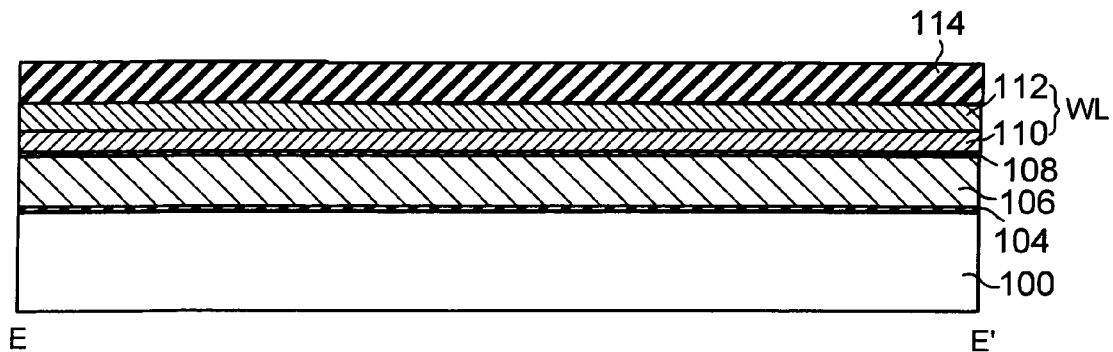
FIG. 115 is a process sectional view taken along the line E-E' of FIG. 101 for explaining a manufacturing process of the nonvolatile semiconductor memory device according to the further modified embodiment of the first embodiment.
Figure 116:
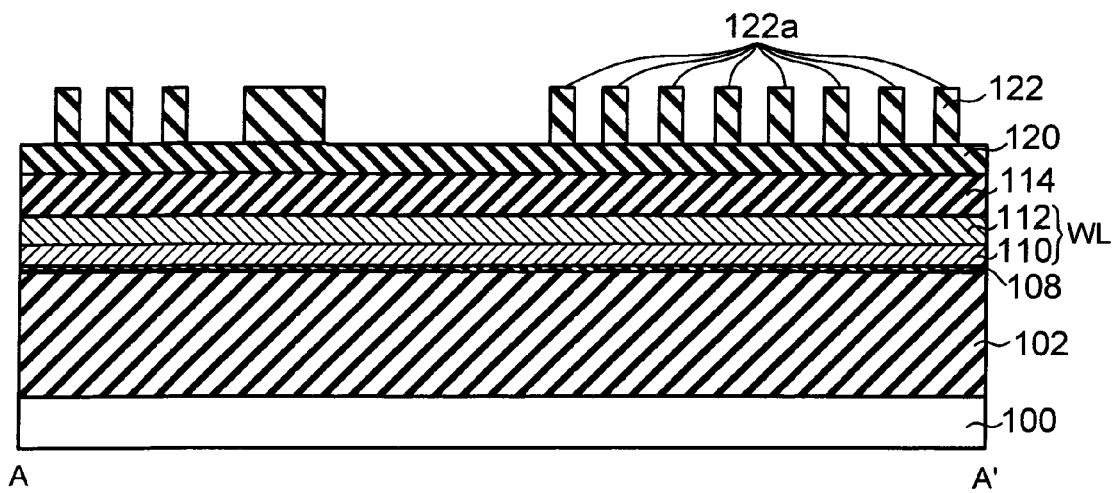
FIG. 116 is a process sectional view taken along the line A-A' of FIG. 101 for explaining a manufacturing process of the nonvolatile semiconductor memory device according to the further modified embodiment of the first embodiment.
Figure 117:
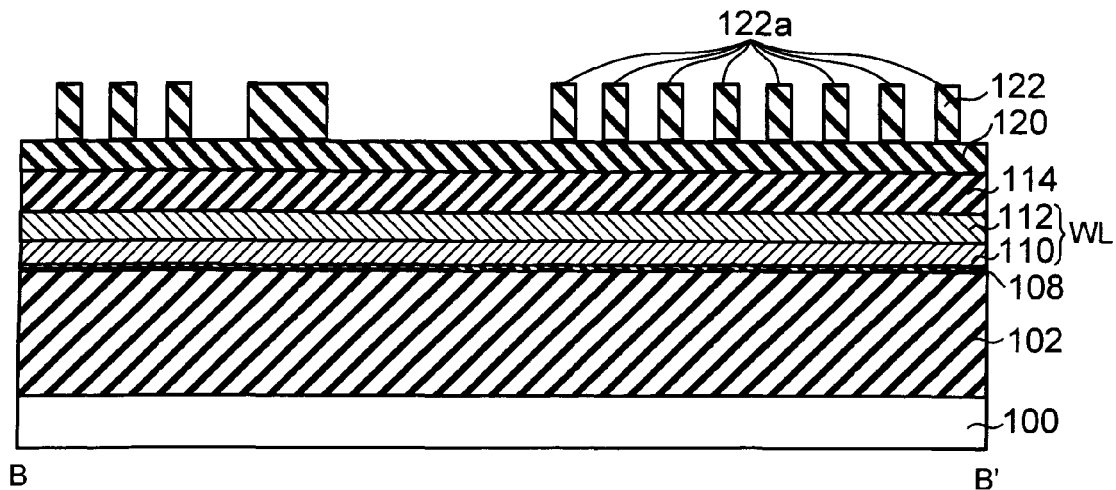
FIG. 117 is a process sectional view taken along the line B-B' of FIG. 101 for explaining a manufacturing process of the nonvolatile semiconductor memory device according to the further modified embodiment of the first embodiment.
Figure 118:
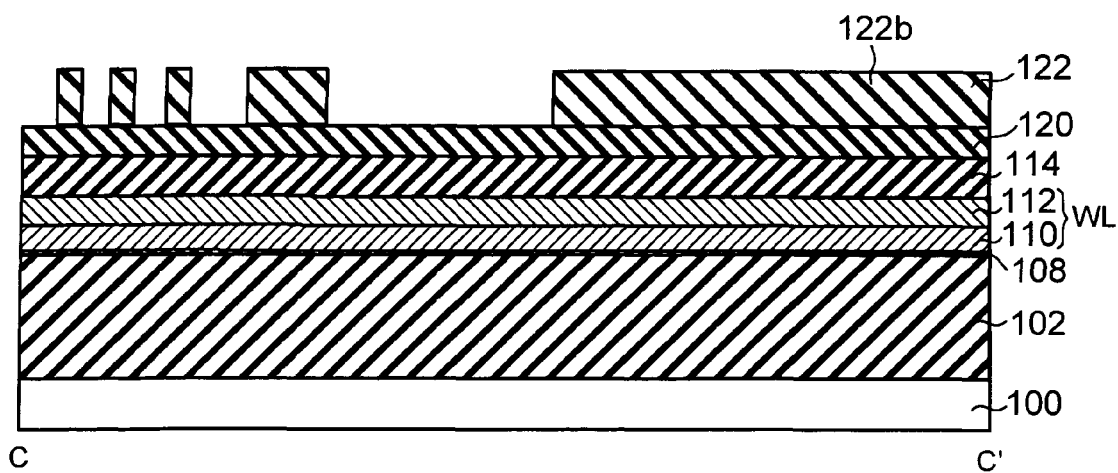
FIG. 118 is a process sectional view taken along the line C-C' of FIG. 101 for explaining a manufacturing process of the nonvolatile semiconductor memory device according to the further modified embodiment of the first embodiment.
Figure 119:
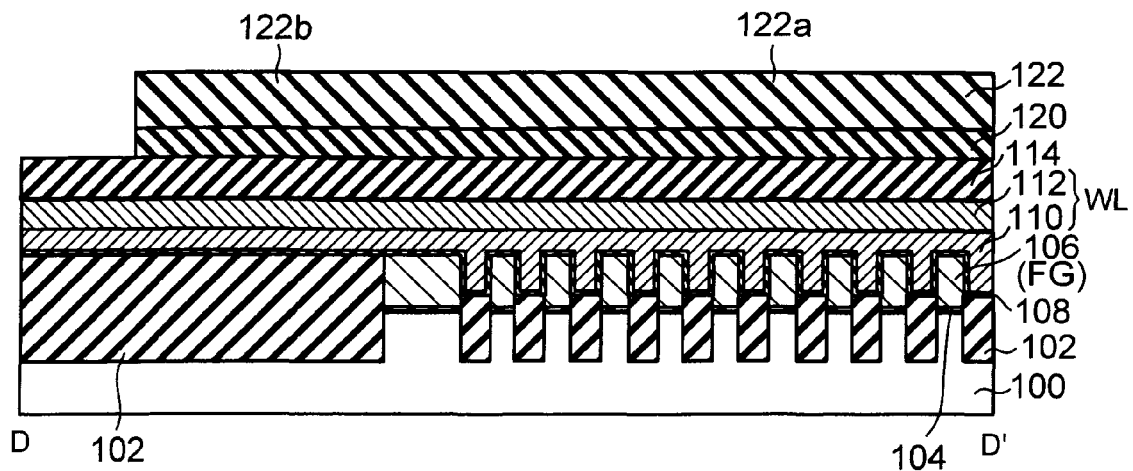
FIG. 119 is a process sectional view taken along the line D-D' of FIG. 101 for explaining a manufacturing process of the nonvolatile semiconductor memory device according to the further modified embodiment of the first embodiment.
Figure 120:
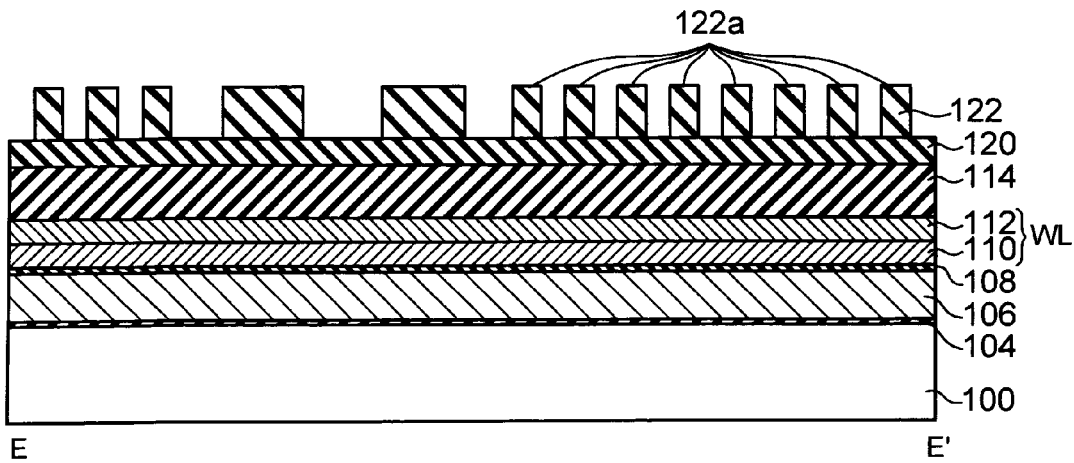
Figure 121:
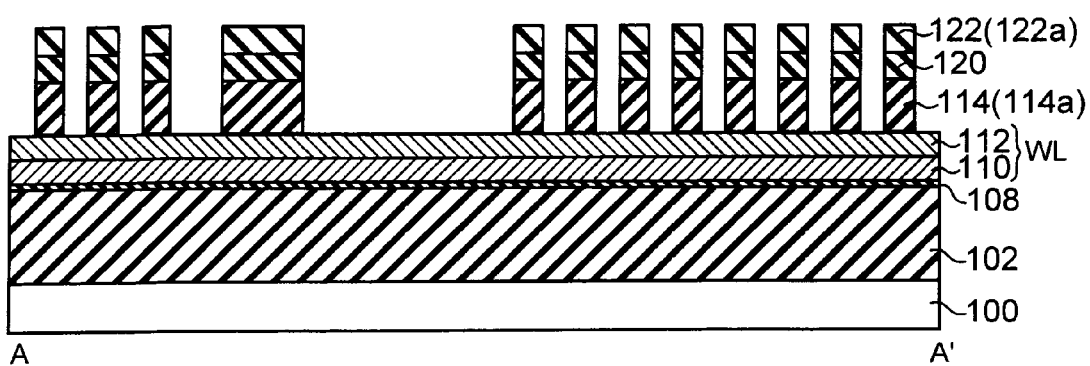
Figure 122:
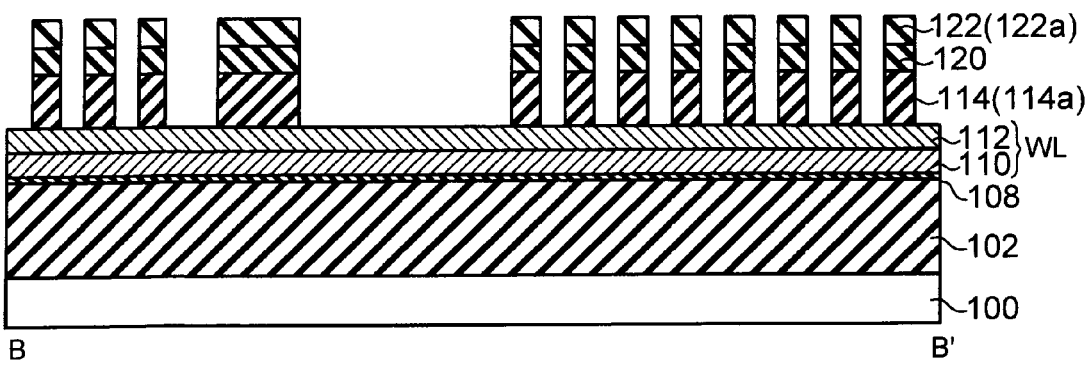
Figure 123:
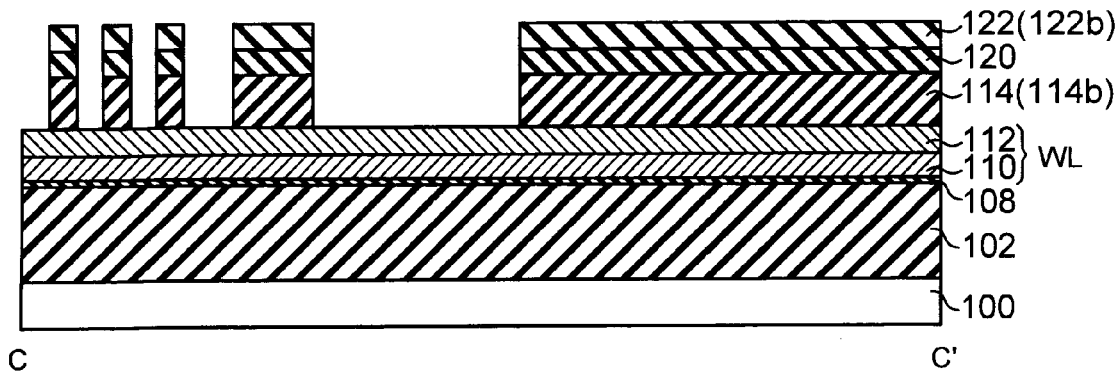
Figure 124:
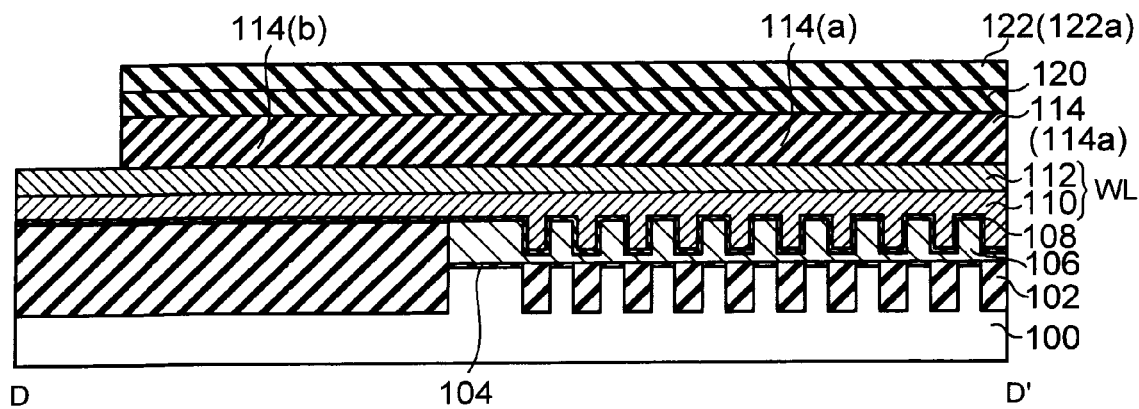
Figure 125:
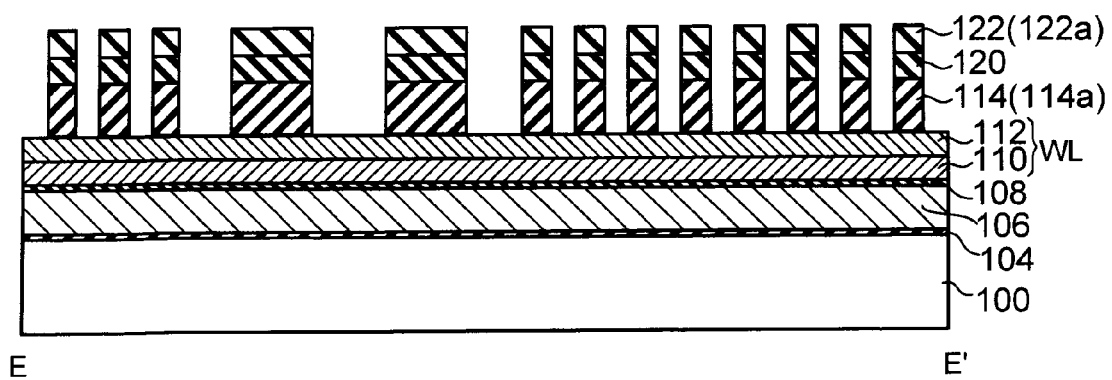
Figure 126:
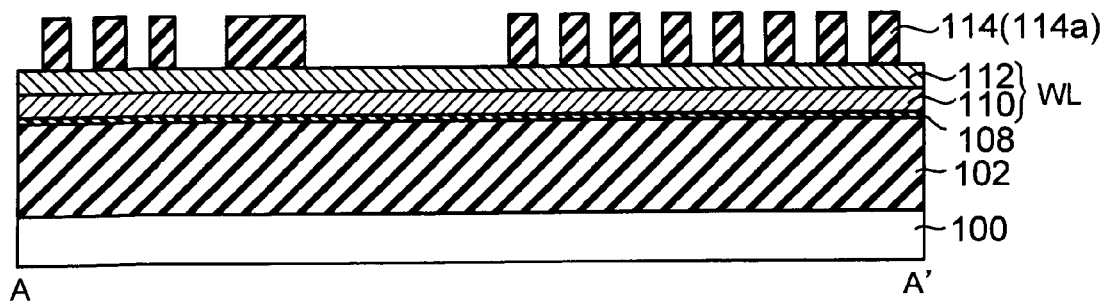
Figure 127:
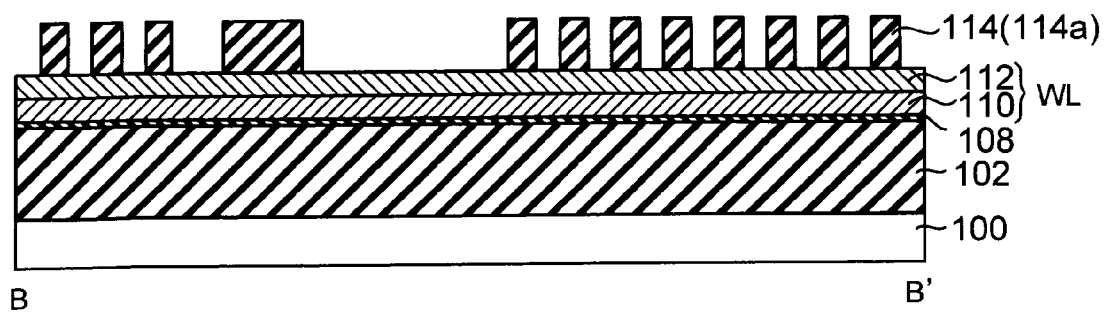
Figure 128:
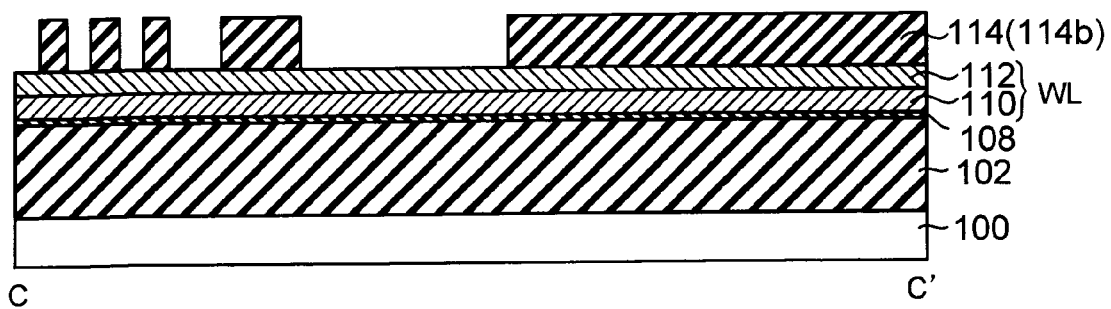
Figure 129:
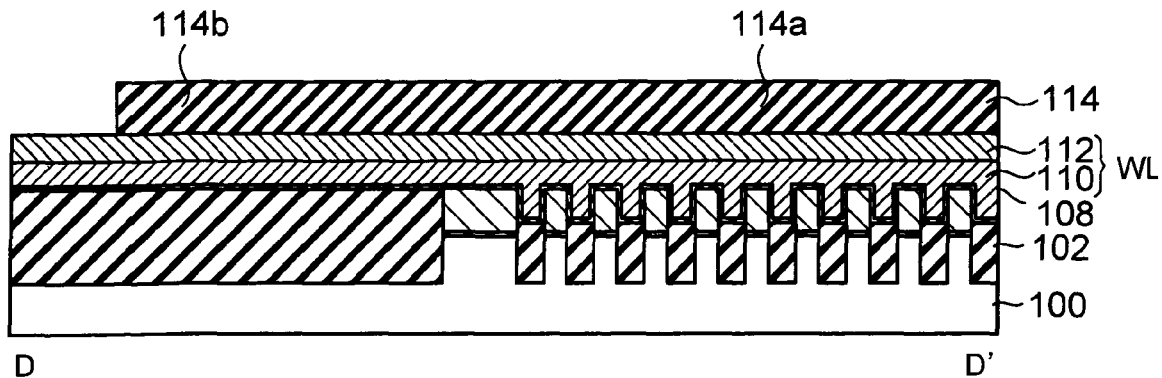
Figure 130:
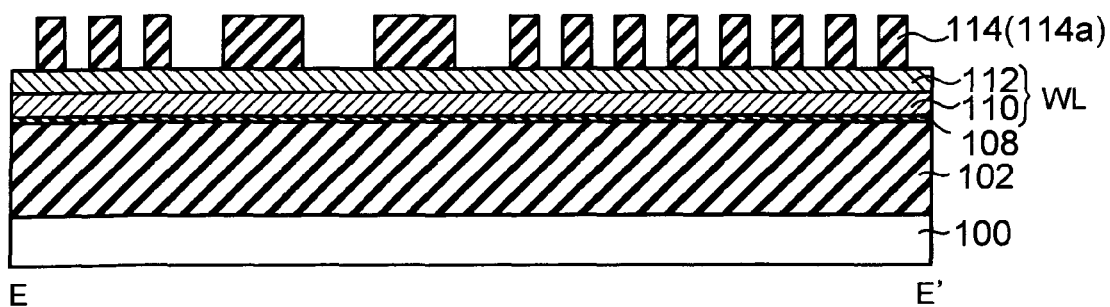
Figure 131:
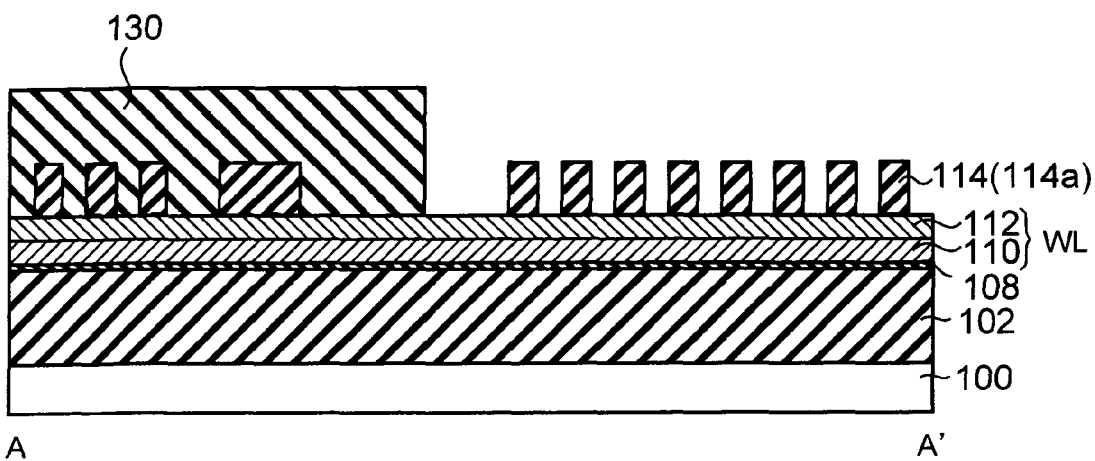

FIG. 106 is a sectional view taken along the line A-A' of FIG. 101, FIG. 107 is a sectional view taken along the line B-B' of FIG. 101, FIG. 108 is a sectional view taken along the line C-C' of FIG. 101, FIG. 109 is a sectional view taken along the line D-D' of FIG. 101, and FIG. 110 is a sectional view taken along the line E-E' of FIG. 101.

As can been seen from these figures, in the nonvolatile semiconductor memory device, a plurality of word lines WL are provided along a first direction. Beneath these word lines WL, a plurality of memory cell regions ER are formed. Select gate lines SGL are provided in parallel with the word lines WL.

Although the word line connecting portion WLC is provided on one end side of the word lines WL in the first embodiment mentioned above, the word line connecting portion WLC is removed and it does not remain in this modification. That is, the separation pattern region SPR is extended to a region of the word line connecting portion WLC in order that the word line connecting portion WLC does not remain.

Next, a manufacturing process of the nonvolatile semiconductor memory device according to the further modified embodiment of the first embodiment will be explained based on FIG. 111 to FIG. 150. FIG. 111, FIG. 116, FIG. 121, FIG. 126, FIG. 131, FIG. 136, FIG. 141 and FIG. 146 are sectional views taken along the line A-A' of FIG. 101 for explaining the further modified manufacturing process, FIG. 112, FIG. 117, FIG. 122, FIG. 127, FIG. 132, FIG. 137, FIG. 142 and FIG. 147 are sectional views taken along the line B-B' of FIG. 101 for explaining the further modified manufacturing process, FIG. 113, FIG. 118, FIG. 123, FIG. 128, FIG. 133, FIG. 138, FIG. 143 and FIG. 148 are sectional views taken along the line C-C' of FIG. 101 for explaining the further modified manufacturing process, FIG. 114, FIG. 119, FIG. 124, FIG. 129, FIG. 134, FIG. 139, FIG. 144 and FIG. 149 are sectional views taken along the line D-D' of FIG. 101 for explaining the further modified manufacturing process, and FIG. 115, FIG. 120, FIG. 125, FIG. 130, FIG. 135, FIG. 140, FIG. 145 and FIG. 150 are sectional views taken along the line E-E' of FIG. 101 for explaining the further modified manufacturing process.

First, as shown in FIG. 111 to FIG. 115, an element separation insulating film 102 is formed by STI (Shallow Trench Isolation) on the surface side of a semiconductor substrate 100. Subsequently, a tunnel insulating film 104 is formed by a silicon oxide film or the like in a memory cell region where memory cells are formed. Thereafter, a polycrystalline silicon film 106 which becomes floating gates later is formed on the tunnel insulating film 104. Then, an ONO film 108 which becomes an interpoly insulating film is formed on the polycrystalline silicon film 106. Subsequently, a polycrystalline silicon film 110 and a tungsten silicide film 112 which become control gates later are formed on the ONO film 108. Subsequently, a silicon nitride film 114 which is used as a mask material is formed on the tungsten silicide film 112. The polycrystalline silicon film 106, the ONO film 108, the polycrystalline silicon film 110 and the tungsten silicide film 112 correspond to a first member to be patterned in the modified embodiment. In addition, the silicon nitride film 114 corresponds to a second member to be patterned, which is formed of an insulating material in the modified embodiment.

Next, as shown in FIG. 116 to FIG. 120, an antireflection film 120, for example, with a thickness of approximately 50 nm is formed on the silicon nitride film 114. Subsequently, a photoresist 122, for example, with a thickness of approximately 200 nm is formed on the antireflection film 120. Then, the photoresist 122 is patterned as desired by lithography technology. In the modified embodiment, the wiring width and space width of the pattern are approximately 90 nm.

In the modified embodiment, by the patterning process of the photoresist 122, a word line forming pattern 122a and a connecting portion 122b are formed in the photoresist 122. The word line forming pattern 122a is a pattern for forming a plurality of the word lines WL in parallel with each other, and the connecting portion 122b is a pattern for connecting the patterns for forming the word lines WL of the word line forming pattern 122a on one end side of the word line forming pattern 122a. The connecting portion 122b prevents the occurrence of the resist collapse in the patterning process of the photoresist 122.

The photoresist 122 corresponds to a third member to be patterned in the modified embodiment, the word line forming pattern 122a corresponds to a first line pattern in the modified embodiment, and the connecting portion 122b corresponds to a first connecting portion in the modified embodiment.

Then, as shown in FIG. 121 to FIG. 125, the antireflection film 120 and the silicon nitride film 114 are etched by RIE technology with the photoresist 122 as a mask. As a result, the same pattern as the pattern of the word line forming pattern 122a and the connecting portion 122b of the photoresist 122 is transcribed to the silicon nitride film 114. That is, a word line forming pattern 114a and a connecting portion 114b are formed in the silicon nitride film 114 by the etching process. The word line forming pattern 114a corresponds to a second line pattern in the modified embodiment, and the connecting portion 114b corresponds to a second connecting portion of the modified embodiment.

Subsequently, as shown in FIG. 126 to FIG. 130, the antireflection film 120 and the photoresist 122 are removed using ashing technology.

Next, as shown in FIG. 131 to FIG. 135, after a photoresist 130, for example, with a thickness of 1000 nm is formed, this photoresist 130 is patterned as desired by the lithography technology. More specifically, particularly as can be seen from the sectional view taken along the line D-D' of FIG. 134, an opening 132 is formed in the photoresist 130, and the opening 132 contains all of the connecting portion 114b of the silicon nitride film 114. In the modified embodiment, the opening 132 is formed so as to contain both the connecting portion 114b and a part of the word line forming pattern 114a located adjacent to the connecting portion 114b. However, the opening 132 may be formed so as to contain the connecting portion 114b only. The photoresist 130 corresponds to a fourth member to be patterned in the modified embodiment.

Next, as shown in FIG. 136 to FIG. 140, the silicon nitride film 114 is etched by the RIE technology with the photoresist 130 as a mask. As a result, the connecting portion 114b and the part of the word line forming pattern 114a located adjacent to the connecting portion 114b which are exposed from the opening 132 is removed, and then word line patterns of the word line forming pattern 114a are separated from each other.

Next, as shown in FIG. 141 to FIG. 145, the photoresist 130 is removed using the ashing technology.

Then, as shown in FIG. 146 to FIG. 150, the tungsten silicide film 112, the polycrystalline silicon film 110, the ONO film 108 and the polycrystalline silicon film 106 are etched with the word line forming pattern 114a of the silicon nitride film 114 as a mask to obtain a desired gate pattern. Namely, control gates CG which become word lines WL are formed by the tungsten silicide film 112 and the polycrystalline silicon film 110, and floating gates FG are formed by the polycrystalline silicon film 106. Consequently, the nonvolatile semiconductor memory device shown in FIG. 101 is obtained.

In accordance with the nonvolatile semiconductor memory device of the modified embodiment of the first embodiment, the connecting portion 122b is provided in the photoresist 122 on one end side of the word line forming pattern 122a so as to connect the word line forming pattern 122a, so that the occurrence of the resist collapse on the one end side of the word line forming pattern 122a is prevented. That is, a portion such as tips of the patterns for forming the word lines WL where the resist pattern collapse tends to occur does not exist.

After the word line forming pattern 122a and the connecting portion 122b are transcribed to the silicon nitride film 114 which is used as the mask in the etching process, the connecting portion 114b of the silicon nitride film 114 is removed. Then, the tungsten silicide film 112, the polycrystalline silicon film 110, the ONO film 108 and the polycrystalline silicon film 106 are etched with the silicon nitride film 114 as the mask, so that the desired gate pattern is obtained, because the connecting portion 114b of the silicon nitride film 114 has already been removed. Accordingly, a margin for patterning improves, which makes it possible to provide the stable high-yield nonvolatile semiconductor memory device.

Moreover, in the second embodiment, as shown in FIG. 151, it is also possible to extend the separation pattern region SPR to a region where the memory cell region connecting portion MCC is provided and remove the memory cell region connecting portion MCC. In this case, as shown in FIG. 152 (which corresponds to FIG. 59), the opening 222 of the photoresist 220 is formed widely so as to contain all of the memory cell region connecting portion MCC. Then, as shown in FIG. 153 (which corresponds to FIG. 62), when the silicon oxide film 206, the silicon nitride film 204, and the silicon oxide film 202 are removed by etching with the photoresist 220 as a mask, the memory cell region connecting portion MCC is also removed. Subsequently, as shown in FIG. 154 (which corresponds to FIG. 65), the photoresist 220 is removed, and as shown in FIG. 155 (FIG. 68), a trench to form the separation pattern region SPR is formed in the semiconductor substrate 200 by etching the semiconductor substrate 200 with the silicon oxide film 206 as a mask.

Further, in the third embodiment, as shown in FIG. 156, it is also possible to extend the separation pattern region SPR to a region where the bit line connecting portion BLC is provided and remove the bid line connecting portion BLC. In this case, as shown in FIG. 157 (which corresponds to FIG. 96), the opening 322 of the photoresist 320 is formed widely so as to contain all of the bid line connecting portion BLC. Then, as shown in FIG. 158 (which corresponds to FIG. 99), the separation pattern region SPR is formed by removing also the portion of the bid line connecting portion BLC when the titanium nitride film 306, the aluminum film 304, and the barrier metal film 302 are removed by etching with the photoresist 320 as a mask.

Moreover, in the third embodiment, after an additional hard mask is formed on the titanium nitride film 306 and the etching pattern of the photoresist 312 having a bit line forming pattern and a connecting pattern is transcribed to the additional hard mask and before the additional hard mask is used as a mask in the etching process, the connecting portion of the additional hard mask may be removed.

The structure of the NAND-type nonvolatile semiconductor memory device according to the third embodiment modified in such a manner will be explained based on FIG. 159 to FIG. 162. FIG. 159 is a plan view of the nonvolatile semiconductor memory device according to further modified embodiment of the third embodiment, and it corresponds to FIG. 79 of the third embodiment. FIG. 160 is a sectional view taken along the line A-A' of FIG. 159, FIG. 161 is a sectional view taken along the line B-B' of FIG. 159, and FIG. 162 is a sectional view taken along the line C-C' of FIG. 159.

As can been seen from these figures, in the modified embodiment of the third embodiment, a silicon oxide film 350 is formed on the titanium nitride film 306 and the silicon oxide film 350 has been used as a hard mask. Moreover, the separation pattern region SPR is extended to a region of the bit line connecting portion BLC in order that the bit line connecting portion BLC does not remain.

Next, a manufacturing process of the nonvolatile semiconductor memory device according to the further modified embodiment of the third embodiment will be explained based on FIG. 163 to FIG. 186. FIG. 163, FIG. 166, FIG. 169, FIG. 172, FIG. 175, FIG. 178, FIG. 181 and FIG. 184 are sectional views taken along the line A-A' of FIG. 159 for explaining the further modified manufacturing process, FIG. 164, FIG. 167, FIG. 170, FIG. 173, FIG. 176, FIG. 179, FIG. 182 and FIG. 185 are sectional views taken along the line B-B' of FIG. 159 for explaining the further modified manufacturing process, and FIG. 165, FIG. 168, FIG. 171, FIG. 174, FIG. 177, FIG. 180, FIG. 183 and FIG. 186 are sectional views taken along the line C-C' of FIG. 159 for explaining the further modified manufacturing process.

First, as shown in FIG. 163 to FIG. 165, a barrier metal film 302 is formed on an insulating film 300. In the modified embodiment, it is assumed that beneath this insulating film 300, a plurality of word lines and a plurality of memory cells are formed. In the modified embodiment, the barrier metal film 302 is composed of a titanium film and a titanium nitride film. Subsequently, an aluminum film 304 is formed on the barrier metal film 302, and a titanium nitride film 306 is formed on the aluminum film 304. The barrier metal film 302, the aluminum film 304 and the titanium nitride film 306 constitute a wiring layer of the modified embodiment. Thereafter, a film which is used as a hard mask when the wiring layer is patterned is formed on the titanium nitride film 306. For example, the film which is used as the hard mask is a silicon oxide film 350 with a thickness of 150 nm.

The wiring layer constituted by the barrier metal film 302, the aluminum film 304 and the titanium nitride film 306 corresponds to a first member to be patterned in the modified embodiment. In addition, the silicon oxide film 350 corresponds to a second member to be patterned in the modified embodiment.

Next, as shown in FIG. 166 to FIG. 168, an antireflection film 310, for example, with a thickness of 50 nm is formed on the titanium nitride film 306, and a photoresist 312, for example, with a thickness of 200 nm is formed on the antireflection film 310. Subsequently, the photoresist 312 is patterned as desired. In the modified embodiment, the wiring width and space width of the pattern are also approximately 90 nm.

In the modified embodiment, by the patterning process of the photoresist 312, a bit line forming pattern 312a and a connecting portion 312b are formed in the photoresist 312. The bit line forming pattern 312a is a pattern for forming a plurality of the bit lines BL in parallel with each other, and the connecting portion 312b is a pattern for connecting the patterns for forming the bit lines BL of the bit line forming pattern 312a on one end side of the bit line forming pattern 312a. The connecting portion 312b prevents the occurrence of the resist collapse in the patterning process of the photoresist 312. The photoresist 312 corresponds to a third member to be patterned in the modified embodiment, the bit line forming pattern 312a corresponds to a first line pattern in the modified embodiment, and the connecting portion 312b corresponds to a first connecting portion in the modified embodiment.

Then, as shown in FIG. 169 to FIG. 171, the antireflection film 310 and the silicon oxide film 350 are etched by RIE technology with the photoresist 312 as a mask. By this etching process, a bit line forming pattern 350a for forming a plurality of the bit lines BL is formed in the silicon oxide film 350, and a connecting portion 350b for connecting the patterns for forming the bit lines BL of the bit line forming pattern 350a on one end side of the bit line forming pattern 350a is formed. That is, the same pattern as the bit line forming pattern 312a and the connecting portion 312b of the photoresist 312 is transcribed to the silicon oxide film 350. The bit line forming pattern 350a corresponds to a second line pattern in the modified embodiment, and the connecting portion 350b corresponds to a second connecting portion in the modified embodiment.

Subsequently, as shown in FIG. 172 to FIG. 174, the antireflection film 310 and the photoresist 312 are removed using the ashing technology.

Thereafter, as shown in FIG. 175 to FIG. 177, after a photoresist 320, for example, with a thickness of 100 nm is formed on this nonvolatile semiconductor memory device, the photoresist 320 is patterned as desired by the lithography technology. More specifically, particularly as can be seen from the sectional view taken along the line B-B' of FIG. 176 and the sectional view taken along the line C-C' of FIG. 177, an opening 322 is formed in the photoresist 320, and the opening 322 contains all of the connecting portion 350b of the silicon oxide film 350. In the modified embodiment, the opening 322 is formed so as to contain both the connecting portion 350b and a part of the bit line forming pattern 350a located adjacent to the connecting portion 350b. However, the opening 322 may be formed so as to contain the connecting portion 350b only. The photoresist 320 corresponds to a fourth member to be patterned in the modified embodiment.

Next, as shown in FIG. 178 to FIG. 180, the silicon oxide film 350 is etched by the RIE technology with the photoresist 320 as a mask. As a result, the connecting portion 350b and the part of the bit line forming pattern 350a located adjacent to the connecting portion 350b which are exposed from the opening 322 are removed, and the bit line patterns of the bit line forming pattern 350a are separated from each other.

Next, as shown in FIG. 181 to FIG. 183, the photoresist 320 is removed using the ashing technology.

Then, as shown in FIG. 184 to FIG. 186, the wiring layer is etched with the silicon oxide film 350 as a mask. That is, the barrier metal film 302, the aluminum film 304 and the titanium nitride film 306 which constitute the wiring layer are etched with the bit line forming pattern 350a of the silicon oxide film 350.

Consequently, the nonvolatile semiconductor memory device shown in FIG. 159 to FIG. 162 is obtained. The silicon oxide film 350 remains on the wiring layer, the silicon oxide film 350 functions as a interlayer insulating film between the layer constituted by the barrier metal film 302, the aluminum film 304 and the titanium nitride file 306 and an upper layer formed on the wiring layer, so that there is no problem even if the silicon oxide film 350 is not removed.

In accordance with the nonvolatile semiconductor memory device of the modified embodiment of the third embodiment, the connecting portion 312b is provided in the photoresist 312 on one end side of the bit line forming pattern 312a so as to connect the bit line forming pattern 312a, so that the occurrence of the resist collapse on the one end side of the bit line forming pattern 312a is prevented. That is, a portion such as tips of the patterns for forming the bit lines BL where resist pattern collapse tends to occur does not exist.

After the bit line forming pattern 312a and the connecting portion 312b are transcribed to the silicon oxide film 350 which is used as the mask in the etching process, the connecting portion 350b of the silicon oxide film 350 is removed. Then, the barrier metal film 302, the aluminum film 304 and the titanium nitride film 306 are etched with the silicon oxide film 350 as the mask, so that the desired gate pattern is obtained, because the connecting portion 350b of the silicon oxide film 350 has already been removed. Accordingly, a margin for patterning improves, which makes it possible to provide the stable high-yield nonvolatile semiconductor memory device.

Furthermore, although all of each of the word line connecting portion WLC, the memory cell region connecting portion MCC, and the bit line connecting portion BLC is removed in these modifications, only a part thereof may be removed.

Additionally, in the aforementioned embodiments, the present invention is explained with the NAND-type nonvolatile semiconductor memory device as an example, but the present invention is also applicable to other semiconductor devices such as a semiconductor memory device including word lines and bit lines. Namely, the present invention is applicable to all of semiconductor devices having a linear pattern such as causes resist pattern collapse.

Besides, in the aforementioned embodiments, only on one end side of the linear pattern, the connection portion which connects the plural linear patterns is provided, but the connecting portions may be provided on both end sides of the linear pattern.

What is claimed is:

1. A manufacturing method of a semiconductor device, comprising:
    forming a first member to be patterned on a semiconductor substrate;
    forming a second member to be patterned on the first member;
    forming a third member to be patterned on the second member;
    patterning the third member to form a first line pattern and a first connecting portion in the third member, the first line pattern having a plurality of parallel linear patterns and the first connecting portion connecting the linear patterns on at least one end side of the linear patterns of the first line pattern;
    etching the second member with the third member as a mask to form a second line pattern and a second connecting portion in the second member, the second line pattern being the same pattern as the first line pattern and the second connecting portion being the same pattern as the first connecting portion;
    removing the second connecting portion of the second member; and
    etching the first member with the second member as a mask.

2. The manufacturing method of the semiconductor device according to claim 1, further comprising removing the third member after said etching the second member.

3. The manufacturing method of the semiconductor device according to claim 2, wherein said removing the second connecting portion comprises:
    forming a fourth member to be patterned on the second member after said removing the third member;
    forming an opening in the fourth member, the opening containing the second connecting portion; and
    etching the second member with the fourth member as a mask.

4. The manufacturing method of the semiconductor device according to claim 1, wherein a part of the linear patterns of the second line pattern of the second member is also removed in said removing the second connecting portion.

5. The manufacturing method of the semiconductor device according to claim 1, wherein the third member is a photoresist.

6. The manufacturing method of the semiconductor device according to claim 1, wherein the second member is formed of an insulating material to be used as a mask.

7. The manufacturing method of the semiconductor device according to claim 1, wherein the first member is formed of a conductive material.

8. The manufacturing method of the semiconductor device according to claim 1, wherein the first line pattern is a pattern for word lines.

9. The manufacturing method of the semiconductor device according to claim 8, wherein the word lines are for a memory cell array in a nonvolatile semiconductor memory device.

10. The manufacturing method of the semiconductor device according to claim 1, wherein the first line pattern is a pattern for bit lines.

11. The manufacturing method of the semiconductor device according to claim 10, wherein the bit lines are for a memory cell array in a nonvolatile semiconductor memory device.

* * * * *